United States Patent
Mihara

(10) Patent No.: US 9,831,258 B2
(45) Date of Patent: Nov. 28, 2017

(54) SEMICONDUCTOR DEVICE AND MANUFACTURING METHOD THEREOF

(71) Applicant: Renesas Electronics Corporation, Tokyo (JP)

(72) Inventor: Tatsuyoshi Mihara, Tokyo (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 0 days.

(21) Appl. No.: 15/623,547

(22) Filed: Jun. 15, 2017

(65) Prior Publication Data

US 2017/0287924 A1 Oct. 5, 2017

Related U.S. Application Data

(62) Division of application No. 15/384,602, filed on Dec. 20, 2016, now Pat. No. 9,735,169.

(30) Foreign Application Priority Data

Dec. 28, 2015 (JP) ................................ 2015-255923

(51) Int. Cl.
*H01L 27/11568* (2017.01)
*H01L 29/792* (2006.01)
*H01L 29/423* (2006.01)

(52) U.S. Cl.
CPC .. *H01L 27/11568* (2013.01); *H01L 29/42376* (2013.01); *H01L 29/7923* (2013.01)

(58) Field of Classification Search
CPC ......... H01L 27/11568; H01L 29/42376; H01L 29/7923
See application file for complete search history.

(56) References Cited

U.S. PATENT DOCUMENTS

| 2005/0227435 A1* | 10/2005 | Oh ................... B82Y 10/00 438/257 |
| 2006/0022260 A1 | 2/2006 | Hisamoto et al. |
| 2007/0054448 A1 | 3/2007 | Choi et al. |
| 2010/0193857 A1* | 8/2010 | Nakagawa ........ H01L 27/11521 257/324 |
| 2013/0037877 A1 | 2/2013 | Tan et al. |

(Continued)

FOREIGN PATENT DOCUMENTS

| EP | 3 144 960 A2 | 3/2017 |
| JP | 2006-041354 A | 2/2006 |
| JP | 2006-332143 A | 12/2006 |

OTHER PUBLICATIONS

European Search Report for 16201552.3 dated May 16, 2017.

*Primary Examiner* — Walter H Swanson
(74) *Attorney, Agent, or Firm* — Sughrue Mion, PLLC

(57) ABSTRACT

A fin includes a first region and a second region arranged on a positive side in an X-axis direction with respect to the first region. A control gate electrode covers an upper surface of the first region, and a side surface of the first region on the positive side in a Y-axis direction. A memory gate electrode covers an upper surface of the second region, and a side surface of the second region on the positive side in the Y-axis direction. The upper surface of the second region is lower than the upper surface of the first region. The side surface of the second region is arranged on the negative side in the Y-axis direction with respect to the side surface of the first region in the Y-axis direction.

7 Claims, 50 Drawing Sheets

(56) References Cited

U.S. PATENT DOCUMENTS

2013/0329499 A1 12/2013 Lee
2015/0200280 A1* 7/2015 Masuoka .......... H01L 29/66833
　　　　　　　　　　　　　　　　　　　257/326

* cited by examiner

FIG. 12
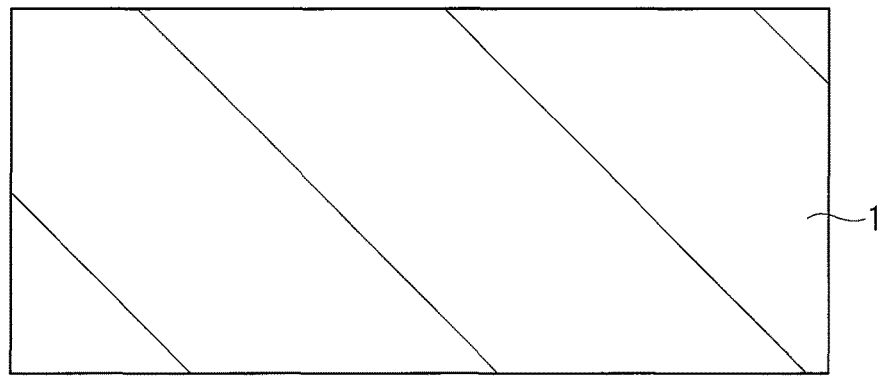
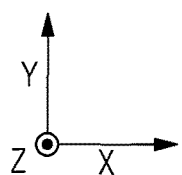

SEMICONDUCTOR DEVICE AND MANUFACTURING METHOD THEREOF

CROSS-REFERENCE TO RELATED APPLICATION

This application is a divisional of U.S. patent application Ser. No. 15/384,602, filed Dec. 20, 2016, which claims priority to Japanese Patent Application No. 2015-255923, filed Dec. 28, 2015, the contents of all of which are incorporated herein by reference.

TECHNICAL FIELD OF THE INVENTION

The present invention relates to a semiconductor device and a manufacturing method thereof and can be suitably utilized for, for example, a semiconductor device including a semiconductor element formed on a semiconductor substrate and a manufacturing method thereof.

BACKGROUND OF THE INVENTION

A semiconductor device including a memory cell region in which a memory cell such as a non-volatile memory is formed on a semiconductor substrate is widely used. For example, there is a case in which a memory cell having a split gate cell using a MONOS (metal-oxide-nitride-oxide-semiconductor) film is formed as the non-volatile memory. In this case, the memory cell is formed by two MISFETs (metal insulator semiconductor field effect transistor) composed of a control transistor including a control gate electrode and a memory transistor including a memory gate electrode.

This memory gate electrode is formed by leaving a conductive film on a side surface of the control gate electrode via an insulating film like a sidewall spacer. Also, between the memory gate electrode and the control gate electrode, and between the memory gate electrode and a semiconductor substrate, an insulating film having a charge storage unit inside is formed.

In Japanese Patent Application Laid-Open Publication No. 2006-332143 (Patent Document 1), disclosed is a technique of a semiconductor device including a non-volatile memory element formed on a semiconductor substrate in which the non-volatile memory element includes a control gate electrode and a memory gate electrode provided adjacent to the control gate electrode.

In Japanese Patent Application Laid-Open Publication No. 2006-41354 (Patent Document 2), disclosed is a technique of a semiconductor device in which a protruding active region is formed on a front surface of a semiconductor substrate, and in which a select gate or a memory gate is arranged to straddle the projected active region.

SUMMARY OF THE INVENTION

In the semiconductor device including the memory cell having the split gate cell, data is written by injecting electrons into the charge storage unit inside the insulating film, for example.

Also, data is erased by injecting holes into the charge storage unit inside the insulating film, for example.

However, depending on a shape of the charge storage unit, a distribution of the electrons injected into the charge storage unit at the time of writing data and a distribution of the holes injected into the charge storage unit at the time of erasing data may differ from each other. In particular, in a case in which the control gate electrode and the memory gate electrode straddle a fin serving as a projecting portion, on each of the upper surface side and both sides of the side surfaces of the fin, the distribution of the electrons injected into the charge storage unit at the time of writing data and the distribution of the holes injected into the charge storage unit at the time of erasing data tend to differ from each other. In such a case, when the write operation and the erase operation are repeated a large number of times, the number of holes remaining in the insulating film having the charge storage unit increases, and the retention characteristics of the memory cell deteriorate, so that the characteristics of the semiconductor device cannot be improved.

Other objects and novel features of the present invention will be apparent from the description of the present specification and the accompanying drawings.

According to an embodiment, a semiconductor device includes a projecting portion projected from a main surface of the semiconductor substrate, and the projecting portion includes a first region and a second region arranged on a first side in the first direction with respect to the first region when seen in a plan view. A control gate electrode covers a first upper surface of the first region, a first side surface of the first region on a second side in the second direction, and a second side surface of the first region on an opposite side of the second side in the second direction, and the second gate electrode covers a second upper surface of the second region, a third side surface of the second region on the second side, and a fourth side surface of the second region on the opposite side of the second side. The second upper surface is lower than the first upper surface, and the third side surface is arranged on the opposite side of the second side with respect to the first side surface in the second direction.

Also, according to another embodiment, in a manufacturing method of a semiconductor device, a projecting portion projected from a main surface of a semiconductor substrate and including a first region and a second region arranged on a first side with respect to the first region when seen in a plan view is formed. Subsequently, a first gate electrode covering a first upper surface of the first region, a first side surface of the first region on a second side in a second direction, and a second side surface of the first region on an opposite side of the second side in the second direction is formed. Subsequently, by etching the second region, a second upper surface of the second region becomes lower than the first upper surface, and a third side surface of the second region on the second side recedes to the opposite side of the second side with respect to the first side surface in the second direction. Subsequently, on the projecting portion and on a front surface of the first gate electrode, an insulating film including a charge storage unit inside is formed. A conductive film is formed on the insulating film. Subsequently, by etching back the conductive film, a second gate electrode covering the second upper surface, the third side surface, and a fourth side surface of the second region on the opposite side of the second side in the second direction is formed.

According to the embodiment, the performance of the semiconductor device can be improved.

BRIEF DESCRIPTIONS OF THE DRAWINGS

FIG. 12 is a cross-sectional view of a main part in the process for manufacturing the semiconductor device according to the embodiment;

DESCRIPTIONS OF THE PREFERRED EMBODIMENT

Figure 1:
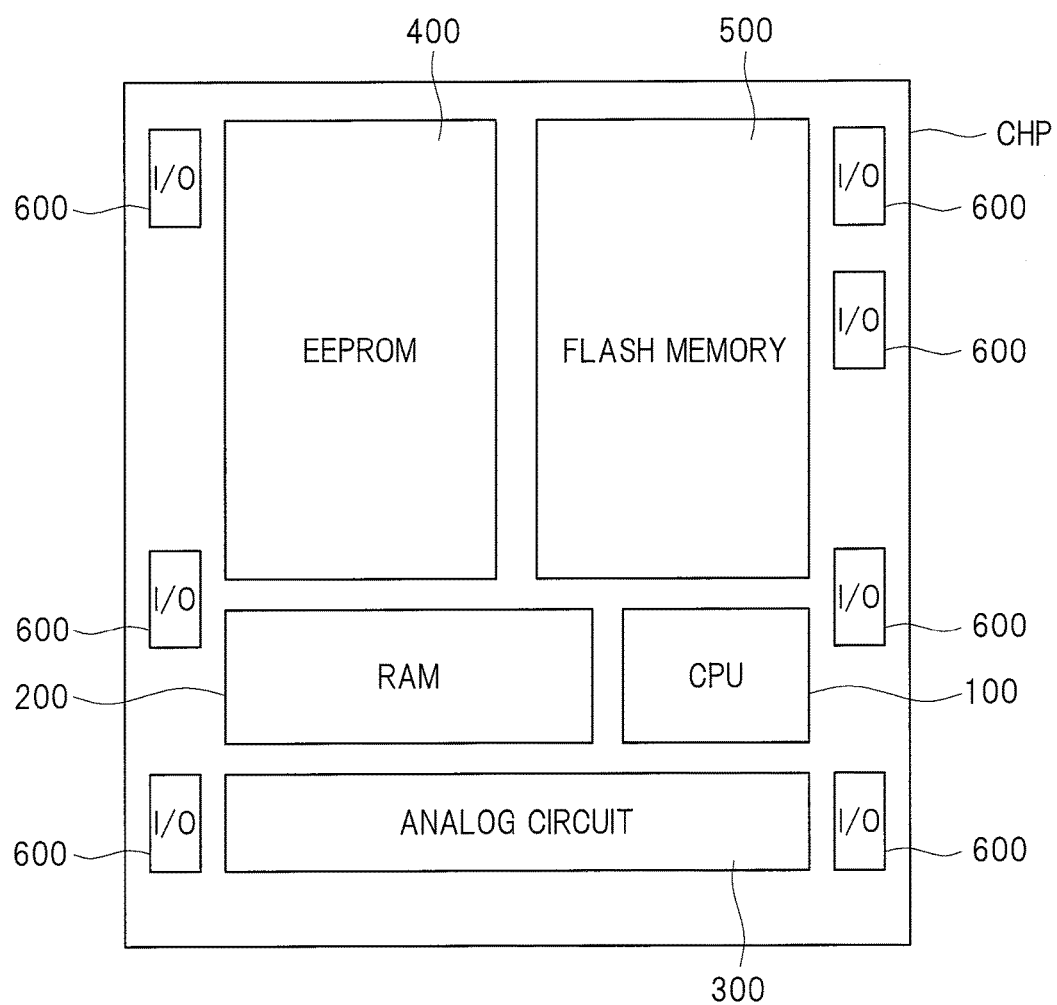
FIG. 1 illustrates a layout configuration example of a semiconductor chip according to an embodiment.

In the embodiment described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiment described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Further, in the embodiment described below, it goes without saying that the components (including element steps) are not always indispensable unless otherwise stated or except the case where the components are apparently indispensable in principle. Similarly, in the embodiment described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, a representative embodiment of the present invention will be described in detail with reference to the accompanying drawings. Note that components having the same function are denoted by the same reference characters throughout the drawings for describing the embodiment, and the repetitive description thereof is omitted. In addition, the description of the same or similar portions is not repeated in principle unless particularly required in the following embodiment. In addition, in some drawings used in the embodiment, hatching may be omitted even in a cross-sectional view so as to make the drawings easy to see.

(Embodiment)

<Layout Configuration Example of Semiconductor Chip>

A semiconductor device including a non-volatile memory according to the present embodiment will be described with reference to the drawings. First, a layout configuration of a semiconductor device (semiconductor chip) provided with a system including a non-volatile memory will be described.

FIG. 1 illustrates a layout configuration example of a semiconductor chip according to the embodiment. In FIG. 1, a semiconductor chip CHP includes a CPU (central processing unit) 100, a RAM (random access memory) 200, an analog circuit 300, an EEPROM (electrically erasable programmable read only memory) 400, a flash memory 500, and I/O (input/output) circuits 600, which constitute a semiconductor device.

The CPU (circuit) 100, which is also called a central processing unit, reads an instruction from a storage device, decodes the instruction, and executes various calculations and controls based on the instruction.

The RAM (circuit) 200 is a memory that can deal with storage information at random, that is, a memory that can read out storage information stored therein or newly write storage information as needed. The RAM 200 is also called a random access memory. As the RAM, an SRAM (static RAM) using a static circuit is used.

The analog circuit 300 is a circuit dealing with voltage signals and current signals that temporally and continuously change, that is, analog signals, and includes an amplifying circuit, a conversion circuit, a modulation circuit, an oscillation circuit, a power supply circuit, and the like, for example.

Each of the EEPROM 400 and the flash memory 500 is a kind of a non-volatile memory capable of electrically rewriting data in a write operation and an erase operation and is also called an electrically erasable programmable read only memory. Each memory cell of the EEPROM 400 and the flash memory 500 includes an MONOS transistor or an MNOS (metal-nitride-oxide-semiconductor) transistor for storage (memory), for example. The difference between the EEPROM 400 and the flash memory 500 is that the EEPROM 400 is a non-volatile memory capable of erasing data, for example, in units of a byte, while the flash memory 500 is a non-volatile memory capable of erasing data, for example, in units of a word line. In general, the flash memory 500 stores programs for executing various processing in the CPU 100 therein. In contrast, the EEPROM 400 stores various data to be frequently rewritten therein. Each of the EEPROM 400 and the flash memory 500 includes an address buffer, a row decoder, a column decoder, a verification sense amplifier circuit, a sense amplifier circuit, a writing circuit, and the like, as well as a memory cell array in which a plurality of non-volatile memory cells are arranged in a matrix form.

The I/O circuit 600 is an input/output circuit, i.e., a circuit for outputting data from the semiconductor chip CHP to equipment connected to the outside of the semiconductor chip CHP and for inputting data from the equipment connected to the outside of the semiconductor chip CHP to the semiconductor chip CHP.

The semiconductor device according to the present embodiment includes a memory cell forming region. In the memory cell forming region, the memory cell array in which the plurality of non-volatile memory cells are arranged in a matrix form is formed. In the following, the memory cell forming region will be illustrated in the drawings and described with reference to the drawings.

Meanwhile, the semiconductor device according to the present embodiment includes a logic circuit forming region, although illustration and description thereof are omitted below. In the logic circuit forming region, the CPU 100, the RAM 200, the analog circuit 300, the I/O circuit 600, and the address buffer, the row decoder, the column decoder, the verification sense amplifier circuit, the sense amplifier circuit, the writing circuit, and the like of the EEPROM 400 or the flash memory 500 are formed.

<Structure of Semiconductor Device>

Figure 2:
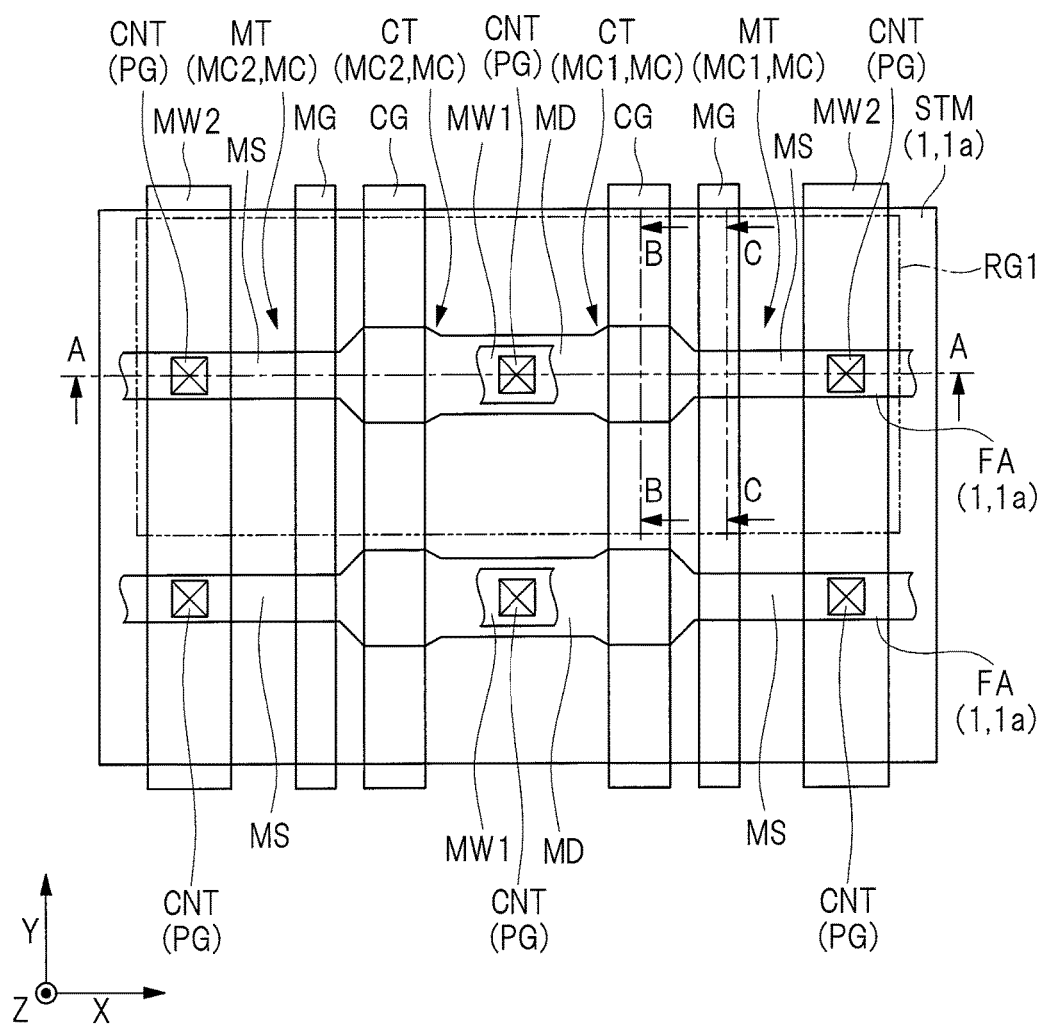
FIG. 2 is a plan view of a main part of a semiconductor device according to the embodiment.
Figure 3:
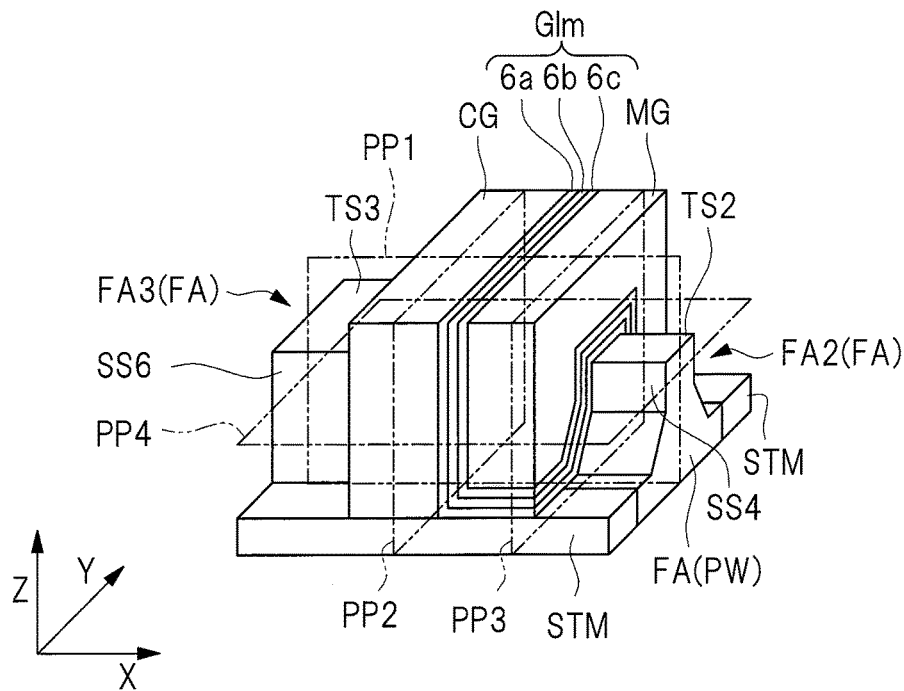
FIG. 3 is a perspective view of a main part of the semiconductor device according to the embodiment.
Figure 4:
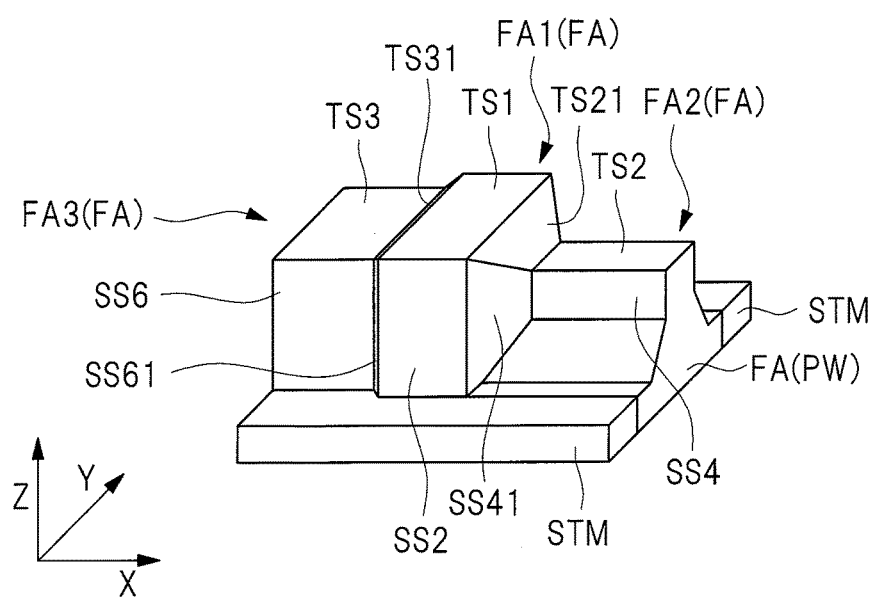
FIG. 4 is a perspective view of a main part of the semiconductor device according to the embodiment.

Next, a structure of the semiconductor device according to the present embodiment will be described. FIG. 2 is a plan view of a main part of the semiconductor device according to the embodiment. FIGS. 3 and 4 are perspective views of main parts of the semiconductor device according to the embodiment. FIG. 4 illustrates a state seen through a gate insulating film GIc (see FIG. 5), a control gate electrode CG, a gate insulating film GIm, and a memory gate electrode MG which have been removed from the perspective view illustrated in FIG. 3 for simplification of the drawing.

Figure 5:
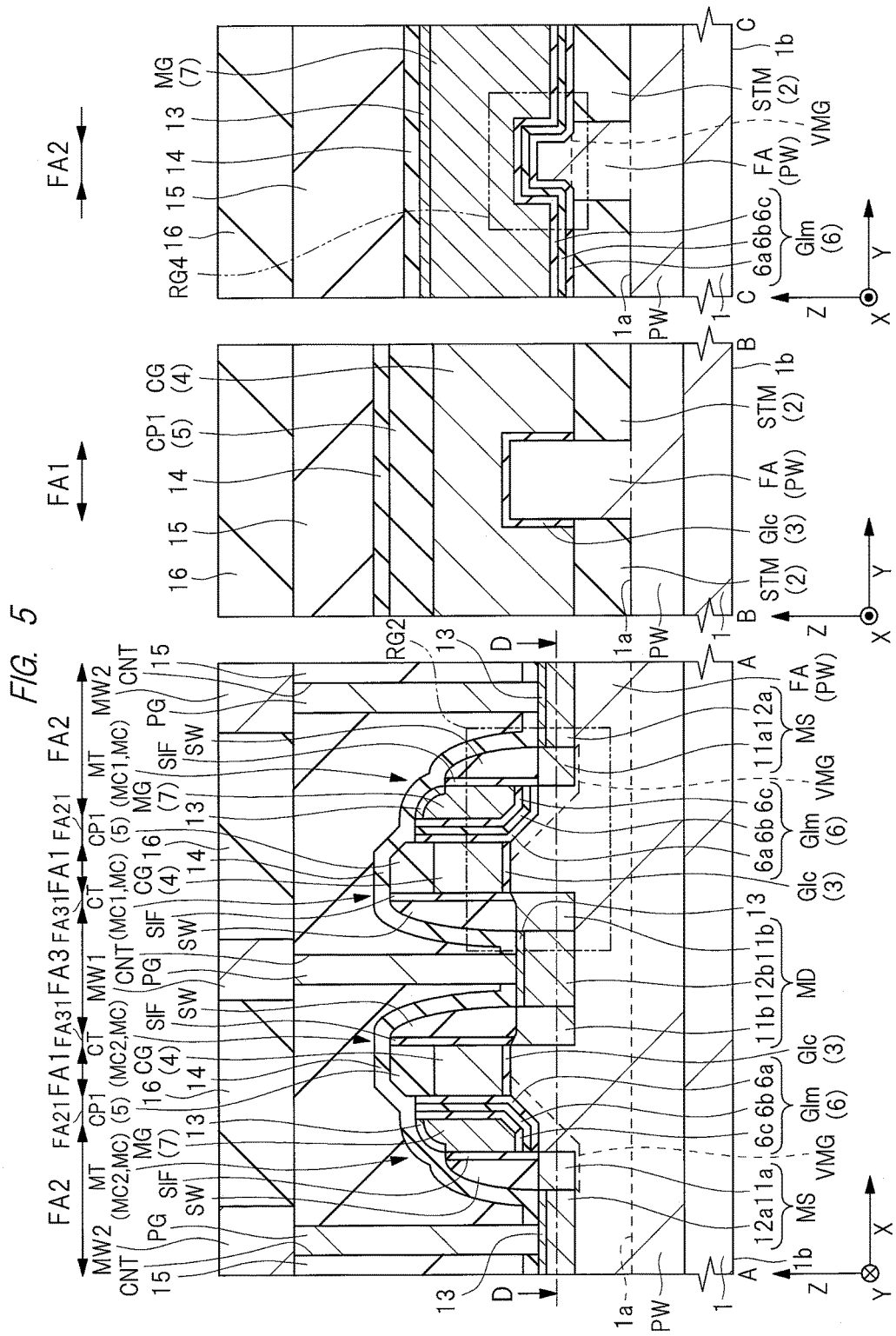
FIG. 5 is a cross-sectional view of a main part of the semiconductor device according to the embodiment.
Figure 6:
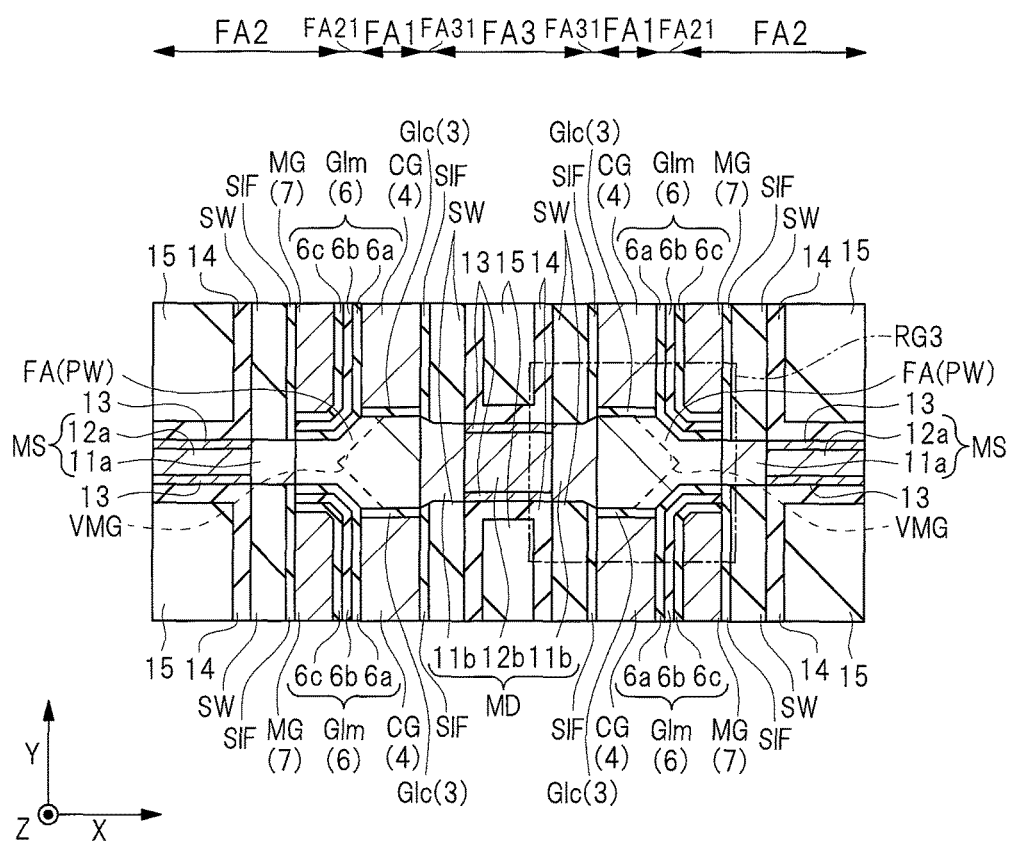
FIG. 6 is a cross-sectional view of a main part of the semiconductor device according to the embodiment.

FIGS. 5 to 8 are cross-sectional views of main parts of the semiconductor device according to the embodiment. FIG. 5 illustrates a cross-sectional view taken along a line A-A of FIG. 2, a cross-sectional view taken along a line B-B of FIG. 2, and a cross-sectional view taken along a line C-C of FIG. 2. In these drawings, the cross-section taken along the line A-A of FIG. 2 is a cross-section of a plane PP1 in FIG. 3, the cross-section taken along the line B-B of FIG. 2 is a cross-section of a plane PP2 in FIG. 3, and the cross-section taken along the line C-C of FIG. 2 is a cross-section of a plane PP3 in FIG. 3. FIG. 6 is a cross-sectional view taken along a line D-D of FIG. 5 and illustrates a region RG1 surrounded by the two-dot chain line of the plan view illustrated in FIG. 2. Also, the cross-section taken along the line D-D of FIG. 5 is a cross-section of a plane PP4 in FIG. 3.

Figure 7:
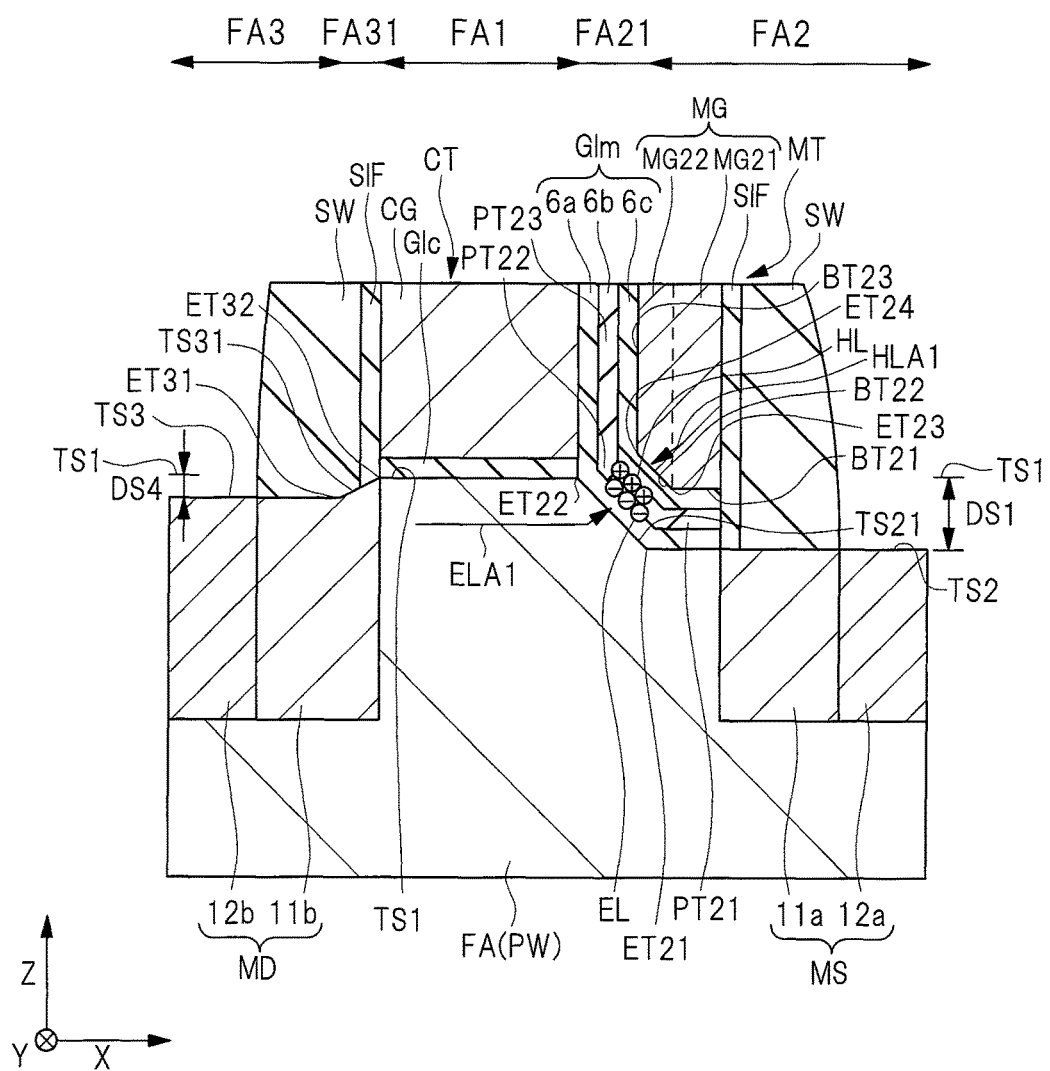
FIG. 7 is a cross-sectional view of a main part of the semiconductor device according to the embodiment.
Figure 8:
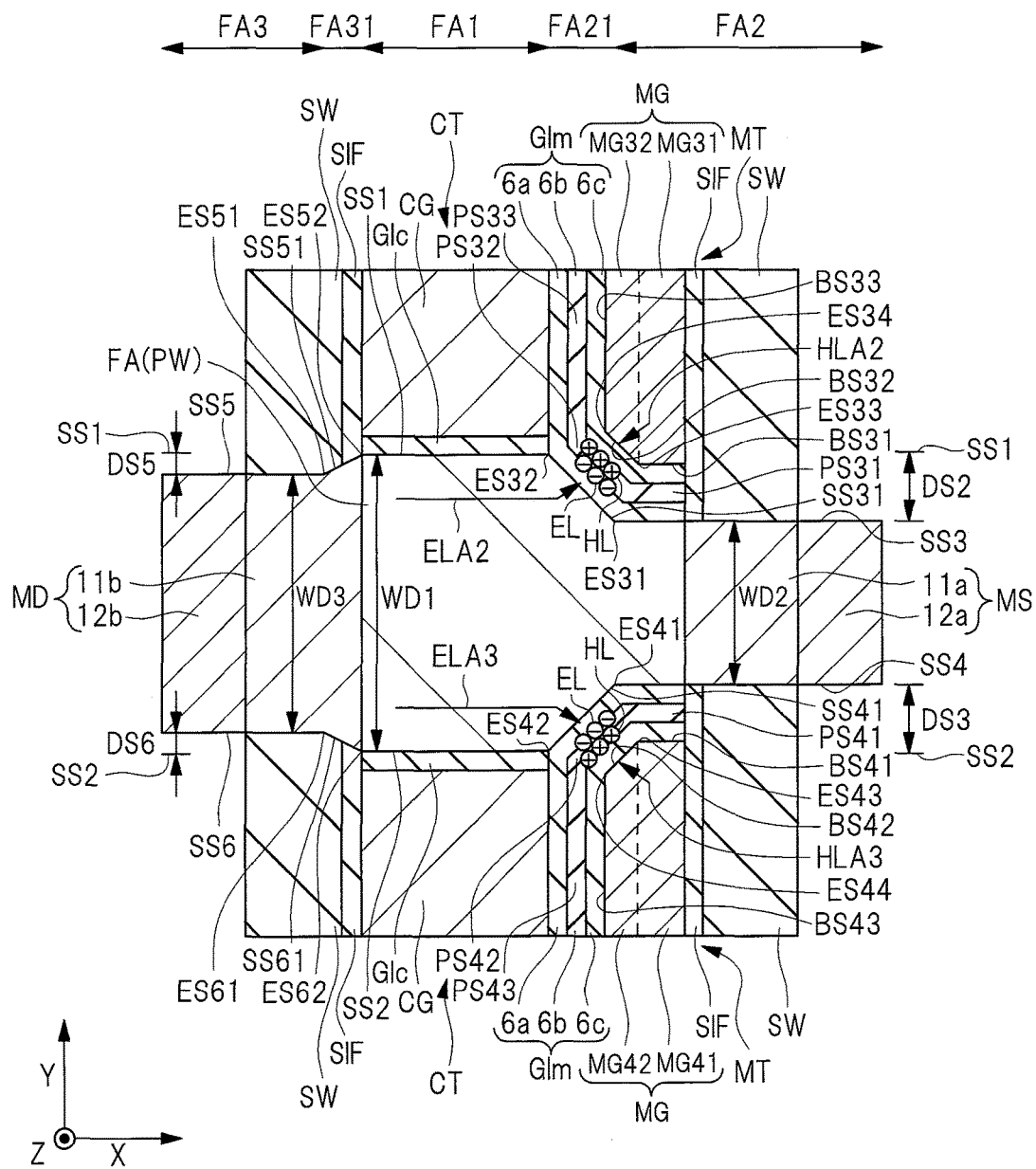
FIG. 8 is a cross-sectional view of a main part of the semiconductor device according to the embodiment.

FIG. 7 is an enlarged view of a region RG2 surrounded by the two-dot chain line of the cross-sectional view illustrated in FIG. 5, and FIG. 8 is an enlarged view of a region RG3 surrounded by the two-dot chain line of the cross-sectional view illustrated in FIG. 6. Note that, in FIGS. 7 and 8, illustration of an n$^-$-type semiconductor region VMG, a metal silicide layer 13, an insulating film 14, and an interlayer insulating film 15 is omitted from the cross-sectional views illustrated in FIGS. 5 and 6 for simplification of the drawings.

In FIG. 5, the cross-section taken along the line A-A of FIG. 2 illustrates memory cells MC1 and MC2 serving as two memory cells MC. The memory cells MC1 and MC2 are arranged symmetrically relative to a plane (a YZ plane describe later), serving as a symmetry plane, between the memory cell MC1 and the memory cell MC2. In the following, among the two memory cells MC1 and MC2, the memory cell MC1 will be described.

Also, in the present embodiment, description will be given of a case in which the memory cell MC includes an n-channel control transistor CT and an n-channel memory transistor MT. However, the conductivity type may be reversed, and the memory cell MC may include a p-channel control transistor CT and a p-channel memory transistor MT.

As illustrated in FIGS. 2 and 5, the semiconductor device includes a semiconductor substrate 1. The semiconductor substrate 1 is a semiconductor wafer having a specific resistance of, for example, about 1 to 10 Ωcm and made of p-type single-crystal silicon or the like. The semiconductor substrate 1 includes a main surface 1a and a main surface 1b on an opposite side to the main surface 1a.

As illustrated in FIGS. 2 and 5, two directions intersecting with each other, preferably, orthogonal to each other in the main surface 1a of the semiconductor substrate 1 are an X-axis direction and a Y-axis direction, and a direction perpendicular to the main surface 1a of the semiconductor substrate 1, that is, an up-down direction is a Z-axis direction. Definitions of the X-axis direction, the Y-axis direction, and the Z-axis direction in FIGS. 3, 4, and 6 to 8 are also the same as those in FIGS. 2 and 5. Also, "when seen in a plan view" in the present specification means a case in which something is seen in a direction perpendicular to the main surface 1a of the semiconductor substrate 1.

As illustrated in FIG. 2, on the semiconductor substrate 1, a plurality of fins FA extending, for example, in the X-axis direction are arranged at regular intervals in the Y-axis direction. Each fin FA is a projecting portion of a rectangular parallelepiped which is projected from the main surface 1a of the semiconductor substrate 1, and a lower portion of the fin FA is surrounded by an element isolation film STM covering the main surface of the semiconductor substrate 1. The fin FA is apart of the semiconductor substrate 1 and is an active region of the semiconductor substrate 1. In addition, when seen in a plan view, a lower portion of a trench between the adjacent fins FA is buried with the element isolation film STM, and both sides of a lower portion of the fin FA in the Y-axis direction are surrounded by the element isolation film STM. The fin FA is an active region for forming the memory cell MC.

On the plurality of element isolation films STM and the plurality of fins FA, a plurality of control gate electrodes CG and a plurality of memory gate electrodes MG extending in the Y-axis direction are formed, that is, arranged. The plurality of memory gate electrodes MG are adjacent to the plurality of control gate electrodes CG, respectively. In a pair of the control gate electrode CG and the memory gate electrode MG, a semiconductor region MD serving as a drain region is formed on a part of the fin FA located on an opposite side to the memory gate electrode MG with the control gate electrode CG interposed therebetween. Also, a semiconductor region MS serving as a source region is formed on a part of the fin FA located on an opposite side to the control gate electrode CG with the memory gate electrode MG interposed therebetween. The semiconductor region MD and the semiconductor region MS are n-type semiconductor regions. The semiconductor region MD is formed between the two adjacent control gate electrodes CG, and the semiconductor region MS is formed between the two adjacent memory gate electrodes MG, although illustration thereof is omitted. The control gate electrode CG, the memory gate electrode MG, the semiconductor region MD, and the semiconductor region MS form the memory cell MC serving as a non-volatile memory.

That is, the memory cell according to the present embodiment has a fin-type structure in which each of the control gate electrode CG and the memory gate electrode MG is formed to straddle the fin FA. Such a fin-type structure reduces the width of the memory cell MC in the Y-axis direction while securing the channel width, thereby enabling the memory cell to be integrated.

In the two memory cells MC adjacent in the X-axis direction, the semiconductor region MD or the semiconductor region MS is shared. The two memory cells MC sharing the semiconductor region MD serving as a drain region are arranged to be mirror-symmetric to each other in the X-axis direction with the semiconductor region MD interposed therebetween, that is, to be plane-symmetric to each other with the YZ plane passing the semiconductor region MD serving as a symmetry plane. Also, the two memory cells MC sharing the semiconductor region MS serving as a source region are arranged to be mirror-symmetric to each other in the X-axis direction with the semiconductor region MS interposed therebetween, that is, to be plane-symmetric to each other with the YZ plane passing the semiconductor region MS serving as a symmetry plane, although illustration thereof is omitted. Here, the YZ plane is a plane perpendicular to the X-axis direction.

The plurality of memory cells MC are formed along the X-axis direction in the fin FA extending in the X-axis direction, for example. The semiconductor region MD serving as a drain region for the plurality of memory cells MC arranged in the X-axis direction is connected to a metal wire MW1 extending in the X-axis direction via a plug PG serving as a contact electrode formed in a contact hole CNT.

Also, the semiconductor region MS serving as a source region for the plurality of memory cells MC arranged in the Y-axis direction is connected to a metal wire MW2 extending in the Y-axis direction via the plug PG formed in the contact hole CNT. One of the metal wires MW1 and MW2 is a source line, and the other is a bit line, for example. Note that, for the metal wire MW1, a metal wire in a different layer from that of the metal wire MW2 may be used.

Next, referring to FIGS. 5 to 8, a structure of the memory cell MC formed in the fin FA will be described. Also, in the following, of the memory cells MC1 and MC2 which are two memory cells MC adjacent in the X-axis direction, the memory cell MC1 arranged on a positive side in the X-axis direction with respect to the memory cell MC2 will be described.

As described above, the fin FA is a part of the semiconductor substrate 1 and is projected from the main surface 1a of the semiconductor substrate 1. Both the sides of the lower portion of the fin FA in the Y-axis direction are surrounded by the element isolation film STM formed on the main surface 1a of the semiconductor substrate 1. That is, the adjacent fins FA are isolated by the element isolation film STM. Inside the fin FA, a p-type well PW serving as a p-type semiconductor region is formed. In other words, the fin FA is formed in the p-type well PW.

As illustrated in FIGS. 5 to 8, in the present embodiment, a part of the fin FA in which one memory cell MC is formed includes a region FA1, a region FA2, and a region FA3. In the part of the fin FA in which the memory cell MC1 is formed, the region FA2 is arranged on the positive side in the X-axis direction with respect to the region FA1 and is adjacent to the region FA1 when seen in a plan view. Also, in the part of the fin FA in which the memory cell MC1 is formed, the region FA3 is arranged on a negative side in the X-axis direction with respect to the region FA1, that is, on an opposite side of the positive side in the X-axis direction, and is adjacent to the region FA1, when seen in a plan view.

Note that, in the present specification, "the positive side in the X-axis direction" means a side on which an arrow in the drawing representing the X-axis direction extends, and "the negative side in the X-axis direction" means an opposite side of the above "positive side." Also, the same is true of the positive side and the negative side in the Y-axis direction.

Preferably, a region FA21 may be arranged between the region FA1 and the region FA2. Alternatively, the region FA2 may be adjacent to the region FA1. Also, preferably, a region FA31 may be arranged between the region FA1 and the region FA3. Alternatively, the region FA3 may be adjacent to the region FA1.

As illustrated in FIGS. 7 and 8, an upper surface of the region FA1 is referred to as an upper surface TS1, a side surface of the region FA1 on the positive side in the Y-axis direction is referred to as a side surface SS1, and a side surface of the region FA1 on the negative side in the Y-axis direction, that is, on an opposite side of the positive side in the Y-axis direction, is referred to as a side surface SS2. An upper surface of the region FA2 is referred to as an upper surface TS2, a side surface of the region FA2 on the positive side in the Y-axis direction is referred to as a side surface SS3, and a side surface of the region FA2 on the negative side in the Y-axis direction is referred to as a side surface SS4. An upper surface of the region FA3 is referred to as an upper surface TS3, a side surface of the region FA3 on the positive side in the Y-axis direction is referred to as a side surface SS5, and a side surface of the region FA3 on the negative side in the Y-axis direction is referred to as a side surface SS6.

On the region FA1 of the fin FA, the control gate electrode CG is formed via a gate insulating film GIc, and on the region FA2 of the fin FA, the memory gate electrode MG is formed via a gate insulating film GIm. The gate insulating film GIm is interposed between the control gate electrode CG and the memory gate electrode MG, and the control gate electrode CG and the memory gate electrode MG are electrically isolated by the gate insulating film GIm. Note that an insulating film other than the gate insulating film GIm may be interposed between the control gate electrode CG and the memory gate electrode MG to electrically isolate the control gate electrode CG and the memory gate electrode MG from each other.

Specifically, the control gate electrode CG is formed on the upper surface TS1 of the region FA1, on the side surface SS1 of the region FA1, and on the side surface SS2 of the region FA1. In other words, the control gate electrode CG is formed to cover the upper surface TS1 of the region FA1, the side surface SS1 of the region FA1, and the side surface SS2 of the region FA1. The gate insulating film GIc is formed between the control gate electrode CG and the upper surface TS1 of the region FA1, between the control gate electrode CG and the side surface SS1 of the region FA1, and between the control gate electrode CG and the side surface SS2 of the region FA1.

The memory gate electrode MG and a sidewall spacer SW on a side surface of the memory gate electrode MG are formed on the upper surface TS2 of the region FA2, on the side surface SS3 of the region FA2, and on the side surface SS4 of the region FA2. In other words, the memory gate electrode MG and the sidewall spacer SW on the side surface of the memory gate electrode MG are formed to cover the upper surface TS2 of the region FA2, the side surface SS3 of the region FA2, and the side surface SS4 of the region FA2. The gate insulating film GIm is formed between the memory gate electrode MG and the control gate electrode CG, between the memory gate electrode MG and the upper surface TS2 of the region FA2, between the memory gate electrode MG and the side surface SS3 of the region FA2, and between the memory gate electrode MG and the side surface SS4 of the region FA2. An $n^-$-type semiconductor region 11a and an $n^+$-type semiconductor region 12a are formed in the region FA2.

A sidewall spacer SW on a side surface of the control gate electrode CG is formed on the upper surface TS3 of the region FA3, on the side surface SS5 of the region FA3, and on the side surface SS6 of the region FA3. In other words, the sidewall spacer SW on the side surface of the control gate electrode CG is formed to cover the upper surface TS3 of the region FA3, the side surface SS5 of the region FA3, and the side surface SS6 of the region FA3. An $n^-$-type semiconductor region 11b and an $n^+$-type semiconductor region 12b are formed in the region FA3.

Note that, in the present specification, "formed on the side surface of the control gate electrode CG" means being formed to cover the side surface of the control gate electrode CG, and "formed on the side surface of the memory gate electrode MG" means being formed to cover the side surface of the memory gate electrode MG.

The gate insulating film GIc includes an insulating film 3. The insulating film 3 is a silicon oxide film, a silicon nitride film or a silicon oxynitride film, or a high dielectric constant film having a higher relative dielectric constant than that of the silicon nitride film, that is, a so-called High-k film. Note that, in the present application, the High-k film or the high dielectric constant film means a film having a higher dielectric constant (relative dielectric constant) than that of the silicon nitride film. As the insulating film 3, a metal oxide film such as a hafnium oxide film, a zirconium oxide film, an aluminum oxide film, a tantalum oxide film, and a lanthanum oxide film can be used.

The gate insulating film GIm includes an insulating film 6. The insulating film 6 is a laminated film including an insulating film 6a, an insulating film 6b as a charge storage unit over the insulating film 6a, and an insulating film 6c over the insulating film 6b, for example.

Note that the gate insulating film GIm between the memory gate electrode MG and the region FA2 of the fin FA functions as a gate insulating film for the memory transistor MT as described above. On the other hand, the gate insulating film GIm between the memory gate electrode MG and the control gate electrode CG functions as an insulating film for insulating, that is, electrically isolating, the memory gate electrode MG and the control gate electrode CG from each other.

The insulating film 6b is an insulating film for storing charges and functions as a charge storage unit. That is, the insulating film 6b is a trapping insulating film formed in the insulating film 6. Thus, the insulating film 6 can be regarded as an insulating film including a charge storage unit therein.

The insulating film 6c and the insulating film 6a located on the upper and lower sides of the insulating film 6b can function as charge blocking layers confining charges. A structure of interposing the insulating film 6b between the insulating film 6c and the insulating film 6a enables charges to be stored in the insulating film 6b.

As the insulating film 6a, a silicon oxide film formed by thermally oxidizing a front surface of the region FA2 of the fin FA can be used, for example. A film thickness of the insulating film 6a can be set to be about 4 nm, for example. As the insulating film 6b, a silicon nitride film or a hafnium silicate film can be used, for example. A film thickness of the insulating film 6b can be set to be about 7 nm, for example. As the insulating film 6c, a silicon oxide film, a silicon oxynitride film, or an aluminum oxide film can be used, for example. A film thickness of the insulating film 6c can be set to be about 9 nm, for example.

The insulating film 6a including a silicon oxide film, the insulating film 6b including a silicon nitride film, and the insulating film 6c including a silicon oxide film can also be regarded as an ONO (oxide-nitride-oxide) film.

The control gate electrode CG includes a conductive film 4. The conductive film 4 is made of silicon and for example, made of an n-type polysilicon film which is a polycrystalline silicon film into which n-type impurities are doped. Specifically, the control gate electrode CG includes the patterned conductive film 4.

The memory gate electrode MG includes a conductive film 7. The conductive film 7 is made of silicon and for example, made of an n-type polysilicon film which is a polycrystalline silicon film into which n-type impurities are doped. The conductive film 7 formed to cover the control gate electrode CG on the fin FA is subjected to anisotropic etching, that is, etched back to remain on a sidewall of the control gate electrode CG via the insulating film 6, thereby forming the memory gate electrode MG. Thus, the memory gate electrode MG is formed on the sidewall of the control gate electrode CG via the insulating film 6 like a sidewall spacer.

A cap insulating film CP1 includes an insulating film 5 containing silicon and nitrogen such as a silicon nitride film. The cap insulating film CP1 is a protective film protecting the control gate electrode CG and is a hard mask film when the conductive film 4 is patterned to form the control gate electrode CG. Alternatively, the cap insulating film CP1 is a cap film for adjusting a height of the upper surface of each memory gate electrode MG when the conductive film 7 is etched back to form the memory gate electrodes MG. Note that, between the cap insulating film CP1 and the control gate electrode CG, a cap insulating film containing silicon and oxygen such as a silicon oxide film may be formed.

The semiconductor region MS is a semiconductor region functioning as one of the source region and the drain region, and the semiconductor region MD is a semiconductor region functioning as the other of the source region and the drain region. Here, the semiconductor region MS is a semiconductor region functioning as the source region, for example, and the semiconductor region MD is a semiconductor region functioning as the drain region, for example. Each of the semiconductor regions MS and MD is made of a semiconductor region into which n-type impurities are doped and has an LDD (lightly doped drain) structure.

The semiconductor region MS as the source region includes the n$^-$-type semiconductor region 11a and the n$^+$-type semiconductor region 12a having a higher impurity concentration than that of the n$^-$-type semiconductor region 11a. Also, the semiconductor region MD as the drain region includes the n$^-$-type semiconductor region 11b and the n$^+$-type semiconductor region 12b having a higher impurity concentration than that of the n$^-$-type semiconductor region 11b.

On each sidewall of the memory gate electrode MG and the control gate electrode CG where the memory gate electrode MG and the control gate electrode CG are not adjacent to each other, the sidewall spacer SW made of an insulating film such as a silicon oxide film, a silicon nitride film, or a laminated film thereof is formed. One sidewall spacer SW is formed in a part adjacent to the control gate electrode CG on the opposite side to the memory gate electrode MG with the control gate electrode CG interposed therebetween. Also, the other sidewall spacer SW is formed in a part adjacent to the memory gate electrode MG on the opposite side to the control gate electrode CG with the memory gate electrode MG interposed therebetween.

Note that, as illustrated in FIGS. 5 to 8, an insulating film SIF made of, for example, silicon oxide, may be interposed between the control gate electrode CG and the sidewall spacer SW and between the memory gate electrode MG and the sidewall spacer SW.

The n$^-$-type semiconductor region 11a is formed against the side surface of the memory gate electrode MG in a self-aligned manner, and the n$^+$-type semiconductor region 12a is formed against a side surface of the sidewall spacer SW on the side surface of the memory gate electrode MG in a self-aligned manner. Thus, the low-concentration n$^-$-type semiconductor region 11a is formed in a part of the region FA2 opposed to the sidewall spacer SW covering the side surface of the memory gate electrode MG, and the high-concentration n$^+$-type semiconductor region 12a is formed on an opposite side to the control gate electrode CG with respect to the low-concentration n$^-$-type semiconductor region 11a. Then, the high-concentration n$^+$-type semiconductor region 12a is formed in contact with the low-concentration n$^-$-type semiconductor region 11a.

The n$^-$-type semiconductor region 11b is formed against the side surface of the control gate electrode CG in a self-aligned manner, and the n$^+$-type semiconductor region 12b is formed against a side surface of the sidewall spacer SW on the side surface of the control gate electrode CG in a self-aligned manner. Thus, the low-concentration n$^-$-type semiconductor region 11b is formed in a part of the region FA3 opposed to the sidewall spacer SW covering the side surface of the control gate electrode CG, and the high-concentration n+-type semiconductor region 12b is formed on an opposite side to the memory gate electrode MG with respect to the low-concentration n⁻-type semiconductor region 11b. Then, the high-concentration n+-type semiconductor region 12b is formed in contact with the low-concentration n⁻-type semiconductor region 11b. Also, as described above, the two adjacent memory cells MC share the high-concentration n+-type semiconductor region 12b.

Note that, as for a part of the region FA2 exposed from the element isolation film STM, the n⁻-type semiconductor region 11a and the n+-type semiconductor region 12a are formed continuously inside the region FA2 from the side surface SS3 of the region FA2 to the side surface SS4 of the region FA2 at any height position. Also, as for a part of the region FA3 exposed from the element isolation film STM, the n⁻-type semiconductor region 11b and the n+-type semiconductor region 12b are formed continuously inside the region FA3 from the side surface SS5 of the region FA3 to the side surface SS6 of the region FA3 at any height position.

In a part of the fin FA opposed to the control gate electrode CG via the gate insulating film GIc, a channel region of the control transistor CT is formed.

In a part of the fin FA opposed to the memory gate electrode MG via the gate insulating film GIm, an n⁻-type semiconductor region VMG is formed. The n⁻-type semiconductor region VMG is adapted to adjust a threshold voltage Vth of the memory transistor MT and is formed in contact with the n⁻-type semiconductor region 11a. Also, the n-type impurity concentration of the n⁻-type semiconductor region VMG is lower than the n-type impurity concentration of the n⁻-type semiconductor region 11a.

On each of the n+-type semiconductor regions 12a and 12b, that is, on each front surface of the n+-type semiconductor regions 12a and 12b, a metal silicide layer 13 is formed by the salicide (self-aligned silicide) technique or the like. The metal silicide layer 13 is a cobalt silicide layer, a nickel silicide layer, or a platinum-added nickel silicide layer, for example. The metal silicide layer 13 can lower the diffusion resistance and the contact resistance. Note that the metal silicide layer 13 may be formed on the memory gate electrode MG.

An insulating film 14 is formed over the element isolation film STM and over the fin FA to cover the control gate electrode CG, the cap insulating film CP1, the memory gate electrode MG, and the respective sidewall spacers SW. The insulating film 14 is a silicon nitride film, for example.

An interlayer insulating film 15 is formed over the insulating film 14. The interlayer insulating film 15 is a single film of a silicon oxide film, a laminated film of a silicon nitride film and a silicon oxide film, or the like. An upper surface of the interlayer insulating film 15 is planarized.

The interlayer insulating film 15 and the insulating film 14 have the contact holes CNT formed therein, and in each of the contact holes CNT, a conductive plug PG is buried as a conductive unit.

The plug PG is formed by a thin barrier conductor film formed in a bottom portion and on a sidewall, that is, a side surface of the contact hole CNT, and a main conductor film formed on this barrier conductor film to fill the contact hole CNT. In FIG. 5, the barrier conductor film and the main conductor film constituting the plug PG are illustrated in an integrated manner for simplification of the drawing. Note that the barrier conductor film constituting the plug PG can be a titanium (Ti) film, a titanium nitride (TiN) film, or a laminated film thereof and the main conductor film constituting the plug PG can be a tungsten (W) film, for example.

The contact hole CNT and the plug PG buried in the contact hole CNT are formed on the n'-type semiconductor regions 12a and 12b and the like. In the bottom portion of the contact hole CNT, a part of the metal silicide layer 13 on each front surface of the n+-type semiconductor regions 12a and 12b is exposed, for example. Then, the plug PG is connected to the exposed part. Note that, although illustration is omitted, the contact hole CNT and the plug PG buried in the contact hole CNT may be formed on each of the control gate electrode CG and the memory gate electrode MG.

An insulating film 16 is formed over the interlayer insulating film 15 in which the plug PG is buried, and in the insulating film 16, wiring trenches each penetrating the insulating film 16 and reaching the plug PG are formed. In the wiring trenches, the metal wires MW1 and MW2 serving as wires of a first layer made of buried damascene wires containing copper (Cu) as a main conductive material are formed. Note that, although wires of an upper layer made of damascene wires are formed on the wires of the first layer, illustration and description thereof are omitted here. In addition, the wires of the first layer and the wires of the upper layer are not limited to the damascene wires but can be formed by patterning a conductive film for wires. For example, tungsten (W) wires, aluminum (Al) wires, or the like are applicable.

As illustrated in FIGS. 7 and 8, the upper surface TS2 of the region FA2 is lower than the upper surface TS1 of the region FA1. That is, the upper surface TS2 of the region FA2 is arranged on a side of the main surface 1b (see FIG. 5) with respect to the upper surface TS1 of the region FA1 in the Z-axis direction which is a direction perpendicular to the main surface 1a. Also, the side surface SS3 of the region FA2 is arranged on the negative side in the Y-axis direction with respect to the side surface SS1 of the region FA1 in the Y-axis direction.

Accordingly, in apart of the gate insulating film GIm between the memory gate electrode MG and the upper surface TS2 of the region FA2 and in apart of the gate insulating film GIm between the memory gate electrode MG and the side surface SS3 of the region FA2, a distribution of electrons injected at the time of writing data and a distribution of holes injected at the time of erasing data get close to each other. Note that the distribution of electrons injected at the time of writing data and the distribution of holes injected at the time of erasing data will be described below with reference to FIGS. 7 and 8.

Preferably, a distance DS1 (see FIG. 7) between the upper surface TS2 of the region FA2 and the upper surface TS1 of the region FA1 in the Z-axis direction is longer than a distance DS2 (see FIG. 8) between the side surface SS3 of the region FA2 and the side surface SS1 of the region FA1 in the Y-axis direction.

In the memory cell having the fin-type structure, to increase the effect of integrating the memory cell by reducing the width of the memory cell MC in the Y-axis direction while securing the channel width, a width of the region FA2 in the Y-axis direction is preferably smaller than a height of the region FA2 in the Z-axis direction. Thus, an electric field between the region FA2 and the memory gate electrode MG focuses on an upper portion of the region FA2. Accordingly, by setting the digging depth (distance DS1) for making the upper surface TS2 lower than the upper surface TS1 to be larger than the receding width (distance DS2) for making the side surface SS3 recede with respect to the side surface SS1, the effect of bringing the distribution of electrons injected at the time of writing data closer to the distribution of holes injected at the time of erasing data can be enhanced.

Further, the side surface SS4 of the region FA2 may be arranged on the positive side in the Y-axis direction with respect to the side surface SS2 of the region FA1 in the Y-axis direction. At this time, a width WD2 (see FIG. 8) in the Y-axis direction in the region FA2 is smaller than a width WD1 (see FIG. 8) in the Y-axis direction in the region FA1.

Accordingly, also in a part of the gate insulating film GIm between the memory gate electrode MG and the side surface SS4 of the region FA2, a distribution of electrons injected at the time of writing data and a distribution of holes injected at the time of erasing data get close to each other.

In this case, preferably, the distance DS1 between the upper surface TS2 of the region FA2 and the upper surface TS1 of the region FA1 in the Z-axis direction is longer than a distance DS3 (see FIG. 8) between the side surface SS4 of the region FA2 and the side surface SS2 of the region FA1 in the Y-axis direction. That is, the distance DS1 is longer than any of the distance DS2 and the distance DS3.

As described above, the electric field between the region FA2 and the memory gate electrode MG focuses on the upper portion of the region FA2. Accordingly, by setting the digging depth (distance DS1) for making the upper surface TS2 lower than the upper surface TS1 to be larger than the receding width (distance DS3) for making the side surface SS4 recede with respect to the side surface SS2, the effect of bringing the distribution of electrons injected at the time of writing data closer to the distribution of holes injected at the time of erasing data can be enhanced.

A case in which the region FA21 is arranged between the region FA1 and the region FA2 is considered. In this case, preferably, the region FA21 includes a connection surface TS21 connecting the upper surface TS1 of the region FA1 to the upper surface TS2 of the region FA2, a connection surface SS31 connecting the side surface SS1 of the region FA1 to the side surface SS3 of the region FA2, and a connection surface SS41 connecting the side surface SS2 of the region FA1 to the side surface SS4 of the region FA2. The gate insulating film GIm is also formed between the memory gate electrode MG and the connection surface TS21, between the memory gate electrode MG and the connection surface SS31, and between the memory gate electrode MG and the connection surface SS41. That is, the gate insulating film GIm is formed over the connection surface TS21, over the connection surface SS31, over the connection surface SS41, over the upper surface TS2, over the side surface SS3, and over the side surface SS4. In other words, the gate insulating film GIm is formed to cover the connection surface TS21, the connection surface SS31, the connection surface SS41, the upper surface TS2, the side surface SS3, and the side surface SS4.

An end ET21 of the connection surface TS21 may be connected to the upper surface TS2 of the region FA2, and an end ET22 on an opposite side of the end ET21 of the connection surface TS21 may be connected to the upper surface TS1 of the region FA1. The end ET21 of the connection surface TS21 may be arranged on the positive side in the X-axis direction with respect to the end ET22 of the connection surface TS21 and may be arranged on a lower side than the end ET22 of the connection surface TS21, that is, on a side of the main surface 1b (see FIG. 5) than the end ET22 in the Z-axis direction. In other words, the connection surface TS21 may be inclined with respect to any of the upper surface TS2 and the YZ plane in such a way that the end ET21 may be located on the positive side in the X-axis direction with respect to the end ET22 and may be located on the lower side than the end ET22 in the Z-axis direction.

An end ES31 of the connection surface SS31 may be connected to the side surface SS3 of the region FA2, and an end ES32 on an opposite side of the end ES31 of the connection surface SS31 may be connected to the side surface SS1 of the region FA1. The end ES31 of the connection surface SS31 may be arranged on the positive side in the X-axis direction with respect to the end ES32 of the connection surface SS31 and may be arranged on the negative side in the Y-axis direction with respect to the end ES32. In other words, the connection surface SS31 may be inclined with respect to any of the side surface SS3 and the YZ plane in such a way that the end ES31 may be located on the positive side in the X-axis direction with respect to the end ES32 and may be located on the negative side in the Y-axis direction with respect to the end ES32.

An end ES41 of the connection surface SS41 may be connected to the side surface SS4 of the region FA2, and an end ES42 on an opposite side of the end ES41 of the connection surface SS41 may be connected to the side surface SS2 of the region FA1. The end ES41 of the connection surface SS41 may be arranged on the positive side in the X-axis direction with respect to the end ES42 of the connection surface SS41 and may be arranged on the positive side in the Y-axis direction with respect to the end ES42. In other words, the connection surface SS41 may be inclined with respect to any of the side surface SS4 and the YZ plane in such a way that the end ES41 may be located on the positive side in the X-axis direction with respect to the end ES42 and may be located on the positive side in the Y-axis direction with respect to the end ES42.

Accordingly, in the part of the gate insulating film GIm between the memory gate electrode MG and the upper surface TS2 and in the part of the gate insulating film GIm between the memory gate electrode MG and the side surface SS3, the distribution of electrons injected at the time of writing data and the distribution of holes injected at the time of erasing data get much closer to each other or are equal to each other. Also, in the part of the gate insulating film GIm between the memory gate electrode MG and the side surface SS4, the distribution of electrons injected at the time of writing data and the distribution of holes injected at the time of erasing data get much closer to each other or are equal to each other.

Meanwhile, as illustrated in FIGS. 7 and 8, the upper surface TS3 of the region FA3 is lower than the upper surface TS1 of the region FA1. That is, the upper surface TS3 of the region FA3 is arranged on the side of the main surface 1b with respect to the upper surface TS1 of the region FA1 in the Z-axis direction. Also, the side surface SS5 of the region FA3 is arranged on the negative side in the Y-axis direction with respect to the side surface SS1 of the region FA1 in the Y-axis direction.

Preferably, the upper surface TS3 of the region FA3 is higher than the upper surface TS2 of the region FA2. That is, the upper surface TS2 of the region FA2 is arranged on the side of the main surface 1b (see FIG. 5) with respect to the upper surface TS3 of the region FA3 in the Z-axis direction. Also, the side surface SS5 of the region FA3 is arranged on the positive side in the Y-axis direction with respect to the side surface SS3 of the region FA2 in the Y-axis direction.

Accordingly, the upper surface TS3 of the region FA3 can be arranged at substantially the same height as the upper surface TS1 of the region FA1, and the side surface SS5 of the region FA3 can be arranged at substantially the same position as the side surface SS1 of the region FA1 in the Y-axis direction. Thus, since the distributions of the n⁻-type semiconductor region 11b and the n⁺-type semiconductor region 12b in this case are substantially similar to those in a case in which the upper surface TS3 is arranged at the same height as the upper surface TS1 and the side surface SS5 is arranged at the same position as the side surface SS1 in the Y-axis direction, a decrease in on-state current flowing in the control transistor CT can be prevented or suppressed.

Further, the side surface SS6 of the region FA3 maybe arranged on the positive side in the Y-axis direction with respect to the side surface SS2 of the region FA1 in the Y-axis direction. In this case, a width WD3 (see FIG. 8) in the Y-axis direction in the region FA3 is smaller than the width WD1 (see FIG. 8) in the Y-axis direction in the region FA1.

Further, preferably, the side surface SS6 of the region FA3 may be arranged on the negative side in the Y-axis direction with respect to the side surface SS4 of the region FA2 in the Y-axis direction. In this case, the width WD3 (see FIG. 8) in the Y-axis direction in the region FA3 is wider than the width WD2 (see FIG. 8) in the Y-axis direction in the region FA2.

Accordingly, the side surface SS6 of the region FA3 can be arranged at substantially the same position as the side surface SS2 of the region FA1 in the Y-axis direction. Thus, since the distributions of the n⁻-type semiconductor region 11b and the n⁺-type semiconductor region 12b in this case are substantially similar to those in a case in which the side surface SS6 of the region FA3 is arranged at the same position as the side surface SS2 of the region FA1 in the Y-axis direction, a decrease in on-state current flowing in the control transistor CT can be prevented or suppressed.

A case in which the region FA31 is arranged between the region FA1 and the region FA3 is considered. In this case, preferably, the region FA31 includes a connection surface TS31 connecting the upper surface TS1 of the region FA1 to the upper surface TS3 of the region FA3, a connection surface SS51 connecting the side surface SS1 of the region FA1 to the side surface SS5 of the region FA3, and a connection surface SS61 connecting the side surface SS2 of the region FA1 to the side surface SS6 of the region FA3. The sidewall spacer SW on the side surface of the control gate electrode CG is formed over the connection surface TS31, over the connection surface SS51, over the connection surface SS61, over the upper surface TS3, over the side surface SS5, and over the side surface SS6. In other words, the sidewall spacer SW on the side surface of the control gate electrode CG is formed to cover the connection surface TS31, the connection surface SS51, the connection surface SS61, the upper surface TS3, the side surface SS5, and the side surface SS6.

An end ET31 of the connection surface TS31 may be connected to the upper surface TS3 of the region FA3, and an end ET32 on an opposite side of the end ET31 of the connection surface TS31 may be connected to the upper surface TS1 of the region FA1. The end ET31 of the connection surface TS31 may be arranged on the negative side in the X-axis direction with respect to the end ET32 of the connection surface TS31 and may be arranged on a lower side than the end ET32 of the connection surface TS31, that is, on the side of the main surface 1b (see FIG. 5) with respect to the end ET32 in the Z-axis direction. In other words, the connection surface TS31 may be inclined with respect to any of the upper surface TS3 and the YZ plane in such a way that the end ET31 may be located on the negative side in the X-axis direction with respect to the end ET32 and may be located on the lower side than the end ET32 in the Z-axis direction.

An end ES51 of the connection surface SS51 may be connected to the side surface SS5 of the region FA3, and an end ES52 on an opposite side of the end ES51 of the connection surface SS51 may be connected to the side surface SS1 of the region FA1. The end ES51 of the connection surface SS51 may be arranged on the negative side in the X-axis direction with respect to the end ES52 of the connection surface SS51 and may be arranged on the negative side in the Y-axis direction with respect to the end ES52. In other words, the connection surface SS51 may be inclined with respect to any of the side surface SS5 and the YZ plane in such a way that the end ES51 may be located on the negative side in the X-axis direction with respect to the end ES52 and may be located on the negative side in the Y-axis direction with respect to the end ES52.

An end ES61 of the connection surface SS61 may be connected to the side surface SS6 of the region FA3, and an end ES62 on an opposite side of the end ES61 of the connection surface SS61 may be connected to the side surface SS2 of the region FA1. The end ES61 of the connection surface SS61 may be arranged on the negative side in the X-axis direction with respect to the end ES62 of the connection surface SS61 and may be arranged on the positive side in the Y-axis direction with respect to the end ES62. In other words, the connection surface SS61 may be inclined with respect to any of the side surface SS6 and the YZ plane in such a way that the end ES61 may be located on the negative side in the X-axis direction with respect to the end ES62 and may be located on the positive side in the Y-axis direction with respect to the end ES62.

Note that, although illustration is omitted in FIGS. 7 and 8, there is a case in which no corner portion is formed between a part of the connection surface TS21 on a side of the upper surface TS2 and a part of the upper surface TS2 on a side of the connection surface TS21 and in which the part of the connection surface TS21 on the side of the upper surface TS2 and the part of the upper surface TS2 on the side of the connection surface TS21 form the same curved surface. Also, there is a case in which no corner portion is formed between a part of the connection surface SS31 on a side of the side surface SS3 and a part of the side surface SS3 on a side of the connection surface SS31 and in which the part of the connection surface SS31 on the side of the side surface SS3 and the part of the side surface SS3 on the side of the connection surface SS31 form the same curved surface. Also, there is a case in which no corner portion is formed between a part of the connection surface SS41 on a side of the side surface SS4 and a part of the side surface SS4 on a side of the connection surface SS41 and in which the part of the connection surface SS41 on the side of the side surface SS4 and the part of the side surface SS4 on the side of the connection surface SS41 form the same curved surface.

Meanwhile, there is a case in which no corner portion is formed between a part of the connection surface TS31 on a side of the upper surface TS3 and a part of the upper surface TS3 on a side of the connection surface TS31 and in which the part of the connection surface TS31 on the side of the upper surface TS3 and the part of the upper surface TS3 on the side of the connection surface TS31 form the same curved surface. Also, there is a case in which no corner portion is formed between a part of the connection surface SS51 on a side of the side surface SS5 and a part of the side surface SS5 on a side of the connection surface SS51 and in which the part of the connection surface SS51 on the side of the side surface SS5 and the part of the side surface SS5 on the side of the connection surface SS51 form the same curved surface. Also, there is a case in which no corner portion is formed between a part of the connection surface SS61 on a side of the side surface SS6 and a part of the side surface SS6 on a side of the connection surface SS61 and in which the part of the connection surface SS61 on the side of the side surface SS6 and the part of the side surface SS6 on the side of the connection surface SS61 form the same curved surface.

Next, operations of the memory cell MC will be described. In the present embodiment, injection of electrons into the insulating film 6b made of a silicon nitride film, for example, and serving as a charge storage unit in the insulating film 6 of the memory transistor is defined as "writing," and injection of holes is defined as "erasure." Also, a power supply voltage Vdd is 1.5 V.

As a writing method, hot electron writing, called a source side injection (SSI) method can be used. In this case, a voltage Vd to be applied to the semiconductor region MD is set to be about the power supply voltage Vdd, for example, a voltage Vcg to be applied to the control gate electrode CG is set to be about 1 V, for example, and a voltage Vmg to be applied to the memory gate electrode MG is set to be about 12 V, for example. Also, a voltage Vs to be applied to the semiconductor region MS is set to be about 6 V, for example, and a voltage Vb to be applied to the p-type well PW is set to be about 0 V, for example. Then, each voltage described above is applied to each part of the memory cell MC which performs writing.

Accordingly, as illustrated by an arrow ELA1 in FIG. 7 and arrows ELA2 and ELA3 in FIG. 8, electrons EL are injected into the insulating film 6b in the gate insulating film GIm of the memory cell MC to cause data to be written in the memory cell MC.

Hot electrons are generated mainly in a part of the channel region opposed to the memory gate electrode MG via the gate insulating film GIm and are injected into the insulating film 6b serving as a charge storage unit of the gate insulating film GIm. The injected hot electrons are trapped in a trap level in the insulating film 6b in the gate insulating film GIm, and as a result, the threshold voltage of the memory transistor is increased.

As an erasing method, an erasing method of injecting holes as hot holes through use of a band-to-band tunneling (BTBT) phenomenon can be used, but an erasing method of injecting holes through use of a direct tunneling phenomenon, that is, a Fowler-Nordheim (FN) tunneling phenomenon is preferably used. In a case of using this FN tunneling phenomenon, erasure is performed by injecting holes into the charge storage unit, that is, the insulating film 6b in the gate insulating film GIm, through use of the direct tunneling phenomenon. In this case, the voltage Vd is set to be about 0 V, for example, the voltage Vcg is set to be about 0 V, for example, and the voltage Vmg is set to be about 12 V, for example, the voltage Vs is set to be about 0 V, for example, and the voltage Vb is set to be about 0 V, for example. Then, each voltage described above is applied to each part of the memory cell MC which performs erasing.

Accordingly, as illustrated by an arrow HLA1 in FIG. 7 and arrows HLA2 and HLA3 in FIG. 8, holes HL are injected into the charge storage unit, that is, into the insulating film 6b via the insulating film 6c made of, for example, a silicon oxide film, from a side of the memory gate electrode MG through use of the direct tunneling phenomenon, and electrons in the insulating film 6b are cancelled out, thereby causing data to be erased. Alternatively, holes injected into the insulating film 6b are trapped by the trapping level in the insulating film 6b, thereby causing data to be erased. Thus, the threshold voltage of the memory transistor is decreased, and the memory cell MC is put into an erasure state.

In a case of using the erasing method through use of such an FN tunneling phenomenon, consumption current can be decreased, and characteristics of a memory cell can be improved, compared to a case of using the erasing method through use of the BTBT phenomenon. Then, when a gate length of a memory gate electrode is shortened along with miniaturization of a non-volatile memory, in the case of using the erasing method through use of the FN tunneling phenomenon, the effects of decreasing the consumption current and improving the characteristics of the memory cell becomes more apparent, compared to the case of using the erasing method through use of the BTBT phenomenon.

At the time of reading, the voltage Vd is set to be about the power supply voltage Vdd, for example, the voltage Vcg is set to be about the power supply voltage Vdd, for example, and the voltage Vmg is set to be about 0 V, for example, the voltage Vs is set to be about 0 V, for example, and the voltage Vb is set to be about 0 V, for example. Each voltage is applied to each part of the memory cell MC which performs reading. By setting the voltage Vmg to be applied to the memory gate electrode MG at the time of reading to a value between the threshold voltage of the memory transistor in the writing state and the threshold voltage of the memory transistor in the erasure state, the writing state and the erasure state can be distinguished.

<Manufacturing Method of Semiconductor Device>

Figure 9:
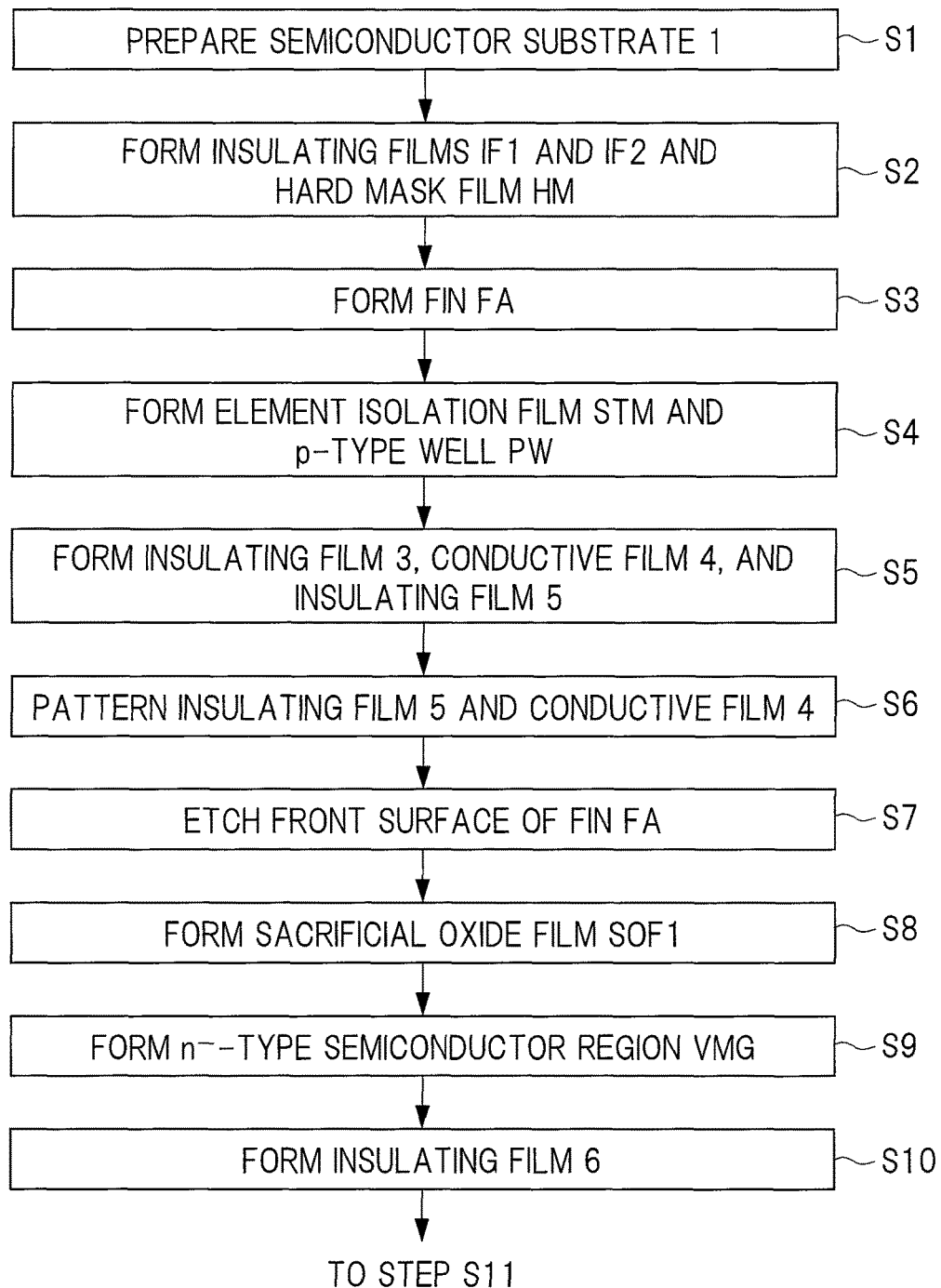
FIG. 9 is a process flowchart illustrating a part of a process for manufacturing the semiconductor device according to the embodiment.
Figure 10:
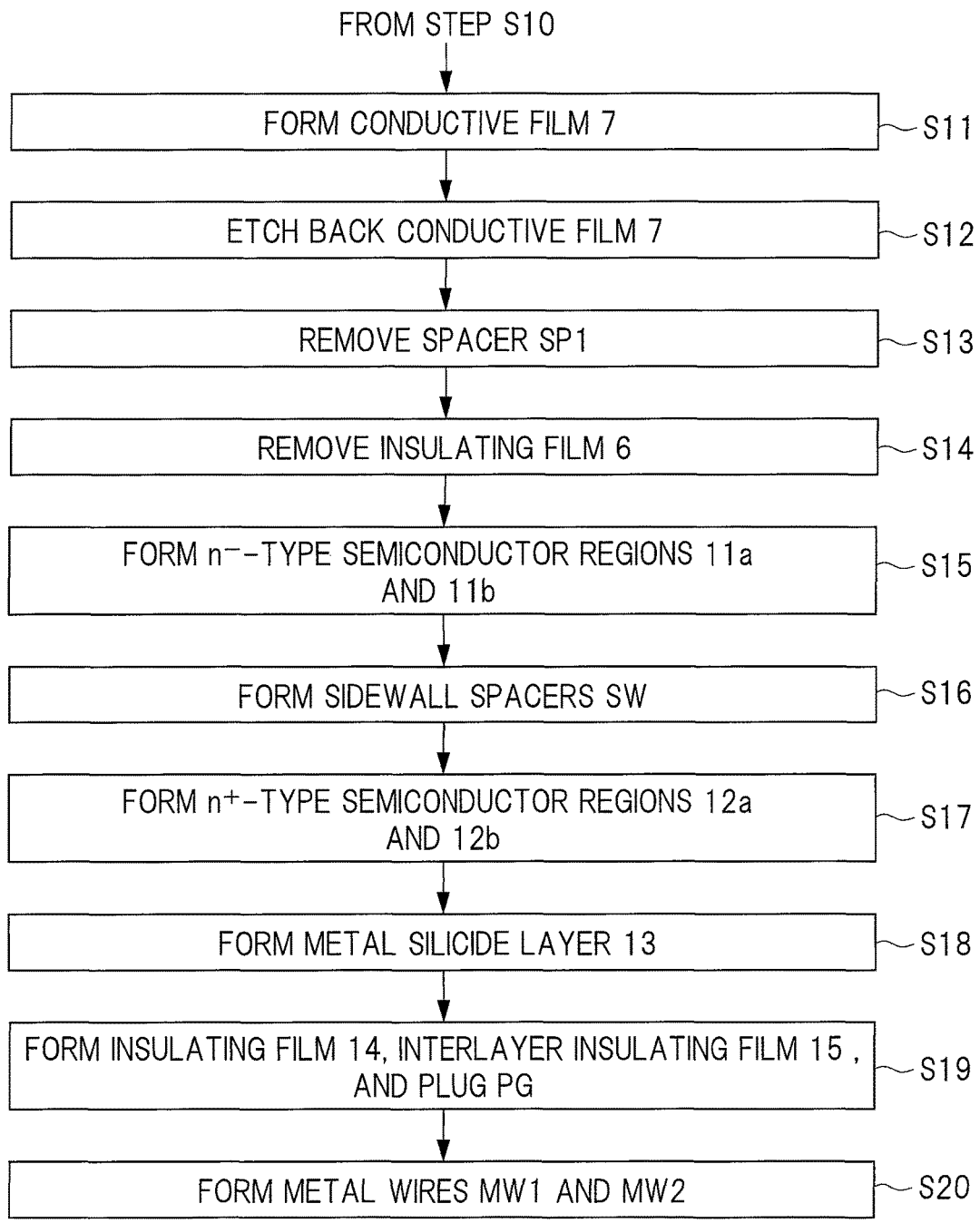
FIG. 10 is a process flowchart illustrating a part of the process for manufacturing the semiconductor device according to the embodiment.

Next, a manufacturing method of a semiconductor device according to the present embodiment will be described. FIGS. 9 and 10 are process flowcharts illustrating parts of a process for manufacturing the semiconductor device according to the embodiment. FIGS. 11 to 48 are cross-sectional views of main parts in the process for manufacturing the semiconductor device according to the embodiment.

FIGS. 11, 13, 15, 17, 19, 21, 23, 25, 27, 29, 31, 33, 35, 37, 39, 41, 43, 45, and 47 each correspond to cross-sectional views taken along the line A-A of FIG. 2, cross-sectional views taken along the line B-B of FIG. 2, and cross-sectional views taken along the line C-C of FIG. 2. FIGS. 12, 14, 16, 18, 20, 22, 24, 26, 28, 30, 32, 34, 36, 38, 40, 42, 44, 46, and 48 correspond to cross-sectional views taken along the line D-D of FIG. 5. Note that definitions of the X-axis direction, the Y-axis direction, and the Z-axis direction in FIGS. 11 to 48 are also the same as that in FIGS. 2 to 8.

FIGS. 11 to 48 are cross-sectional views illustrating a process for manufacturing the memory cells MC1 and MC2 serving as two memory cells MC illustrated in FIGS. 5 and 6. As described above, the memory cells MC1 and MC2 are arranged symmetrically with respect to the plane (YZ plane) between the memory cell MC1 and the memory cell MC2, as a symmetry plane. In the following, a process for manufacturing the memory cell MC1, of the two memory cells MC1 and MC2, will mainly be described.

Also, in the present embodiment, description will be given of a case in which an n-channel control transistor CT and an n-channel memory transistor MT are formed. However, the conductivity type may be reversed, and a p-channel control transistor CT and a p-channel memory transistor MT may be formed.

Figure 11:
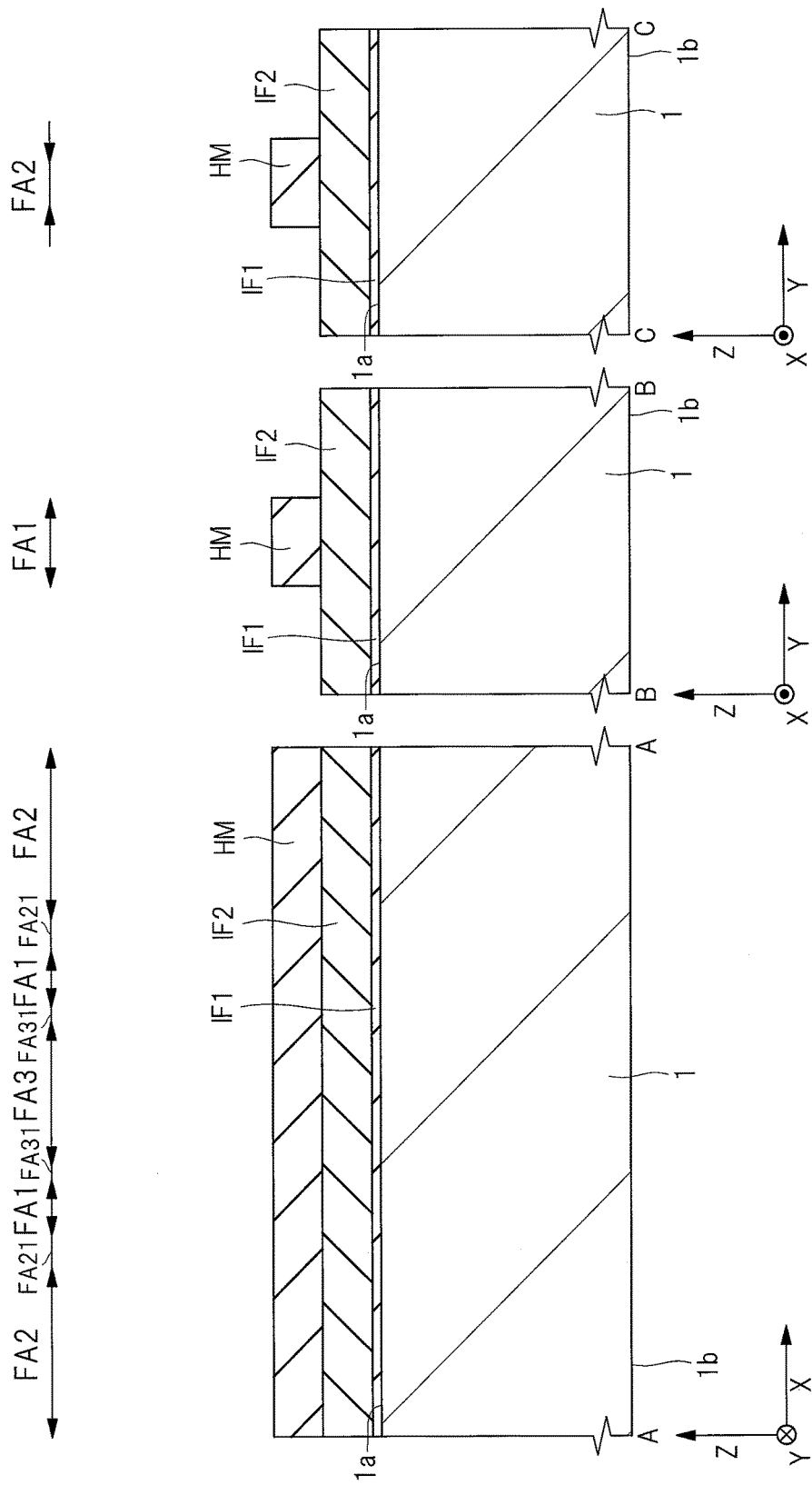
FIG. 11 is a cross-sectional view of a main part in the process for manufacturing the semiconductor device according to the embodiment.

First, as illustrated in FIGS. 11 and 12, the semiconductor substrate 1 is prepared (step S1 in FIG. 9). In this step S1, the semiconductor substrate 1 serving as a semiconductor wafer having a specific resistance of, for example, about 1 to 10 Ωcm and made of p-type single-crystal silicon or the like is prepared. The semiconductor substrate 1 includes the main surface 1a and the main surface 1b on the opposite side to the main surface 1a. Note that, in FIGS. 11 and 12, a region of the semiconductor substrate 1 in which the regions FA1, FA2, FA21, FA3, and FA31 of the fin FA are formed is illustrated.

Subsequently, insulating films IF1 and IF2 and a hard mask film HM are formed (step S2 in FIG. 9).

In this step S2, the insulating films IF1 and IF2 are first deposited on the semiconductor substrate 1 as illustrated in FIGS. 11 and 12. The insulating film IF1 is made of a silicon oxide film, for example, and the insulating film IF2 is made of a silicon nitride film, for example.

In this step S2, a mask film (not illustrated) made of, for example, an amorphous silicon film is then formed on the insulating film IF2, a silicon oxide film, for example, is deposited to cover the mask film, and the silicon oxide film is thereafter subjected to anisotropic dry etching to form the hard mask film HM on sidewalls of the mask film as illustrated in FIGS. 11 and 12. A width of the hard mask film HM in the Y-axis direction can be set to be about 10 to 30 nm (corresponding to the aforementioned width WD1), for example. After the hard mask film HM is formed, the mask film (not illustrated) is removed.

Figure 13:
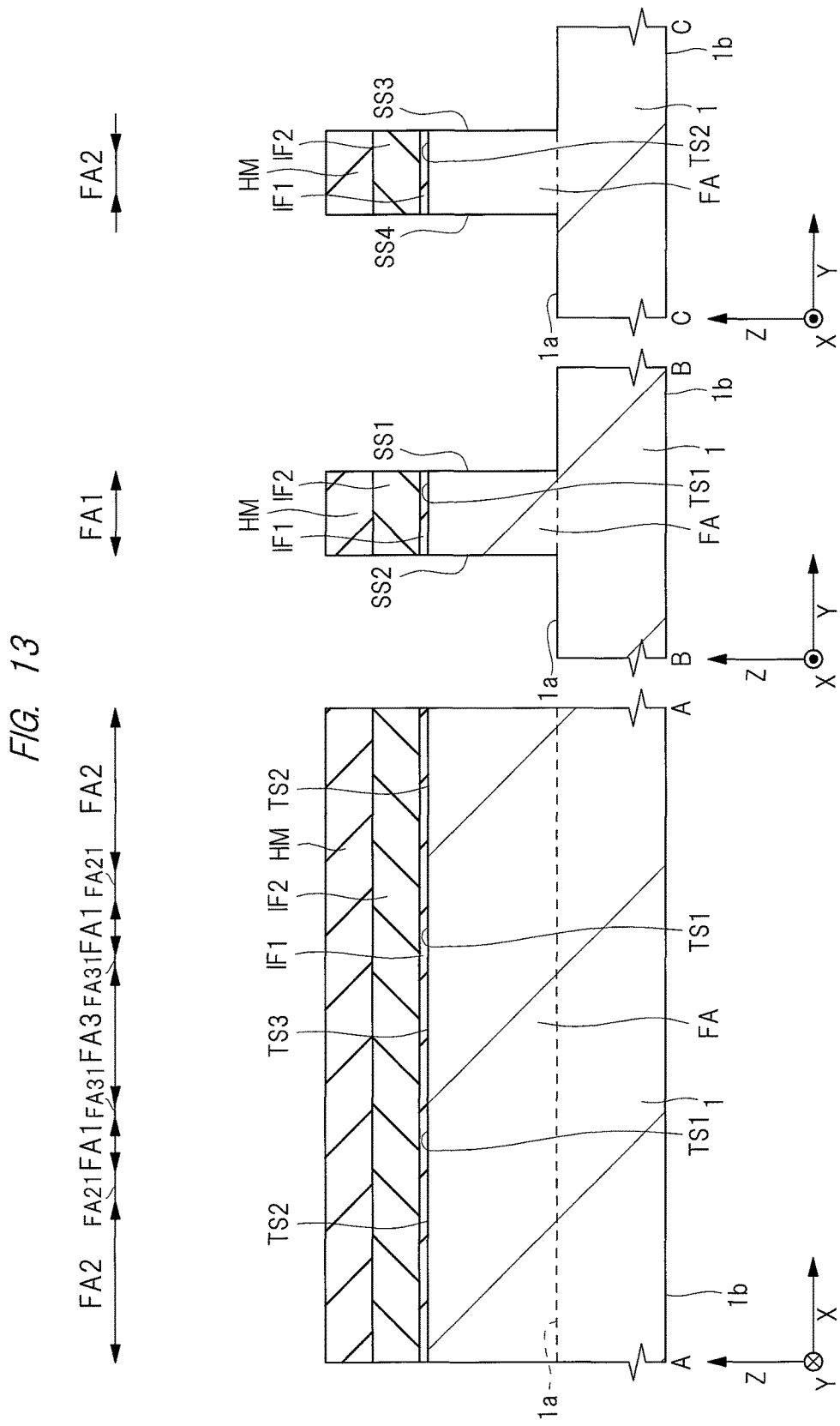
FIG. 13 is a cross-sectional view of a main part in the process for manufacturing the semiconductor device according to the embodiment.
Figure 14:
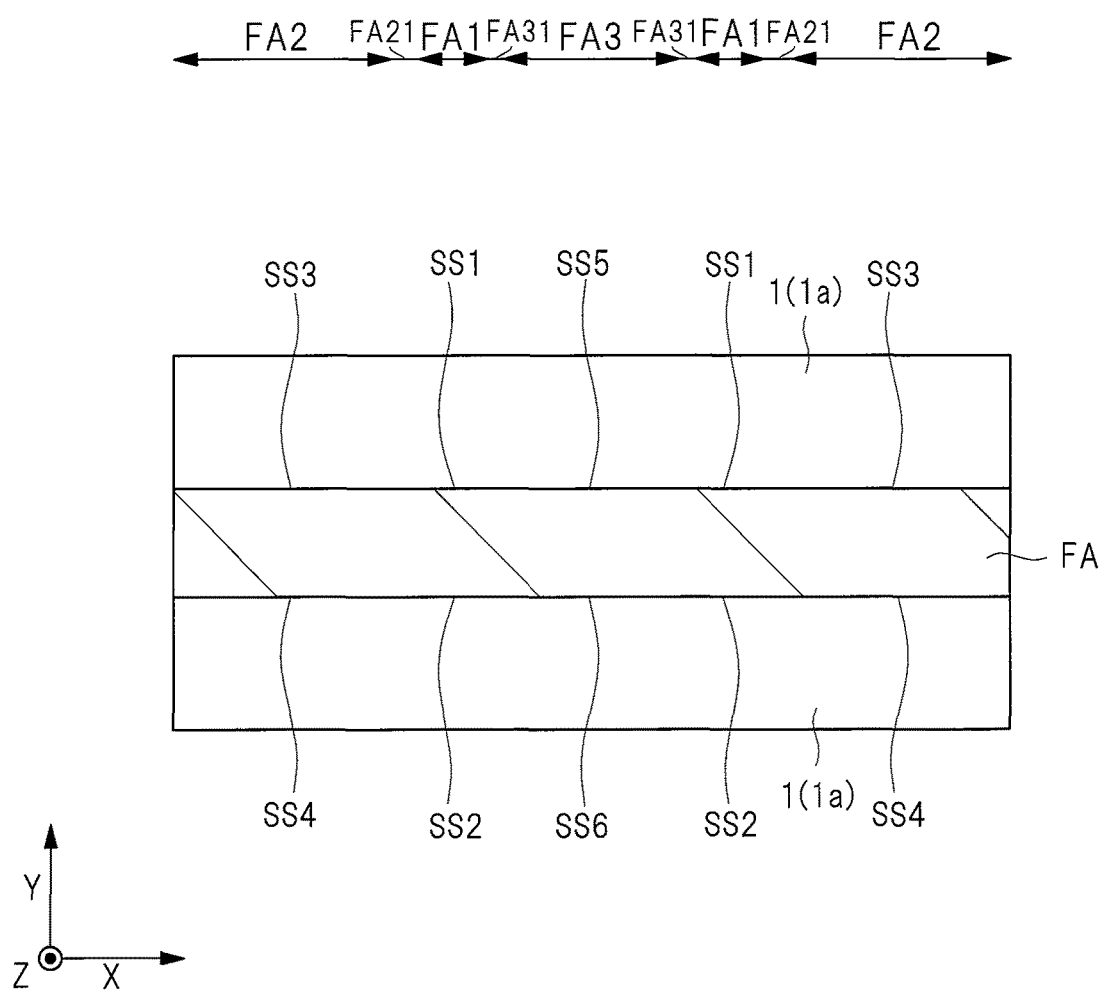
FIG. 14 is a cross-sectional view of a main part in the process for manufacturing the semiconductor device according to the embodiment.

Subsequently, the fin FA is formed as illustrated in FIGS. 13 and 14 (step S3 in FIG. 9).

In this step S3, with use of the hard mask film HM as a mask, the insulating films IF2 and IF1 and the semiconductor substrate 1 are subjected to anisotropic dry etching to form the insulating films IF2 and IF1 to which the shape of the hard mask film HM has been transferred when seen in a plan view, and the fin FA. In this case, by etching a part of the semiconductor substrate 1 exposed from the hard mask film HM and digging down the main surface 1a of the semiconductor substrate 1, the fin FA, which is a part of the semiconductor substrate 1 and which is a projecting portion projected from the main surface 1a of the semiconductor substrate 1, can be formed. The fin FA extends in the X-axis direction, for example. After the fin FA is formed, the hard mask film HM is removed.

A part of the fin FA in which one memory cell MC is formed includes the region FA1, the region FA2, and the region FA3. In the part of the fin FA in which the memory cell MC1 is formed (see FIG. 45 described below), the region FA2 is arranged on the positive side in the X-axis direction with respect to the region FA1 and is adjacent to the region FA1 when seen in a plan view. Also, in the part of the fin FA in which the memory cell MC1 is formed (see FIG. 45 described below), the region FA3 is arranged on the negative side in the X-axis direction with respect to the region FA1, that is, on the opposite side of the positive side in the X-axis direction, and is adjacent to the region FA1, when seen in a plan view.

As illustrated in FIGS. 13 and 14, the upper surface of the region FA1 is referred to as the upper surface TS1, the side surface of the region FA1 on the positive side in the Y-axis direction is referred to as the side surface SS1, and the side surface of the region FA1 on the negative side in the Y-axis direction, that is, on the opposite side of the positive side in the Y-axis direction, is referred to as the side surface SS2. The upper surface of the region FA2 is referred to as the upper surface TS2, the side surface of the region FA2 on the positive side in the Y-axis direction is referred to as the side surface SS3, and the side surface of the region FA2 on the negative side in the Y-axis direction is referred to as the side surface SS4. The upper surface of the region FA3 is referred to as the upper surface TS3, the side surface of the region FA3 on the positive side in the Y-axis direction is referred to as the side surface SS5, and the side surface of the region FA3 on the negative side in the Y-axis direction is referred to as the side surface SS6. Note that, in FIGS. 15 to 48, illustration of reference characters of the upper surfaces TS1, TS2, and TS3, and the side surfaces SS1, SS2, SS3, SS4, SS5, and SS6 is omitted in some cases as needed for simplification of the drawings.

Subsequently, the element isolation film STM and the p-type well PW are formed (step S4 in FIG. 9).

Figure 15:
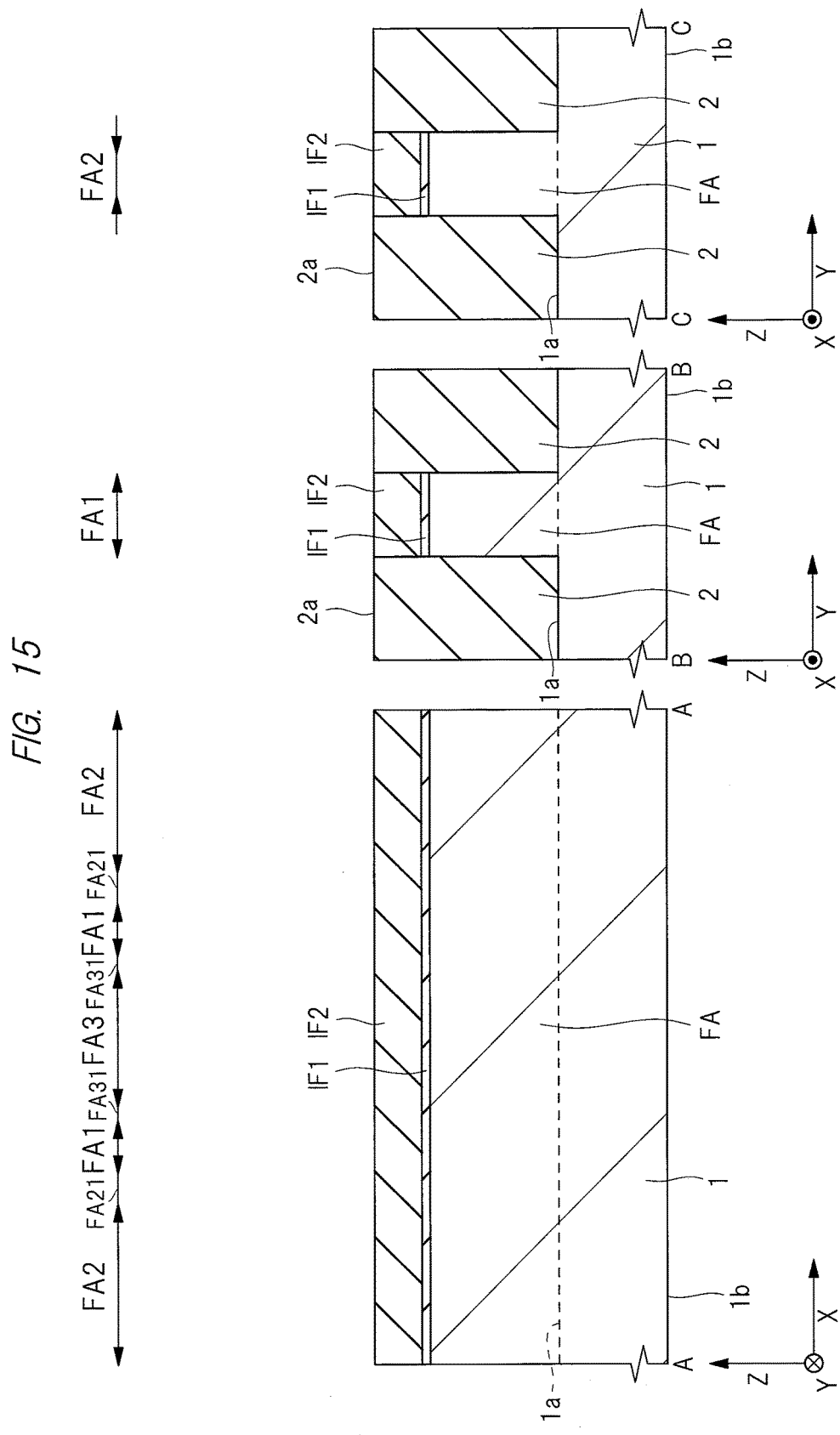
FIG. 15 is a cross-sectional view of a main part in the process for manufacturing the semiconductor device according to the embodiment.
Figure 16:
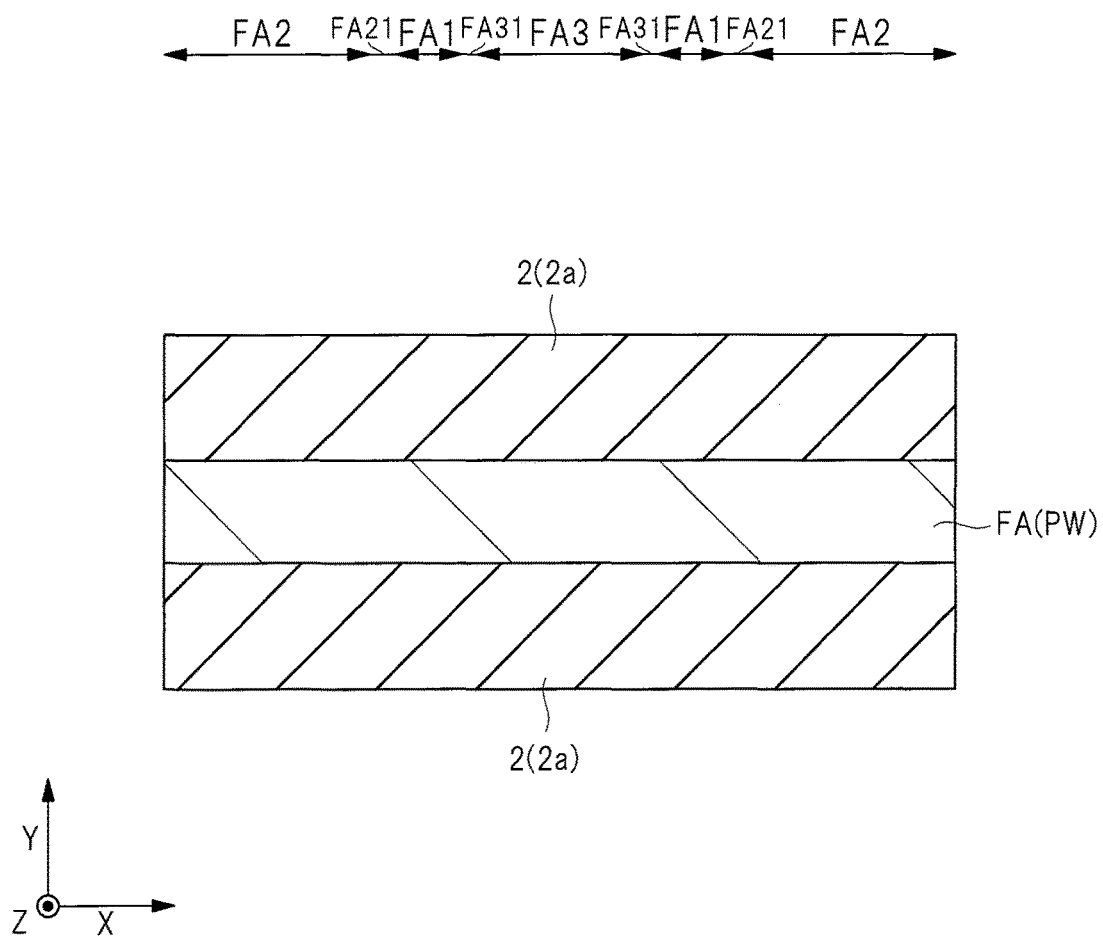
FIG. 16 is a cross-sectional view of a main part in the process for manufacturing the semiconductor device according to the embodiment.

In this step S4, an insulating film made of a silicon oxide film or the like is first deposited on the semiconductor substrate 1 to completely bury the fin FA and the insulating films IF1 and IF2 and is subjected to CMP (chemical mechanical polishing) to expose the insulating film IF2 as illustrated in FIGS. 15 and 16. Accordingly, an insulating film 2 having a flat main surface 2a is formed on the main surface 1a of the semiconductor substrate 1.

Figure 17:
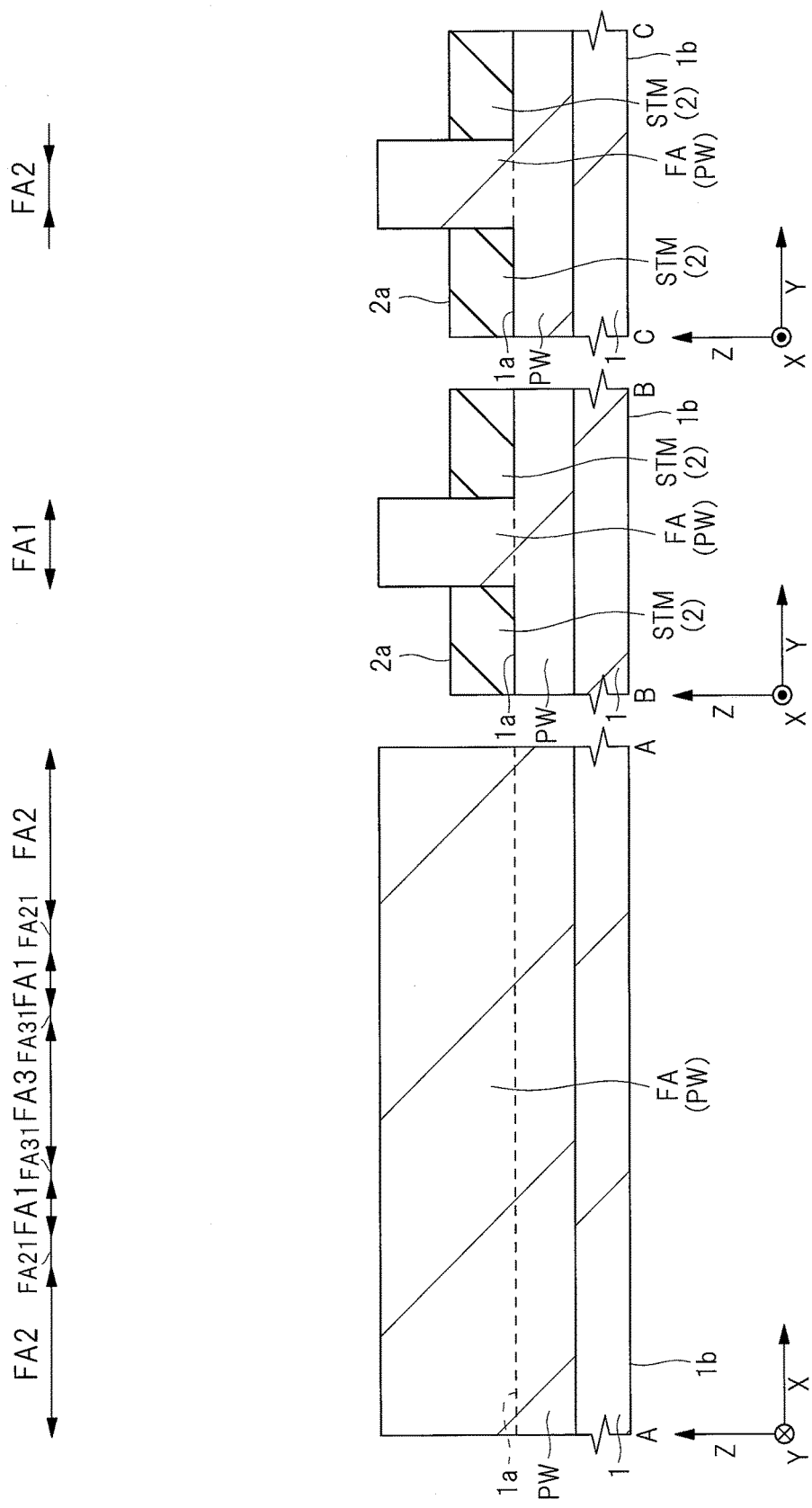
FIG. 17 is a cross-sectional view of a main part in the process for manufacturing the semiconductor device according to the embodiment.
Figure 18:
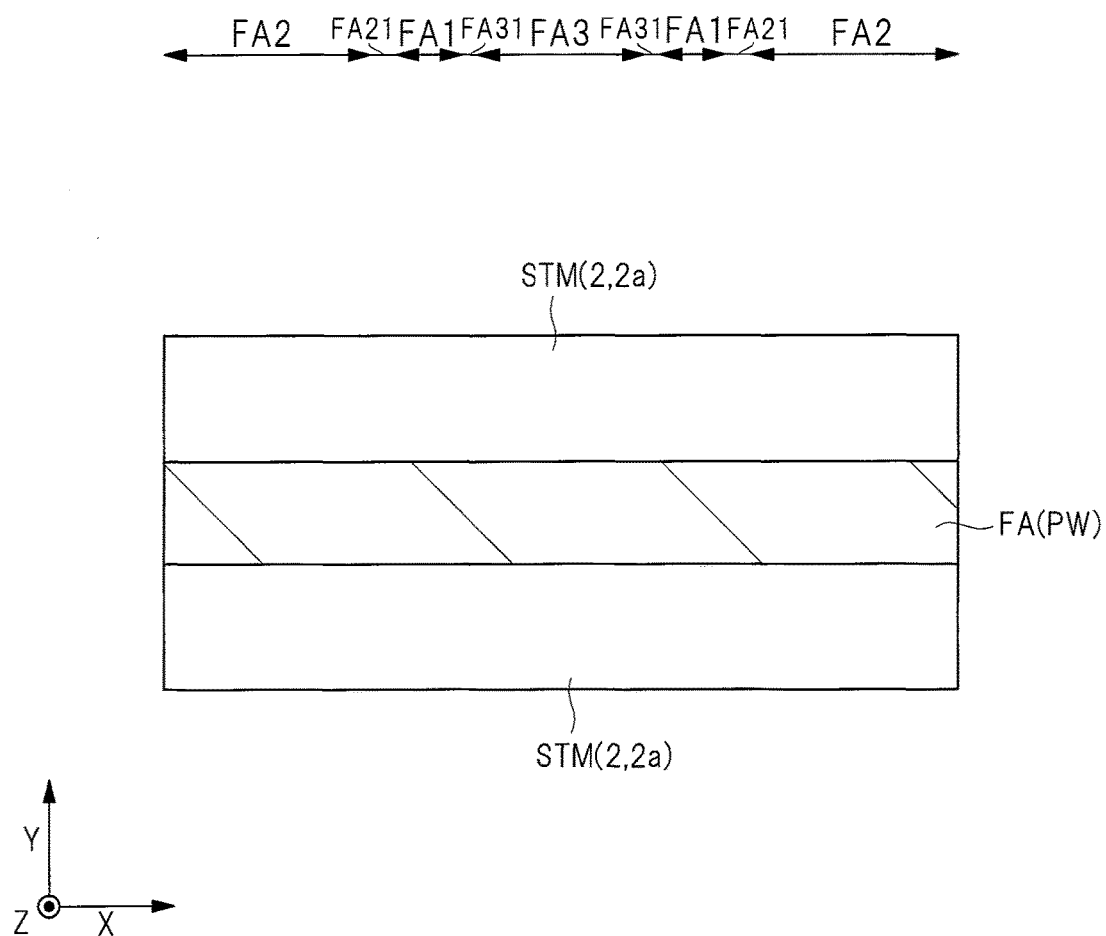
FIG. 18 is a cross-sectional view of a main part in the process for manufacturing the semiconductor device according to the embodiment.

In this step S4, the insulating films IF2 and IF1 are then removed as illustrated in FIGS. 17 and 18.

In this step S4, p-type impurities such as boron (B) are then doped into the fin FA and the semiconductor substrate 1 by ion implantation or the like to enable formation of the p-type well PW in the fin FA and the semiconductor substrate 1 as illustrated in FIGS. 17 and 18. The p-type well PW is formed over the entire fin FA and is formed from the main surface 1a of the semiconductor substrate 1 to a predetermined depth.

In this step S4, the insulating film 2 is then subjected to etching to recede (lower) the main surface 2a of the insulating film 2 in a height direction and to expose partial side surfaces and an upper surface of the fin FA as illustrated in FIGS. 17 and 18. Accordingly, the element isolation film STM including the insulating film 2 is formed.

As for apart of the fin FA projected from the element isolation film STM, a width in the Y-axis direction can be set to be about 10 to 30 nm (corresponding to the aforementioned width WD1), for example, and the height in the Z-axis direction can be set to be about 30 to 50 nm, for example.

Subsequently, the insulating film 3, the conductive film 4, and the insulating film 5 are formed (step S5 in FIG. 9).

Figure 19:
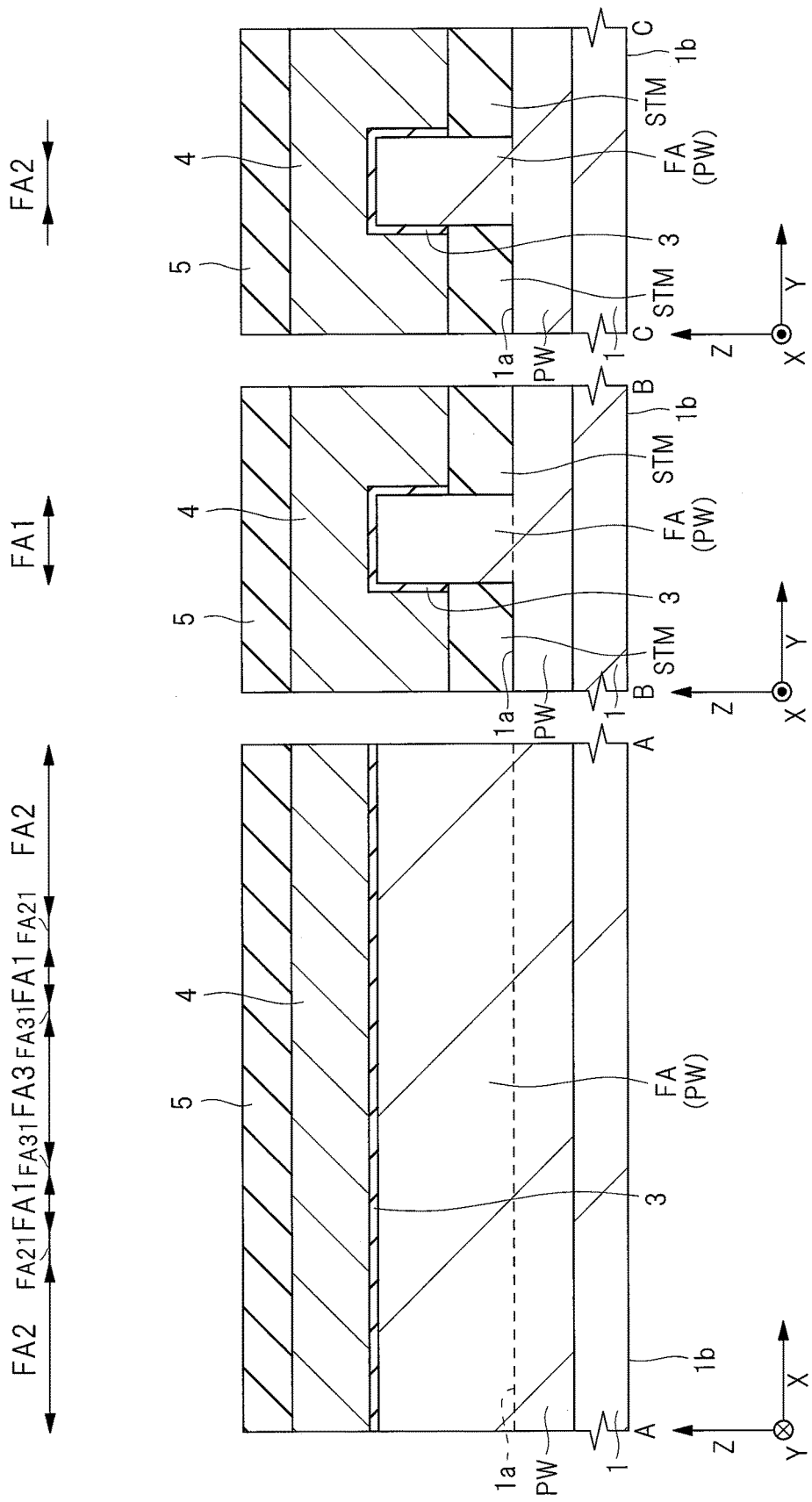
FIG. 19 is a cross-sectional view of a main part in the process for manufacturing the semiconductor device according to the embodiment.
Figure 20:
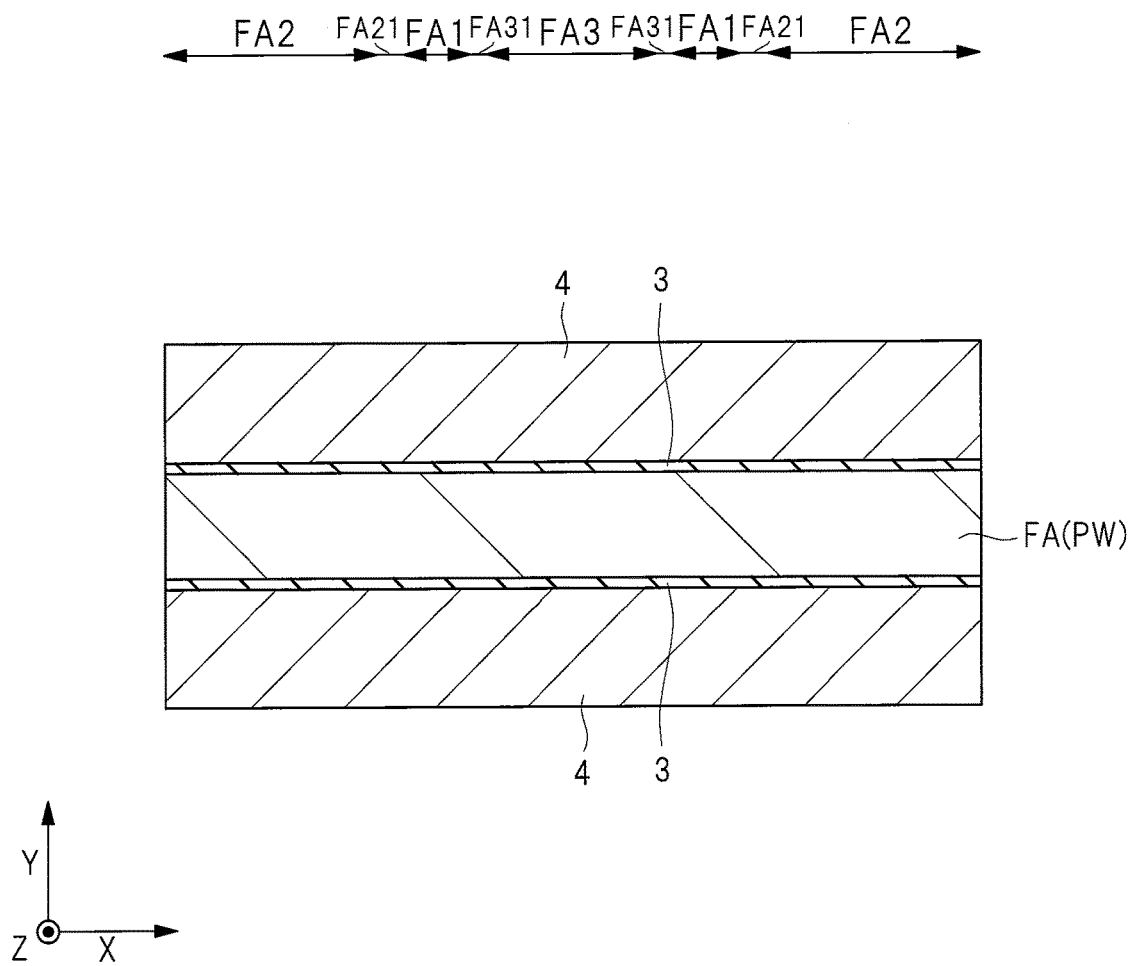
FIG. 20 is a cross-sectional view of a main part in the process for manufacturing the semiconductor device according to the embodiment.

In this step S5, the insulating film 3 is first formed on the element isolation film STM and the fin FA as illustrated in FIGS. 19 and 20. As described above, as the insulating film 3, the silicon oxide film, the silicon nitride film, or the silicon oxynitride film, or the High-k film, that is, the high dielectric constant film can be used. Examples of the material that can be used for the insulating film 3 are as described above. Also, the insulating film 3 can be formed by thermal oxidation, sputtering, the atomic layer deposition (ALD), the chemical vapor deposition (CVD), or the like. Also, a thickness of the insulating film 3 can be set to be about 2 nm, for example.

In this step S5, the conductive film 4 having a film thickness equal to or larger than the height of the fin FA in the Z-axis direction is then deposited on the element isolation film STM and the fin FA to cover the insulating film 3, and the deposited conductive film 4 is subjected to CMP, thereby forming the conductive film 4 having a flat upper surface, as illustrated in FIGS. 19 and 20. Note that, in the CMP process for the conductive film 4, the conductive film 4 needs to remain on the upper surface of the fin FA.

The conductive film 4 is preferably a polycrystalline silicon film, that is, a silicon film such as a polysilicon film. Such a conductive film 4 can be formed by the CVD or the like. Alternatively, the conductive film 4 can be formed as an amorphous silicon film at the time of film formation, and then, the amorphous silicon film can also be changed into a polycrystalline silicon film by subsequent thermal treatment.

As the conductive film 4, one into which n-type impurities such as phosphorus (P) and arsenic (As) or p-type impurities such as boron (B) are doped to have low resistivity is preferably used. The impurities can be doped at the time of or after formation of the conductive film 4. In a case of doping the impurities at the time of formation of the conductive film 4, the conductive film 4 into which the impurities has been doped can be formed by mixing gas for formation of the conductive film 4 with doping gas. In contrast, in a case of doping the impurities after formation of the silicon film, the conductive film 4 into which the impurities has been doped can be formed by forming the silicon film without purposely doping the impurities and then doping the impurities into this silicon film by ion implantation or the like.

In this step S5, the insulating film 5 made of, for example, a silicon nitride film is formed on the conductive film 4 by the CVD or the like, for example, as illustrated in FIGS. 19 and 20.

Figure 21:
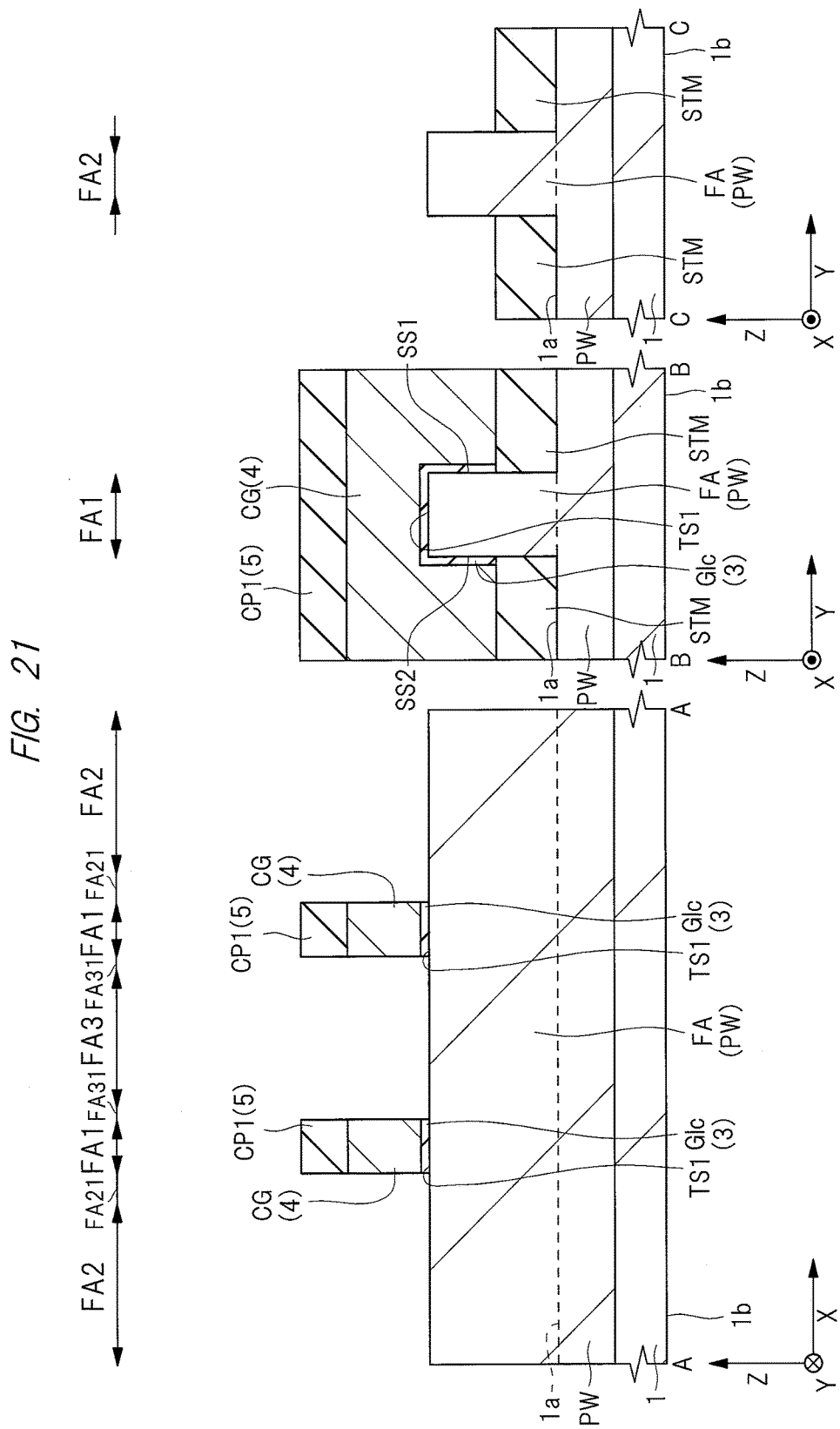
FIG. 21 is a cross-sectional view of a main part in the process for manufacturing the semiconductor device according to the embodiment.
Figure 22:
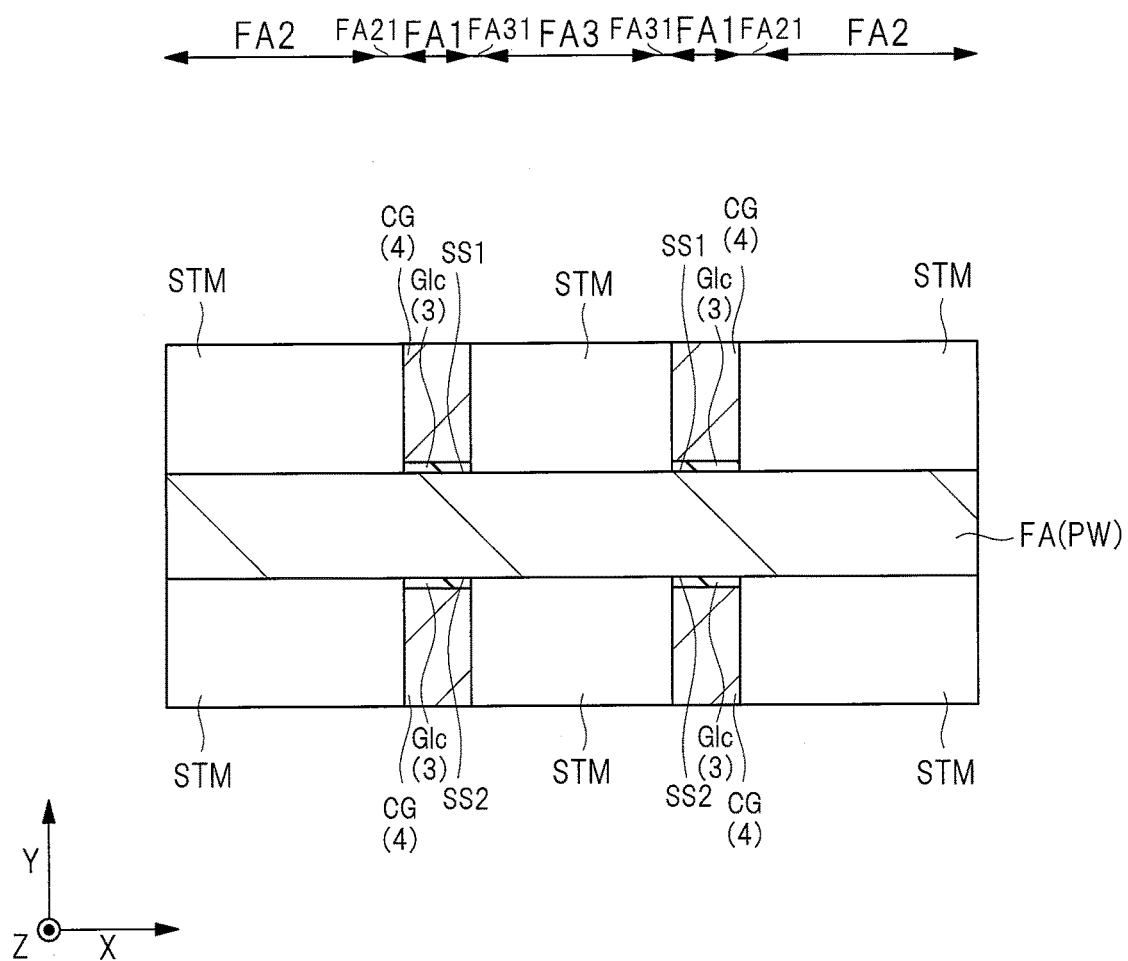
FIG. 22 is a cross-sectional view of a main part in the process for manufacturing the semiconductor device according to the embodiment.

Subsequently, the insulating film 5 and the conductive film 4 are patterned as illustrated in FIGS. 21 and 22 (step S6 in FIG. 9). In this step S6, the insulating film 5 and the conductive film 4 are patterned by, for example, photolithography and etching.

A resist film (not illustrated) is first formed on the insulating film 5. Then, an opening portion penetrating the resist film and reaching the insulating film 5 is formed in a region other than a region in which the control gate electrode CG is to be formed, to form a resist pattern (not illustrated) made of the resist film in which the opening portion is formed. In this case, a part of the insulating film 5 arranged in the region in which the control gate electrode CG is to be formed is covered with the resist film.

With use of the resist pattern as an etching mask, the insulating film 5 and the conductive film 4 are then etched and patterned by, for example, dry etching or the like. Accordingly, the control gate electrode CG including the conductive film 4 and extending in the Y-axis direction when seen in a plan view and the gate insulating film GIc including the insulating film 3 between the control gate electrode CG and the fin FA are formed on the element isolation film STM and the fin FA.

Specifically, the control gate electrode CG covering the upper surface TS1 of the region FA1, the side surface SS1 of the region FA1, and the side surface SS2 of the region FA1 and including the conductive film 4 is formed. Also, the gate insulating film GIc including the insulating film 3 between the control gate electrode CG and the upper surface TS1 of the region FA1, between the control gate electrode CG and the side surface SS1 of the region FA1, and between the control gate electrode CG and the side surface SS2 of the region FA1 is formed.

Also, the cap insulating film CP1 including the insulating film 5 on the control gate electrode CG is formed. Thereafter, the resist pattern, that is, the resist film is removed.

Subsequently, the front surface of the fin FA is etched (step S7 in FIG. 9). In this step S7, the front surface of the region FA2 in the fin FA is etched by isotropic dry etching with use of the control gate electrode CG, the cap insulating film CP1 on the control gate electrode CG, and the mask pattern as etching masks.

Figure 23:
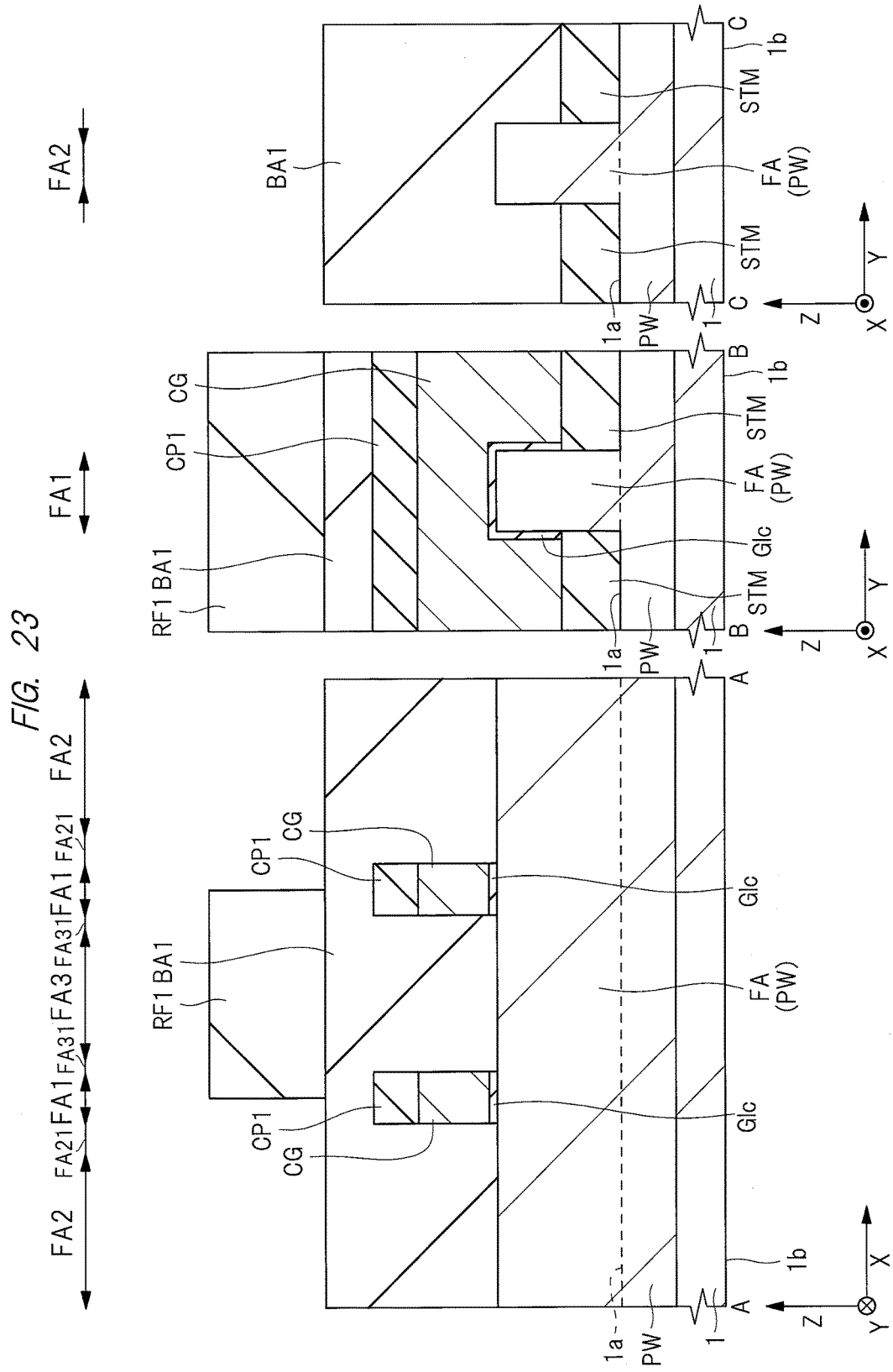
FIG. 23 is a cross-sectional view of a main part in the process for manufacturing the semiconductor device according to the embodiment.
Figure 24:
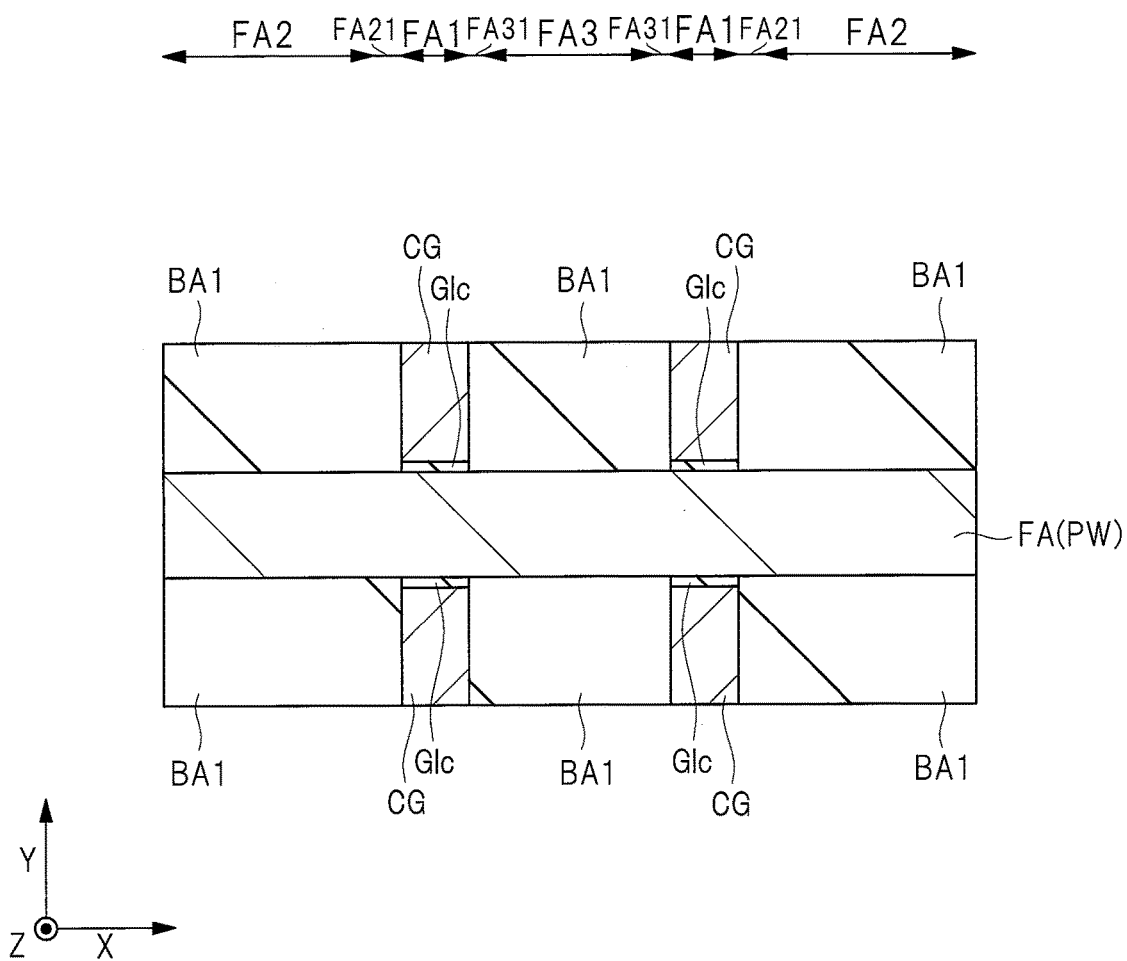
FIG. 24 is a cross-sectional view of a main part in the process for manufacturing the semiconductor device according to the embodiment.

In this step S7, an antireflective film BA1 made of, for example, an organic film is first formed on the element isolation film STM and the fin FA to cover the control gate electrode CG and the cap insulating film CP1, and a resist film RF1 is formed on the antireflective film BA1, as illustrated in FIGS. 23 and 24. In this manner, the antireflective film BA1 formed between the resist film RF1, and the element isolation film STM and the fin FA, is referred to as BARC (bottom antireflective coating). The resist film RF1 is then patterned.

In a pair of the two adjacent control gate electrodes CG, the memory gate electrode MG (see FIGS. 33 and 34 described below) adjacent to the other control gate electrode CG on an opposite side to one control gate electrode CG with the other control gate electrode CG interposed therebetween is arranged. Thus, in this step, the resist film RF1 is patterned in such a way that a part of the antireflective film BA1 located between the two adjacent control gate electrodes CG may be covered with the resist film RF1 and that a part of the antireflective film BA1 located on the opposite side to one control gate electrode CG with the other control gate electrode CG interposed therebetween may be exposed from the resist film RF1.

Figure 25:
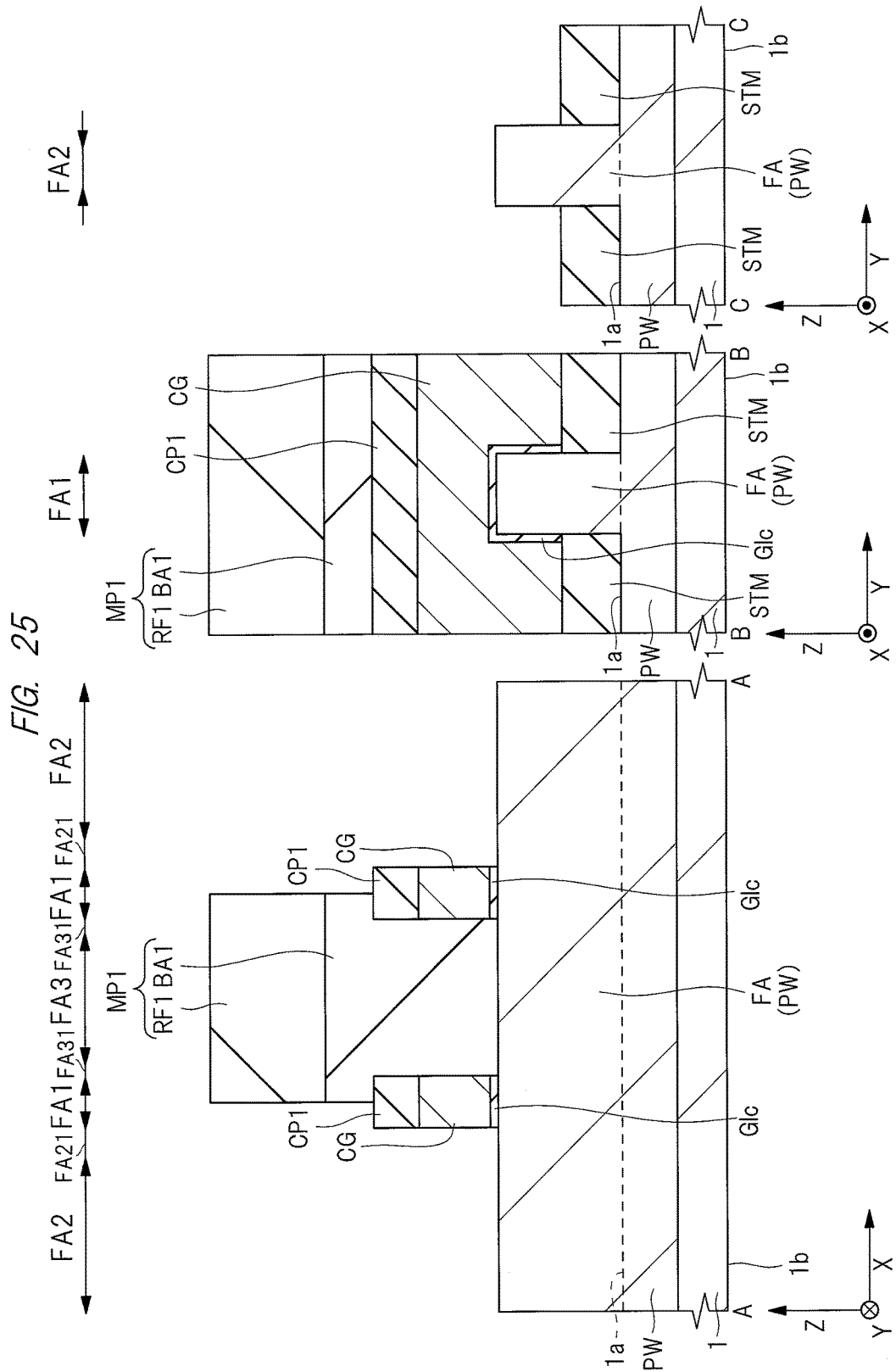
FIG. 25 is a cross-sectional view of a main part in the process for manufacturing the semiconductor device according to the embodiment.
Figure 26:
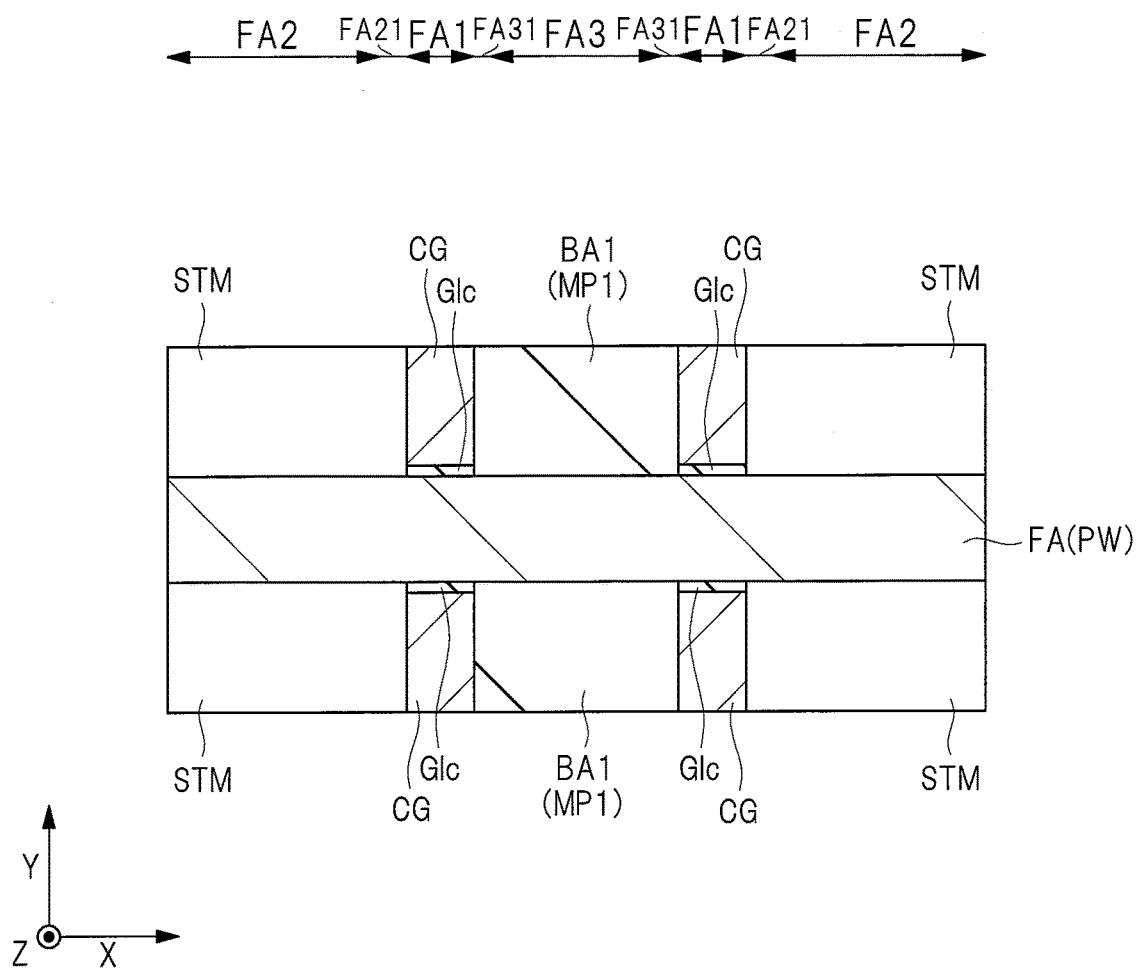
FIG. 26 is a cross-sectional view of a main part in the process for manufacturing the semiconductor device according to the embodiment.

In this step S7, with use of the patterned resist film RF1 as an etching mask, the antireflective film BA1 is then patterned by dry etching through use of mixed gas of, for example, fluorocarbon gas, argon (Ar) gas, and oxygen ($O_2$) gas as etching gas, as illustrated in FIGS. 25 and 26. Thus, a mask pattern MP1 including the part of the antireflective film BA1 located between the two adjacent control gate electrodes CG and a part of the resist film RF1 located between the two adjacent control gate electrodes CG is formed.

Figure 27:
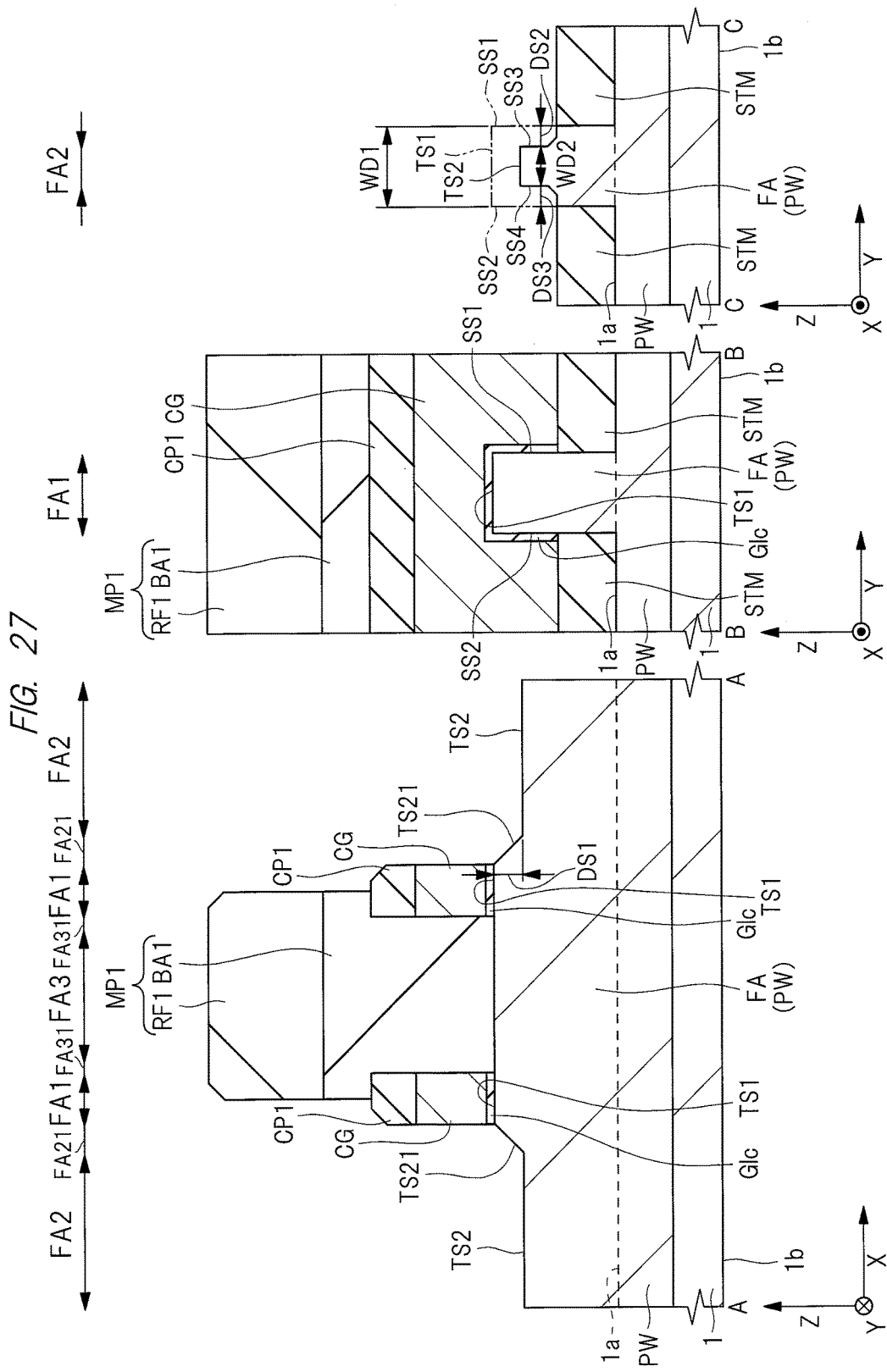
FIG. 27 is a cross-sectional view of a main part in the process for manufacturing the semiconductor device according to the embodiment.
Figure 28:
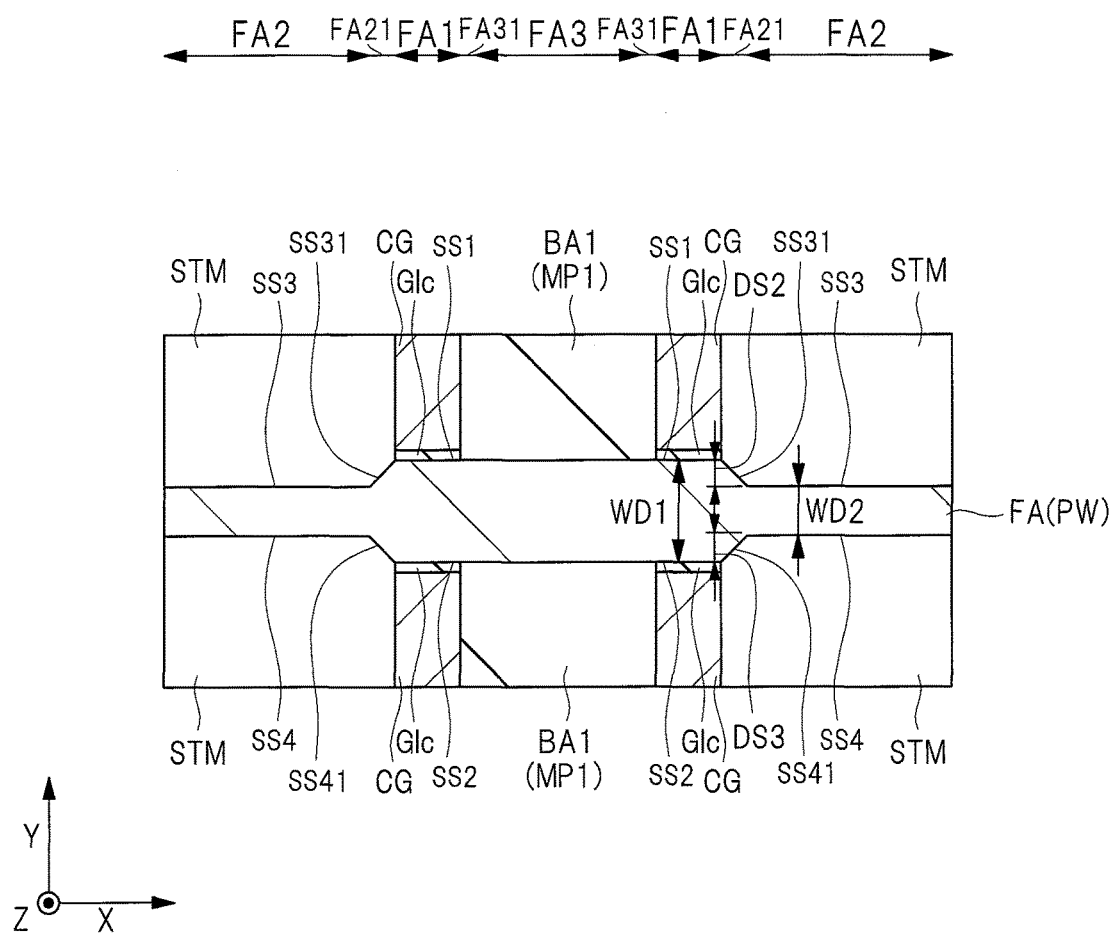
FIG. 28 is a cross-sectional view of a main part in the process for manufacturing the semiconductor device according to the embodiment.

In this step S7, a front surface of the fin FA in the region FA2 is then etched by isotropic dry etching with use of the control gate electrode CG, the cap insulating film CP1 on the control gate electrode CG, and the mask pattern MP1 as etching masks as illustrated in FIGS. 27 and 28.

Thus, the upper surface TS2 of the region FA2 becomes lower than the upper surface TS1 of the region FA1, and the side surface SS3 of the region FA2 recedes to the negative side in the Y-axis direction with respect to the side surface SS1 of the region FA1, that is, to the opposite side of the positive side in the Y-axis direction.

Thus, in the part of the gate insulating film GIm (see FIGS. 39 and 40 described below) between the memory gate electrode MG (see FIGS. 33 and 34 described below) and the upper surface TS2 and in the part of the gate insulating film GIm between the memory gate electrode MG and the side surface SS3, the distribution of electrons injected at the time of writing data and the distribution of holes injected at the time of erasing data get close to each other.

Preferably, the upper surface TS2 becomes lower than the upper surface TS1, and the side surface SS3 recedes to the negative side in the Y-axis direction with respect to the side surface SS1 in such a way that the distance DS1 between the upper surface TS2 of the region FA2 and the upper surface TS1 of the region FA1 in the Z-axis direction may be longer than the distance DS2 between the side surface SS3 of the region FA2 and the side surface SS1 of the region FA1 in the Y-axis direction. Accordingly, the effect of bringing the distribution of electrons injected at the time of writing data closer to the distribution of holes injected at the time of erasing data can be enhanced.

Further, the side surface SS4 of the region FA2 recedes to the positive side in the Y-axis direction with respect to the side surface SS2 of the region FA1 in the Y-axis direction. In this case, the width WD2 in the Y-axis direction in the region FA2 is smaller than the width WD1 in the Y-axis direction in the region FA1. Accordingly, also in the part of the gate insulating film GIm (see FIGS. 39 and 40 described below) between the memory gate electrode MG (see FIGS. 33 and 34 described below) and the side surface SS4, the distribution of electrons injected at the time of writing data and the distribution of holes injected at the time of erasing data get close to each other.

Preferably, the upper surface TS2 becomes lower than the upper surface TS1, and the side surface SS4 recedes to the positive side in the Y-axis direction with respect to the side surface SS2 in such a way that the distance DS1 between the upper surface TS2 of the region FA2 and the upper surface TS1 of the region FA1 in the Z-axis direction may be longer than the distance DS3 between the side surface SS4 of the region FA2 and the side surface SS2 of the region FA1 in the Y-axis direction. That is, the upper surface TS2 becomes lower than the upper surface TS1, the side surface SS3 recedes with respect to the side surface SS1, and the side surface SS4 recedes with respect to the side surface SS2 in such a way that the distance DS1 may be longer than any of the distance DS2 and the distance DS3. Accordingly, the effect of bringing the distribution of electrons injected at the time of writing data closer to the distribution of holes injected at the time of erasing data can be enhanced.

The region FA21 may be formed between the region FA1 and the region FA2. In this case, preferably, the region FA21 includes the connection surface TS21 connecting the upper surface TS1 of the region FA1 to the upper surface TS2 of the region FA2, the connection surface SS31 connecting the side surface SS1 of the region FA1 to the side surface SS3 of the region FA2, and the connection surface SS41 connecting the side surface SS2 of the region FA1 to the side surface SS4 of the region FA2.

As illustrated in FIG. 7, the end ET21 of the connection surface TS21 may be connected to the upper surface TS2 of the region FA2, and the end ET22 on the opposite side of the end ET21 of the connection surface TS21 may be connected to the upper surface TS1 of the region FA1. Then, the connection surface TS21 may be inclined with respect to any of the upper surface TS2 and the YZ plane in such a way that the end ET21 may be located on the positive side in the X-axis direction with respect to the end ET22 and may be located on the lower side than the end ET22 in the Z-axis direction.

As illustrated in FIG. 8, the end ES31 of the connection surface SS31 may be connected to the side surface SS3 of the region FA2, and the end ES32 on the opposite side of the end ES31 of the connection surface SS31 may be connected to the side surface SS1 of the region FA1. Then, the connection surface SS31 may be inclined with respect to any of the side surface SS3 and the YZ plane in such a way that the end ES31 may be located on the positive side in the X-axis direction with respect to the end ES32 and may be located on the negative side in the Y-axis direction with respect to the end ES32.

As illustrated in FIG. 8, the end ES41 of the connection surface SS41 may be connected to the side surface SS4 of the region FA2, and the end ES42 on the opposite side of the end ES41 of the connection surface SS41 may be connected to the side surface SS2 of the region FA1. Then, the connection surface SS41 may be inclined with respect to any of the side surface SS4 and the YZ plane in such a way that the end ES41 may be located on the positive side in the X-axis direction with respect to the end ES42 and may be located on the positive side in the Y-axis direction with respect to the end ES42.

Accordingly, in the part of the gate insulating film GIm (see FIGS. 39 and 40 described below) between the memory gate electrode MG (see FIGS. 33 and 34 described below) and the upper surface TS2, the distribution of electrons injected at the time of writing data and the distribution of holes injected at the time of erasing data get much closer to each other or are equal to each other. Also, in the part of the gate insulating film GIm between the memory gate electrode MG and the side surface SS3, the distribution of electrons injected at the time of writing data and the distribution of holes injected at the time of erasing data get much closer to each other or are equal to each other. Also, in the part of the gate insulating film GIm between the memory gate electrode MG and the side surface SS4, the distribution of electrons injected at the time of writing data and the distribution of holes injected at the time of erasing data get much closer to each other or are equal to each other.

As for conditions for etching the region FA2 in step S7, selectivity between the cap insulating film CP1 made of the insulating film 5 such as a silicon nitride film, and the fin FA made of silicon, that is, the ratio of the etching rate of the fin FA to the etching rate of the cap insulating film CP1 is preferably as high as possible.

In the etching of the front surface of the region FA2, a process in which a deposit is deposited on the front surface and a process in which the front surface is etched are actually repeated, and when the etched amount exceeds the deposited amount, the etching advances. In this case, in the region FA21 close to an end of the control gate electrode CG, due to the presence of the side surface of the control gate electrode, the deposited amount exceeds the etched amount. As a result, in the region FA21, the connection surfaces TS21, SS31, and SS41 inclined from the end thereof on a side of the control gate electrode CG to the end thereof on a side of the region FA2, are formed. The inclination angles of these connection surfaces TS21, SS31, and SS41 can be adjusted within a certain range by changing a balance between the deposited amount and the etched amount in the etching conditions.

Note that, in step S7, in the cap insulating film CP1, a corner between an upper surface and a side surface of the cap insulating film CP1 is etched into a so-called chamfered state.

Also, in step S7, there is a case in which both side surfaces of the control gate electrode CG in the X-axis direction (gate length direction) are etched and in which the width of the control gate electrode CG in the X-axis direction becomes small, although illustration thereof is omitted. In this case, it is preferable in step S6 to pattern the insulating film 5 and the conductive film 4 (see FIG. 21) in such a way that the width of the control gate electrode CG in the X-axis direction may be larger than a desired width.

In step S7, although only isotropic etching may be performed, anisotropic etching may be performed before the isotropic etching. By performing the anisotropic etching, the front surface of the region FA2 can be etched with favorable profile accuracy in such a way that the distance DS1 may be longer than the distance DS2 and that the distance DS1 may be longer than the distance DS3. Also, by performing the isotropic etching after the anisotropic etching, a part that may be damaged by the anisotropic etching can be etched in an isotropic manner, so that the characteristics of the memory transistor MT (see FIGS. 45 and 46 described below) can be improved.

Subsequently, a sacrificial oxide film SOF1 is formed (step S8 in FIG. 9).

Figure 29:
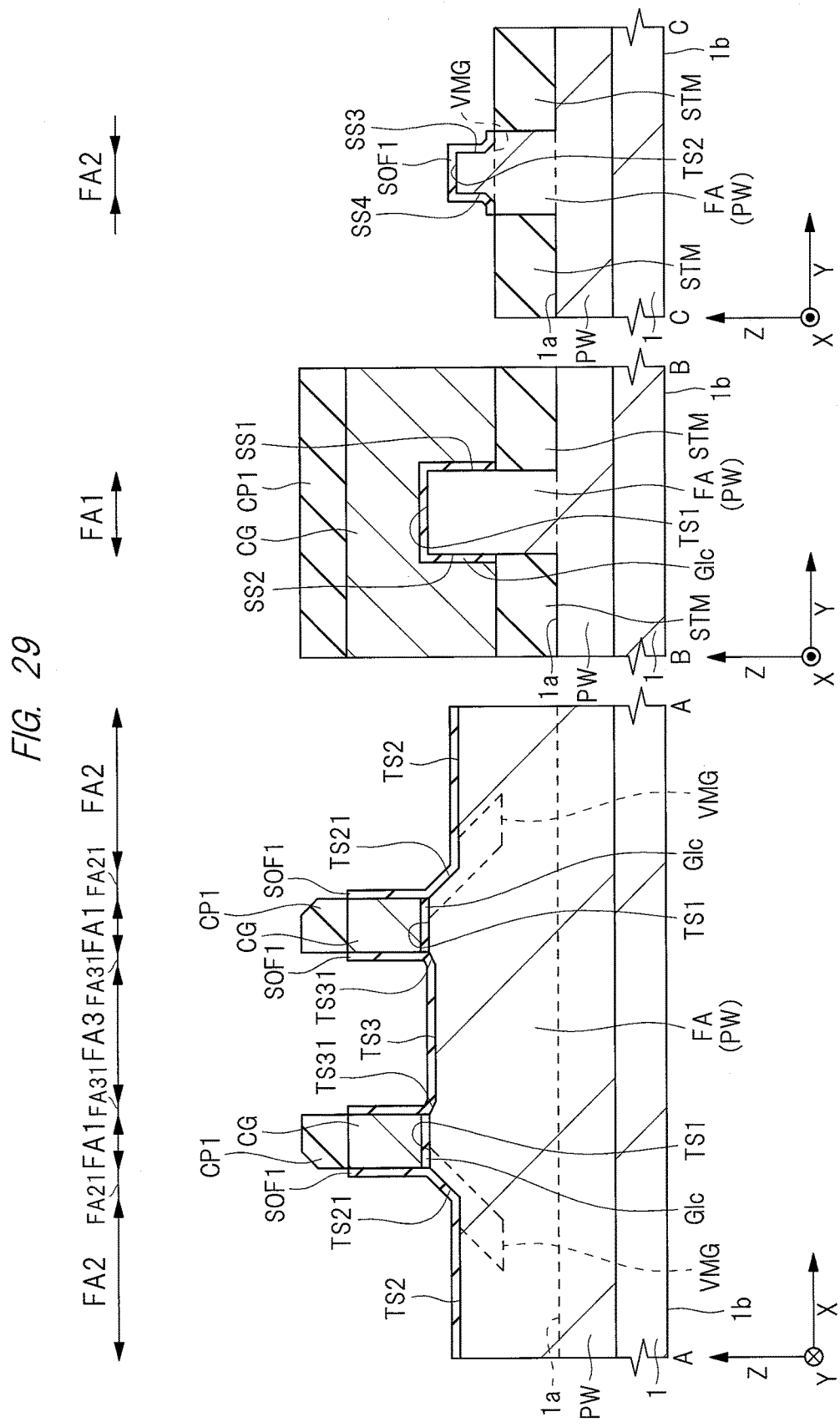
FIG. 29 is a cross-sectional view of a main part in the process for manufacturing the semiconductor device according to the embodiment.
Figure 30:
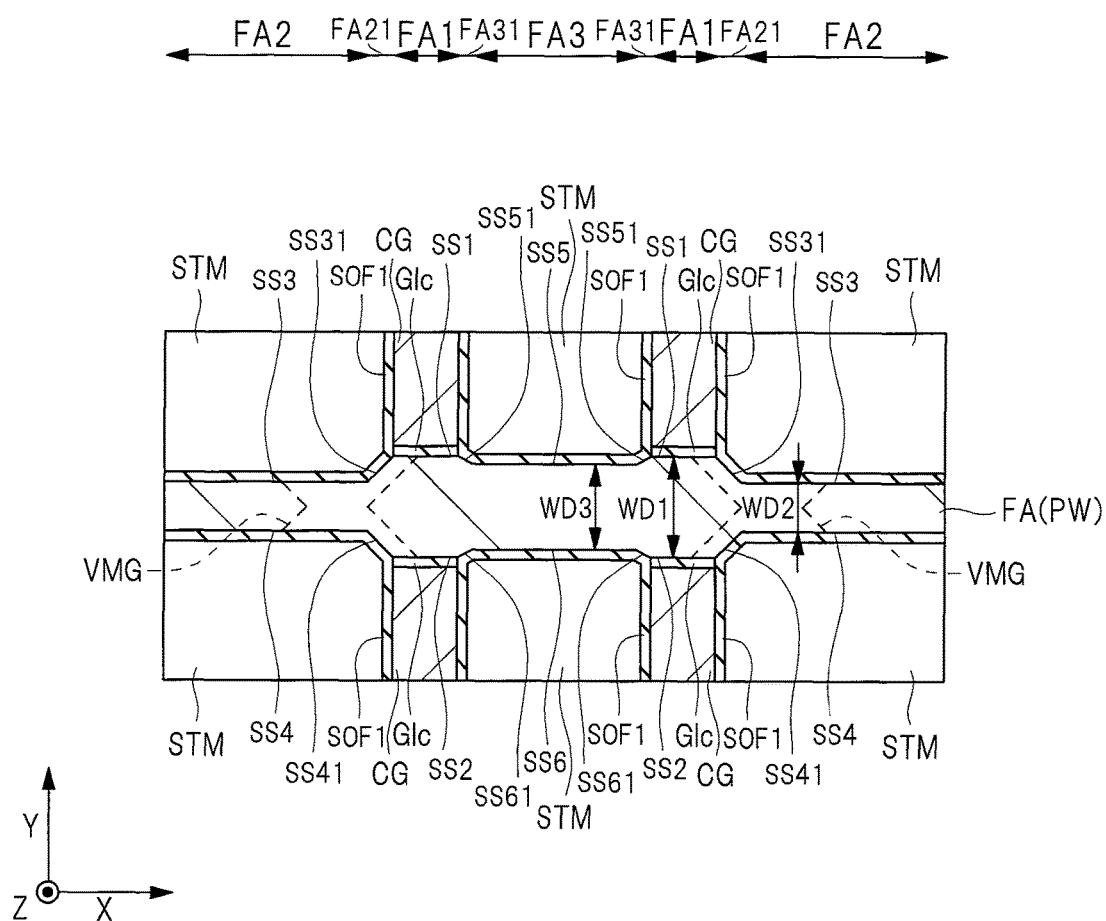
FIG. 30 is a cross-sectional view of a main part in the process for manufacturing the semiconductor device according to the embodiment.

In this step S8, the mask pattern MP1 (see FIGS. 27 and 28) including the resist film RF1 and the antireflective film BA1 is first removed as illustrated in FIGS. 29 and 30.

In this step S8, the front surface of the fin FA and the side surfaces of the control gate electrode CG are then oxidized to form the sacrificial oxide film SOF1 as illustrated in FIGS. 29 and 30. The sacrificial oxide film SOF1 is a protective film protecting the front surface of the fin FA and the side surfaces of the control gate electrode CG at the time of forming the n⁻-type semiconductor region VMG. The sacrificial oxide film SOF1 can be formed by, for example, thermal oxidation or ISSG oxidation, or combination thereof.

In this case, in the fin FA, the front surface of the region FA3 arranged on an opposite side to the region FA2 with the region FA1 interposed therebetween when seen in a plan view is oxidized. In a case in which the region FA2 is arranged on the positive side in the X-axis direction with respect to the region FA1, the region FA3 is arranged on the negative side in the X-axis direction with respect to the region FA1.

In this manner, by oxidizing the front surface of the region FA3, in step S8, the upper surface TS3 of the region FA3 becomes lower than the upper surface TS1 of the region FA1, and the side surface SS5 of the region FA3 recedes to the negative side in the Y-axis direction with respect to the side surface SS1 of the region FA1 in the Y-axis direction.

Preferably, the upper surface TS2 becomes lower in such a way that the upper surface TS3 of the region FA3 may be higher than the upper surface TS2 of the region FA2, and the side surface SS5 recedes in such a way that the side surface SS5 of the region FA3 may be arranged on the positive side in the Y-axis direction with respect to the side surface SS3 of the region FA2 in the Y-axis direction. Accordingly, the upper surface TS3 of the region FA3 and the upper surface TS1 of the region FA1 can be arranged substantially at the same height to each other, and the side surface SS5 of the region FA3 can be arranged substantially at the same position to the side surface SS1 of the region FA1 in the Y-axis direction. Thus, a decrease in on-state current flowing in the control transistor CT can be prevented or suppressed.

Further, in step S8, by oxidizing the front surface of the region FA3, the side surface SS6 of the region FA3 recedes to the positive side in the Y-axis direction with respect to the side surface SS2 of the region FA1 in the Y-axis direction. In this case, the width WD3 in the Y-axis direction in the region FA3 is smaller than the width WD1 in the Y-axis direction in the region FA1.

Preferably, the side surface SS6 recedes in such a way that the side surface SS6 of the region FA3 maybe arranged on the negative side in the Y-axis direction with respect to the side surface SS4 of the region FA2 in the Y-axis direction. In this case, the width WD3 in the Y-axis direction in the region FA3 is larger than the width WD2 in the Y-axis direction in the region FA2. Accordingly, the side surface SS6 of the region FA3 can be arranged substantially at the same position to the side surface SS2 of the region FA1 in the Y-axis direction. Thus, a decrease in on-state current flowing in the control transistor CT can be prevented or suppressed.

The region FA31 may be arranged between the region FA1 and the region FA3. In this case, preferably, the region FA31 includes the connection surface TS31 connecting the upper surface TS1 of the region FA1 to the upper surface TS3 of the region FA3, the connection surface SS51 connecting the side surface SS1 of the region FA1 to the side surface SS5 of the region FA3, and the connection surface SS61 connecting the side surface SS2 of the region FA1 to the side surface SS6 of the region FA3.

As illustrated in FIG. 7, the end ET31 of the connection surface TS31 may be connected to the upper surface TS3 of the region FA3, and the end ET32 on the opposite side of the end ET31 of the connection surface TS31 may be connected to the upper surface TS1 of the region FA1. Then, the connection surface TS31 may be inclined with respect to any of the upper surface TS3 and the YZ plane in such a way that the end ET31 may be located on the negative side in the X-axis direction with respect to the end ET32 and may be located lower than the end ET32 in the Z-axis direction.

As illustrated in FIG. 8, the end ES51 of the connection surface SS51 may be connected to the side surface SS5 of the region FA3, and the end ES52 on the opposite side of the end ES51 of the connection surface SS51 may be connected to the side surface SS1 of the region FA1. Then, the connection surface SS51 may be inclined with respect to any of the side surface SS5 and the YZ plane in such a way that the end ES51 may be located on the negative side in the X-axis direction with respect to the end ES52 and may be located on the negative side in the Y-axis direction with respect to the end ES52.

As illustrated in FIG. 8, the end ES61 of the connection surface SS61 may be connected to the side surface SS6 of the region FA3, and the end ES62 on the opposite side of the end ES61 of the connection surface SS61 may be connected to the side surface SS2 of the region FA1. Then, the connection surface SS61 may be inclined with respect to any of the side surface SS6 and the YZ plane in such a way that the end ES61 may be located on the negative side in the X-axis direction with respect to the end ES62 and may be located on the positive side in the Y-axis direction with respect to the end ES62.

Subsequently, the n⁻-type semiconductor region VMG is formed as illustrated in FIGS. 29 and 30 (step S9 in FIG. 9).

In this step S9, with use of the cap insulating film CP1 and the control gate electrode CG having the sacrificial oxide film SOF1 formed on the side surfaces thereof as masks, n-type impurities such as phosphorus (P) and arsenic (As) are doped into the fin FA by ion implantation. Thus, the n⁻-type semiconductor region VMG is formed in a part of the fin FA on a side where the memory gate electrode MG (see FIGS. 33 and 34 described below) is arranged with respect to the control gate electrode CG, that is, in the region FA2.

The sacrificial oxide film SOF1 is formed on the front surface of the region FA2. Thus, when the n-type impurities are doped into the region FA2 by ion implantation, the front surface of the region FA2 can be prevented from being damaged.

As described above, the upper surface TS2 of the region FA2 is lower than the upper surface TS1 of the region FA1, the side surface SS3 of the region FA2 is arranged on the negative side in the Y-axis direction with respect to the side surface SS1 of the region FA1, and the side surface SS4 of the region FA2 is arranged on the positive side in the Y-axis direction with respect to the side surface SS2 of the region FA1. Thus, since the impurity ions to be implanted by ion implantation are doped into a part of the fin FA located below the control gate electrode CG, that is, into the region FA1, the n⁻-type semiconductor region VMG can be formed in a desired region with favorable profile accuracy.

Note that the n⁻-type semiconductor region VMG may be formed in a part of the fin FA on an opposite side to the side where the memory gate electrode MG adjacent to the control gate electrode CG is arranged, with respect to the control gate electrode CG, that is, in the region FA3. However, in FIGS. 29 and 30, illustration of the n-type semiconductor region formed on the opposite side of the part where the memory gate electrode MG adjacent to the control gate electrode CG is arranged is omitted. That is, although the n⁻-type semiconductor region VMG is also formed in the region FA3, illustration thereof is omitted in FIGS. 29 and 30.

Also, in cross-sectional views (FIGS. 31 to 48) illustrating the subsequent processes in the process for manufacturing the semiconductor device, illustration of the n⁻-type semiconductor region VMG is omitted for simplification of the drawings.

Subsequently, the insulating film 6 is formed on the element isolation film STM and the fin FA (step S10 in FIG. 9).

Figure 31:
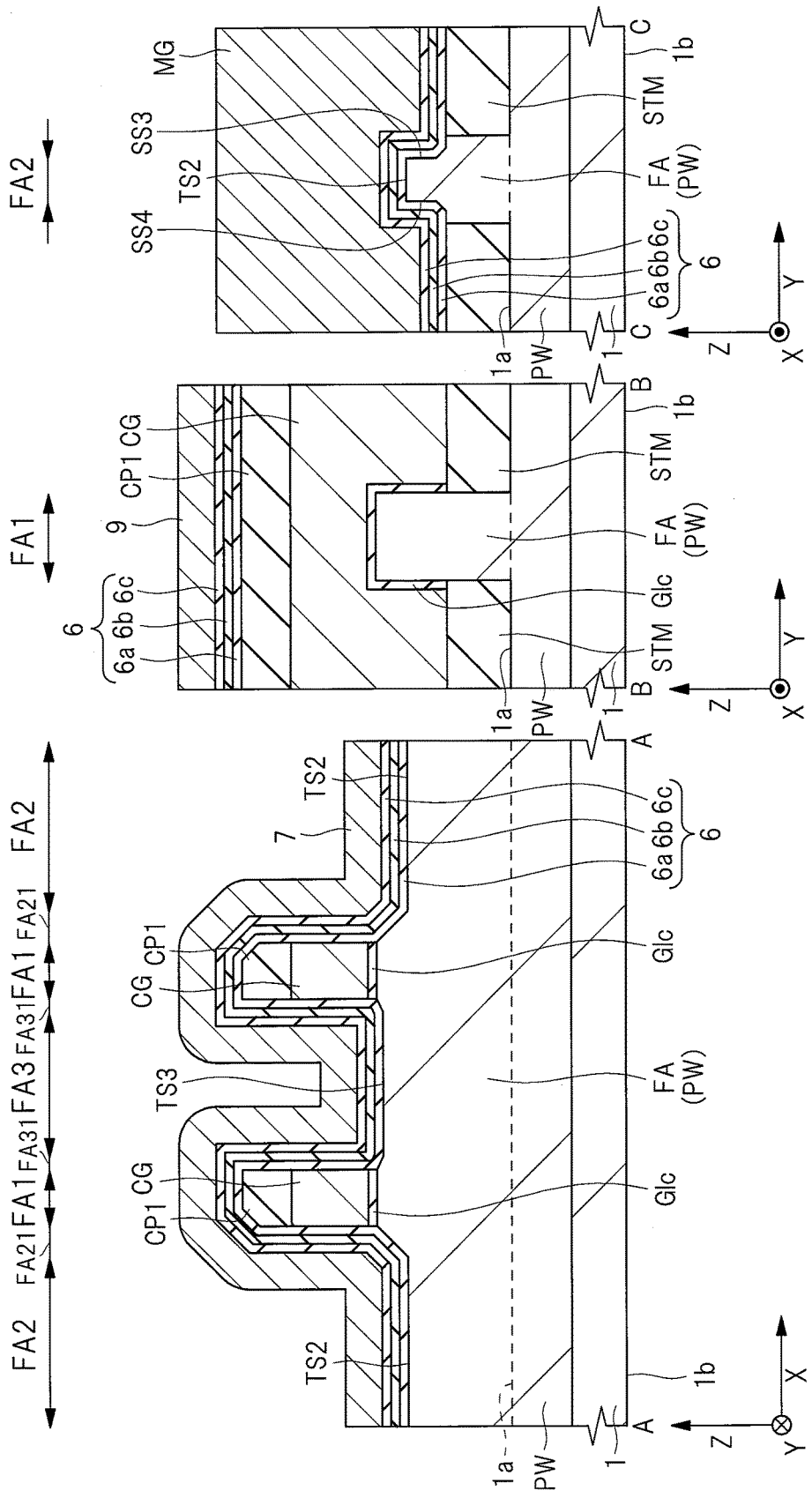
FIG. 31 is a cross-sectional view of a main part in the process for manufacturing the semiconductor device according to the embodiment.
Figure 32:
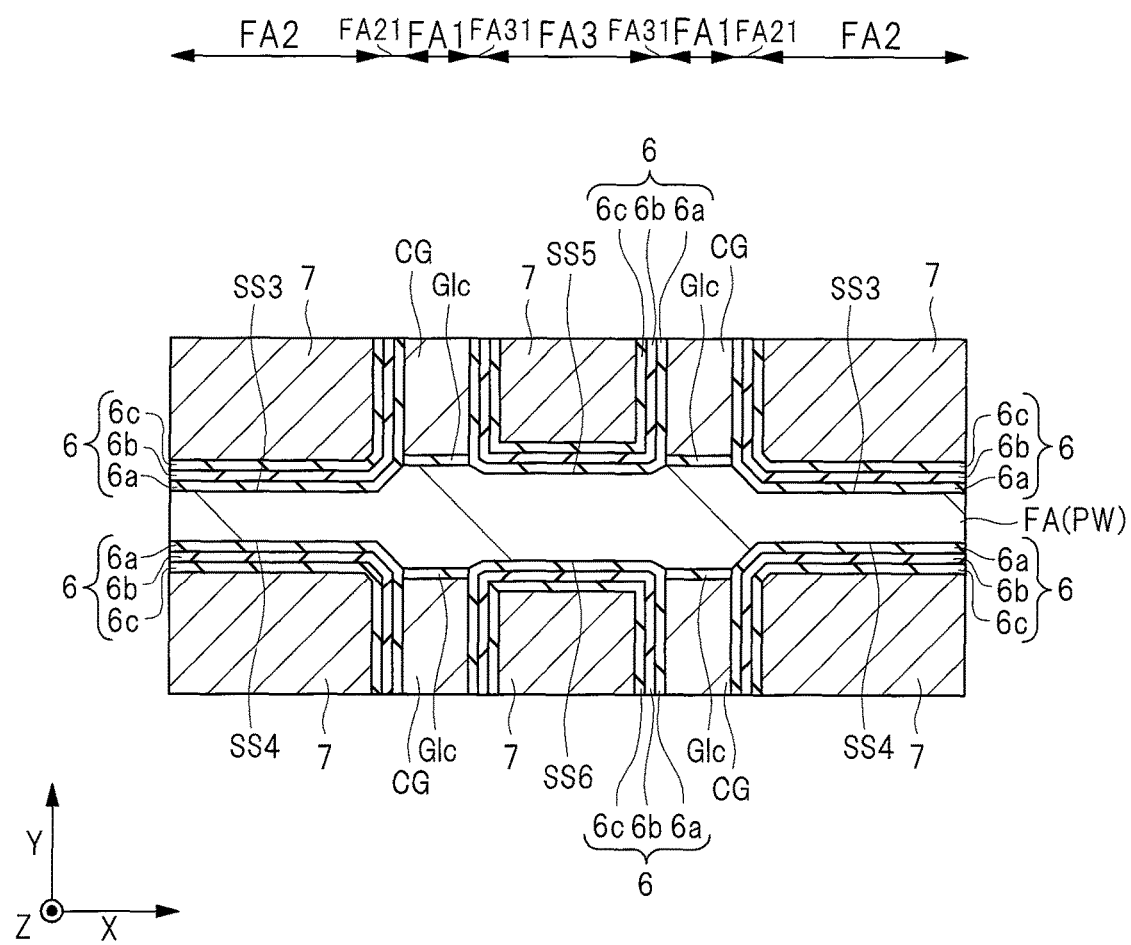
FIG. 32 is a cross-sectional view of a main part in the process for manufacturing the semiconductor device according to the embodiment.

In this step S10, the sacrificial oxide film SOF1 is first etched and removed by, for example, dry etching as illustrated in FIGS. 31 and 32. Thus, the front surfaces of the region FA2 and the region FA3 are exposed.

In this step S10, the insulating film 6 is then formed on the element isolation film STM, the fin FA, the front surface of the control gate electrode CG, and the front surface of the cap insulating film CP1 as illustrated in FIGS. 31 and 32. The insulating film 6 is an insulating film including a charge storage unit therein and is a laminated film including the insulating film 6a, the insulating film 6b as a charge storage unit on the insulating film 6a, and the insulating film 6c on the insulating film 6b, for example.

In this range, as for the front surface of the region FA2, the insulating film 6a is formed on the upper surface TS2 of the region FA2, the side surface SS3 of the region FA2, and the side surface SS4 of the region FA2. More specifically, the insulating film 6a, made of, for example, a silicon oxide film, can be formed on the upper surface TS2 of the region FA2, the side surface SS3 of the region FA2, and the side surface SS4 of the region FA2 by, for example, thermal oxidation or ISSG oxidation. A film thickness of the insulating film 6a can be set to be about 4 nm, for example. The insulating film 6b is then formed over the insulating film 6a. The insulating film 6b made of, for example, a silicon nitride film or a hafnium silicate film can be formed by, for example, the CVD. A film thickness of the insulating film 6b can be set to be about 7 nm, for example.

The insulating film 6c is then formed over the insulating film 6b. The insulating film 6c made of, for example, a silicon oxide film, a silicon oxynitride film, or an aluminum oxide film can be formed by, for example, the CVD or ISSG oxidation. A film thickness of the insulating film 6c can be set to be about 9 nm, for example.

In this manner, in step S10, the insulating film 6 is formed on the upper surface TS2 of the region FA2, the side surface SS3 of the region FA2, and the side surface SS4 of the region FA2. In other words, the insulating film 6 is formed to cover the upper surface TS2 of the region FA2, the side surface SS3 of the region FA2, and the side surface SS4 of the region FA2.

The insulating film 6 functions as a gate insulating film of the memory gate electrode MG (see FIGS. 33 and 34 described below) and has a charge storage function. The insulating film 6 has a structure in which the insulating film 6b serving as a charge storage unit is interposed between the insulating film 6a and the insulating film 6c serving as charge blocking layers. A potential barrier height of the charge blocking layers constituted by the insulating films 6a and 6c is higher than a potential barrier height of the charge storage unit constituted by the insulating film 6b.

Note that, in the present embodiment, the insulating film 6b made of, for example, a silicon nitride film is used as an insulating film having a trap level and using the silicon nitride film is preferable in terms of reliability. However, the insulating film having the trap level is not limited to the silicon nitride film, and a high dielectric constant film having a higher dielectric constant than that of the silicon nitride film such as an aluminum oxide (alumina) film, a hafnium oxide film, and a tantalum oxide film can be used.

Subsequently, the conductive film 7 is formed on the insulating film 6 as illustrated in FIGS. 31 and 32 (step S11 in FIG. 10).

The conductive film 7 is preferably a polycrystalline silicon film, that is, a silicon film such as a polysilicon film. Such a conductive film 7 can be formed by the CVD or the like. Alternatively, the conductive film 7 can be formed as an amorphous silicon film at the time of film formation, and then, the amorphous silicon film can be changed into a polycrystalline silicon film by subsequent thermal treatment.

As the conductive film 7, one into which n-type impurities such as phosphorus (P) and arsenic (As) or p-type impurities such as boron (B) are doped to have low resistivity is preferably used. The impurities can be doped at the time of or after formation of the conductive film 7. The impurities can also be doped into the conductive film 7 after formation of the conductive film 7 by ion implantation or at the time of formation of the conductive film 7. In a case of doping the impurities at the time of formation of the conductive film 7, the conductive film 7 into which the impurities has been doped can be formed by mixing gas for formation of the conductive film 7 with doping gas.

Figure 33:
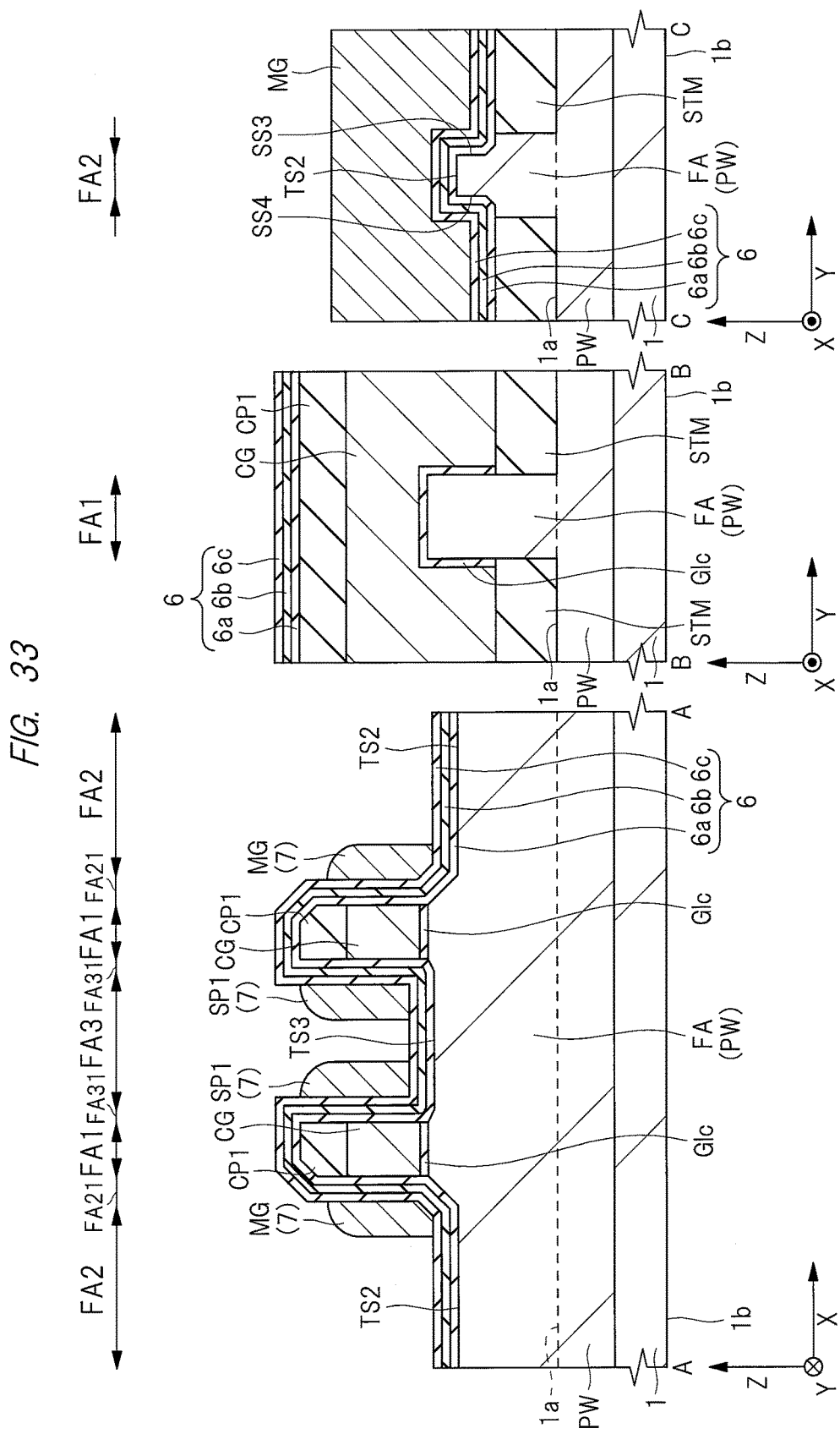
FIG. 33 is a cross-sectional view of a main part in the process for manufacturing the semiconductor device according to the embodiment.
Figure 34:
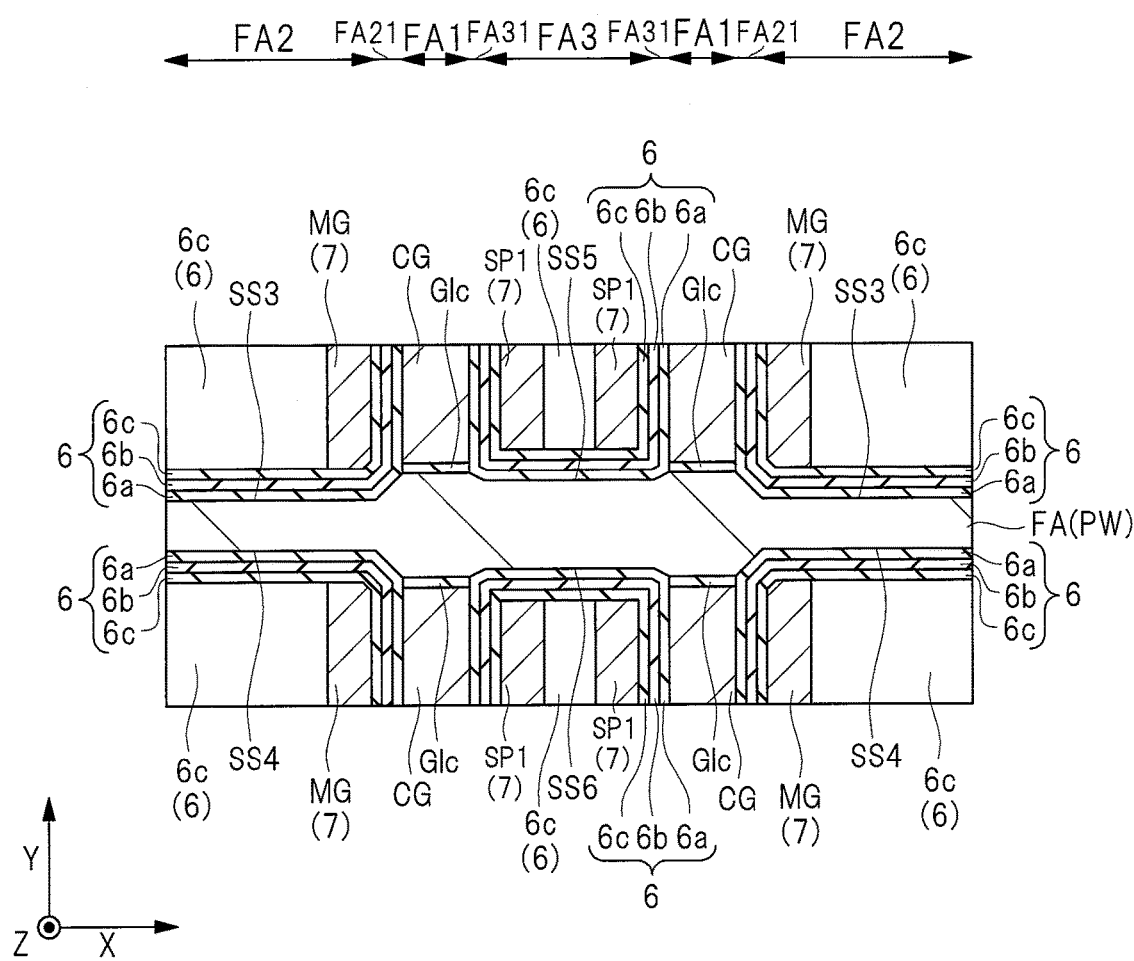
FIG. 34 is a cross-sectional view of a main part in the process for manufacturing the semiconductor device according to the embodiment.

Subsequently, the conductive film 7 is etched back with use of the anisotropic etching technique to form the memory gate electrode MG as illustrated in FIGS. 33 and 34 (step S12 in FIG. 10).

In this step S12, the conductive film 7 is etched back as much as a film thickness of the conductive film 7 to remain on both side surfaces of the control gate electrode CG via the insulating film 6 like a sidewall spacer, and the conductive film 7 located in other regions is removed.

Thus, by leaving the conductive film 7 on a side surface of the control gate electrode CG on the side where the memory gate electrode MG adjacent to the control gate electrode CG is arranged, out of both side surfaces of the control gate electrode CG, via the insulating film 6 like the sidewall spacer, the memory gate electrode MG including the left conductive film 7 is formed. Specifically, the memory gate electrode MG is formed on the upper surface TS2 of the region FA2, the side surface SS3 of the region FA2, and the side surface SS4 of the region FA2 via the insulating film 6. In other words, the memory gate electrode MG is formed to cover the upper surface TS2 of the region FA2, the side surface SS3 of the region FA2, and the side surface SS4 of the region FA2.

Also, by leaving the conductive film 7 on a side surface on the opposite side to the side where the memory gate electrode MG adjacent to the control gate electrode CG is arranged, out of both side surfaces of the control gate electrode CG, via the insulating film 6 like the sidewall spacer, a spacer SP1 including the left conductive film 7 is formed. Specifically, the spacer SP1 is formed on the upper surface TS3 of the region FA3, the side surface SS5 of the region FA3, and the side surface SS6 of the region FA3 via the insulating film 6. In other words, the spacer SP1 is formed to cover the upper surface TS3 of the region FA3, the side surface SS5 of the region FA3, and the side surface SS6 of the region FA3.

The memory gate electrode MG is formed to be adjacent to the control gate electrode CG via the insulating film 6. The memory gate electrode MG and the spacer SP1 are formed on the side surfaces of the control gate electrode CG in such a way that the memory gate electrode MG and the spacer SP1 are opposed to each other with the control gate electrode CG interposed therebetween.

The cap insulating film CP1 is formed on the control gate electrode CG. Thus, the memory gate electrode MG includes the conductive film 7 left on a side surface of the cap insulating film CP1 on a side where the memory gate electrode MG adjacent to the control gate electrode CG is arranged, out of both side surfaces of the cap insulating film CP1, via the insulating film 6 like the sidewall spacer. Also, the spacer SP1 includes the conductive film 7 left on a side surface on the opposite side to the side where the memory gate electrode MG adjacent to the control gate electrode CG is arranged, out of both side surfaces of the cap insulating film CP1, via the insulating film 6 like the sidewall spacer.

At the stage at which the etch-back process has been performed in step S12, parts of the insulating film 6 not covered with any of the memory gate electrode MG and the spacer SP1 are exposed. Meanwhile, the insulating film 6 between the memory gate electrode MG and the region FA2 and between the memory gate electrode MG and the control gate electrode CG becomes the gate insulating film GIm (see FIGS. 39 and 40 described below) of the memory transistor MT.

Subsequently, the spacer SP1 is removed (step S13 in FIG. 10).

Figure 35:
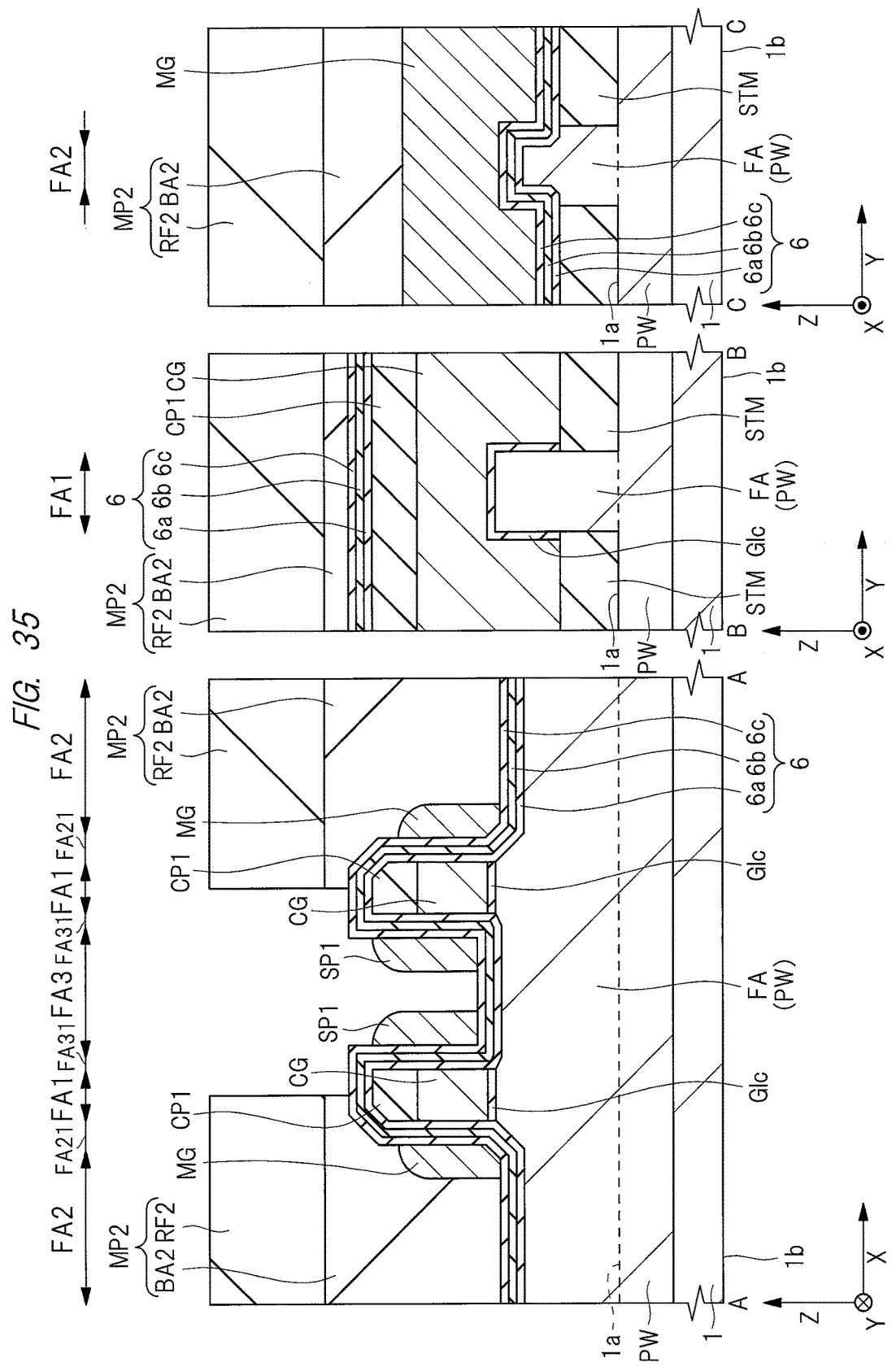
FIG. 35 is a cross-sectional view of a main part in the process for manufacturing the semiconductor device according to the embodiment.
Figure 36:
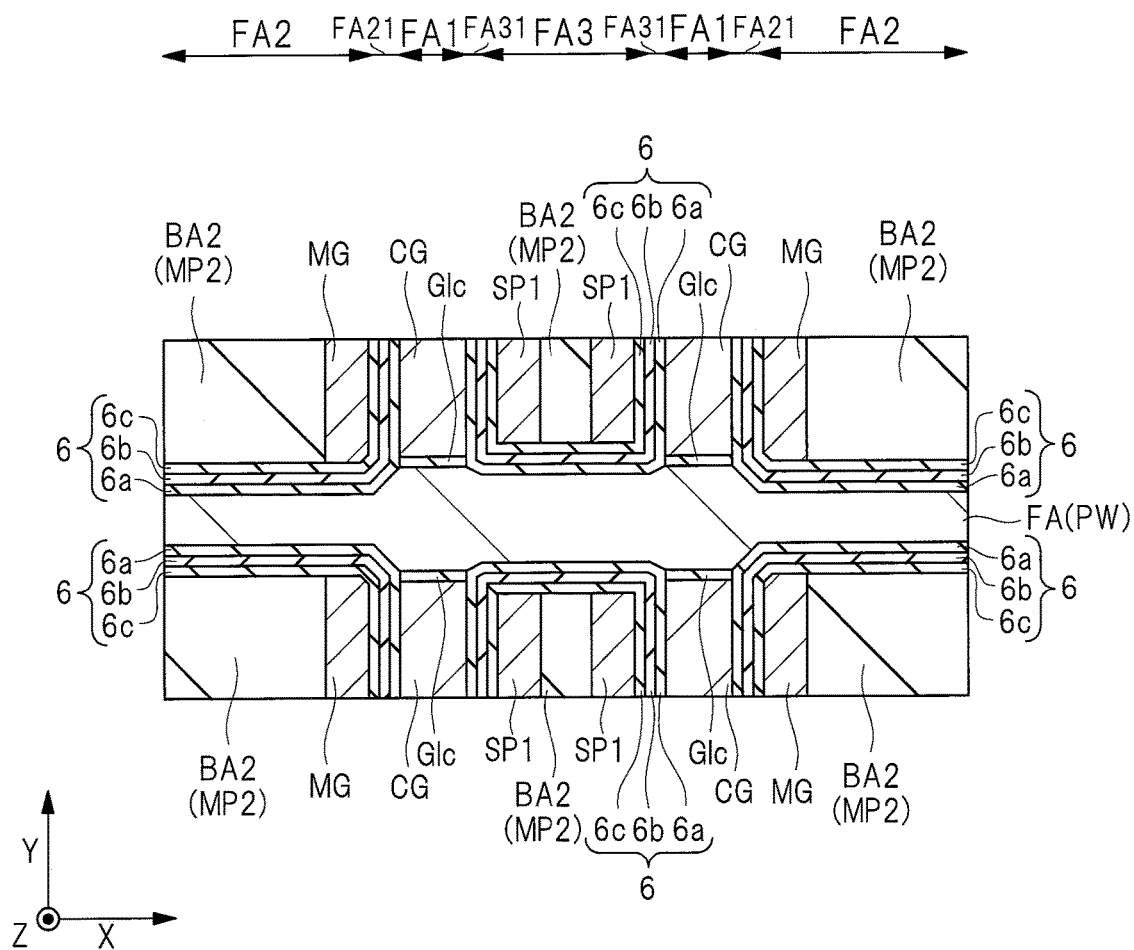
FIG. 36 is a cross-sectional view of a main part in the process for manufacturing the semiconductor device according to the embodiment.

In this step S13, an antireflective film BA2 made of, for example, an organic film, is first formed on the insulating film 6 to cover the memory gate electrode MG and the spacer SP1, and a resist film RF2 is formed on the antireflective film BA2, as illustrated in FIGS. 35 and 36. In this manner, the antireflective film BA2 formed between the resist film RF2, and the insulating film 6, the memory gate electrode MG, and the spacer SP1, is referred to as BARC. The resist film RF2 is then patterned.

In this step, the resist film RF2 is patterned in such a way that a part of the antireflective film BA2 located between the two adjacent control gate electrodes CG, that is, a part covering the spacer SP1, may be exposed from the resist film RF2. Also, the resist film RF2 is patterned in such a way that a part of the antireflective film BA2 located on an opposite side to one control gate electrode CG with the other control gate electrode CG interposed therebetween, that is, a part covering the memory gate electrode MG, may be covered with the resist film RF2.

In this step S13, with use of the patterned resist film RF2 as an etching mask, the antireflective film BA2 is then patterned by dry etching with use of mixed gas of, for example, fluorocarbon gas, argon (Ar) gas, and oxygen ($O_2$) gas as etching gas, as illustrated in FIGS. 35 and 36. Thus, a mask pattern MP2 including the part of the antireflective film BA2 covering the memory gate electrode MG and a part of the resist film RF2 covering the memory gate electrode MG is formed.

Figure 37:
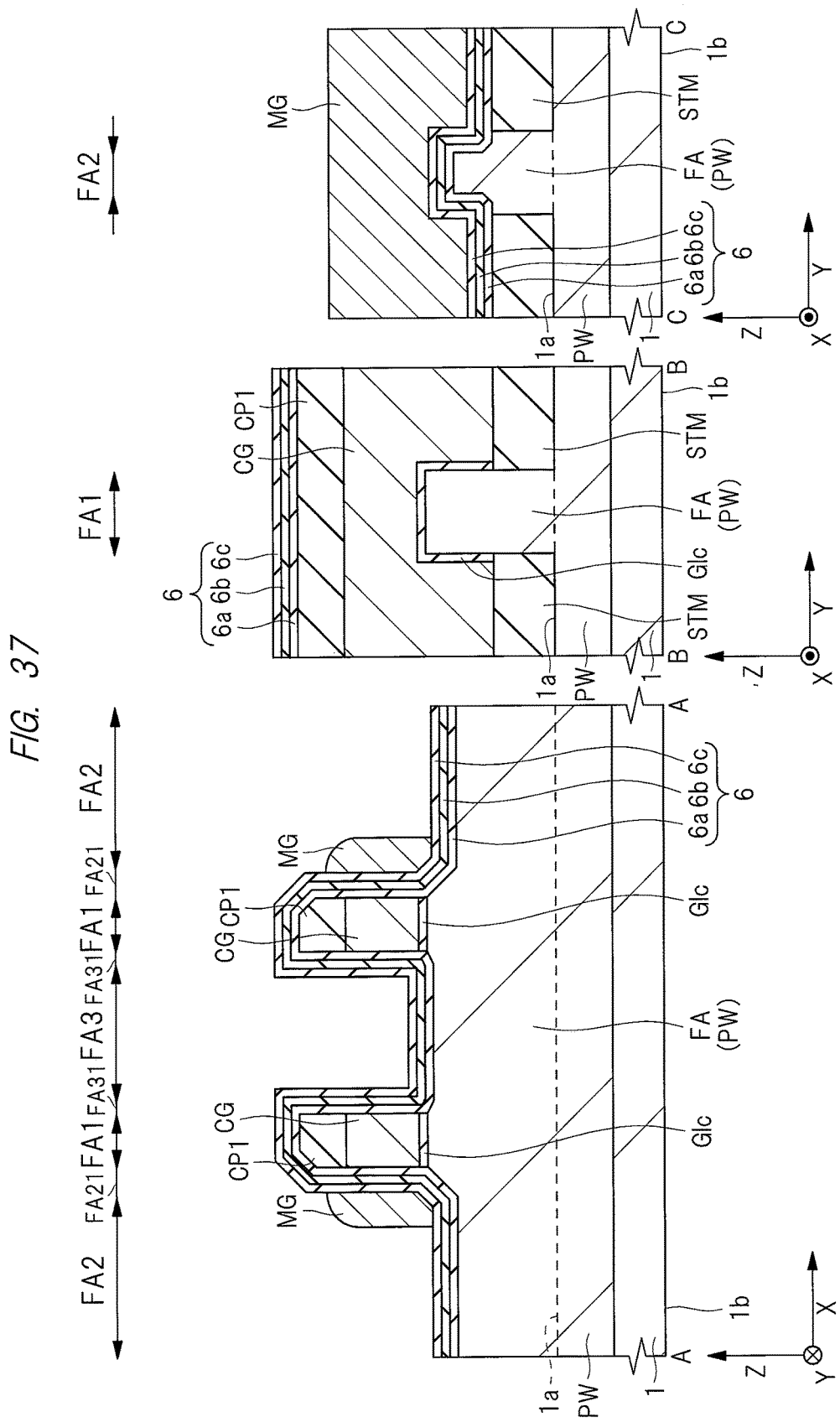
FIG. 37 is a cross-sectional view of a main part in the process for manufacturing the semiconductor device according to the embodiment.
Figure 38:
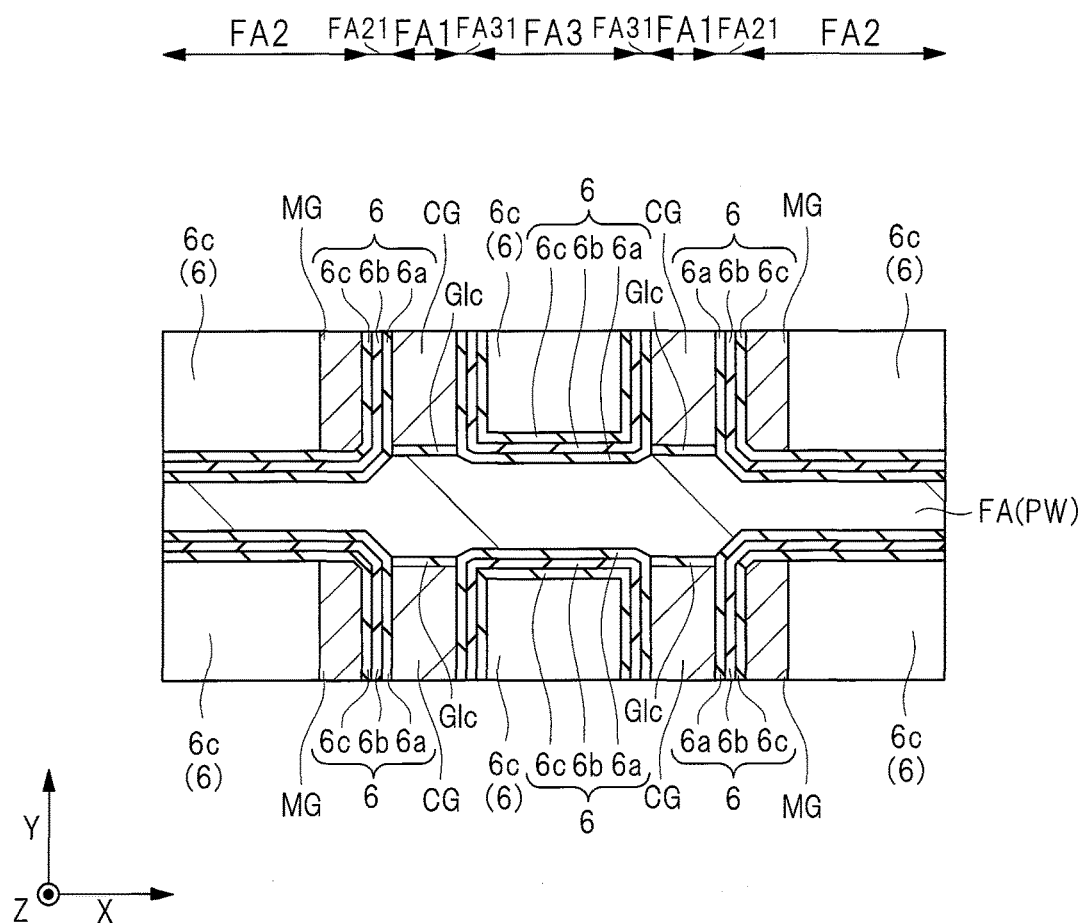
FIG. 38 is a cross-sectional view of a main part in the process for manufacturing the semiconductor device according to the embodiment.

In this step S13, the spacer SP1 is then removed by dry etching with use of the formed mask pattern MP2 (see FIGS. 35 and 36) as an etching mask as illustrated in FIGS. 37 and 38. Meanwhile, the memory gate electrode MG remains without being etched since the memory gate electrode MG is covered with the mask pattern MP2.

In this step S13, the mask pattern MP2 is then removed as illustrated in FIGS. 37 and 38.

Figure 39:
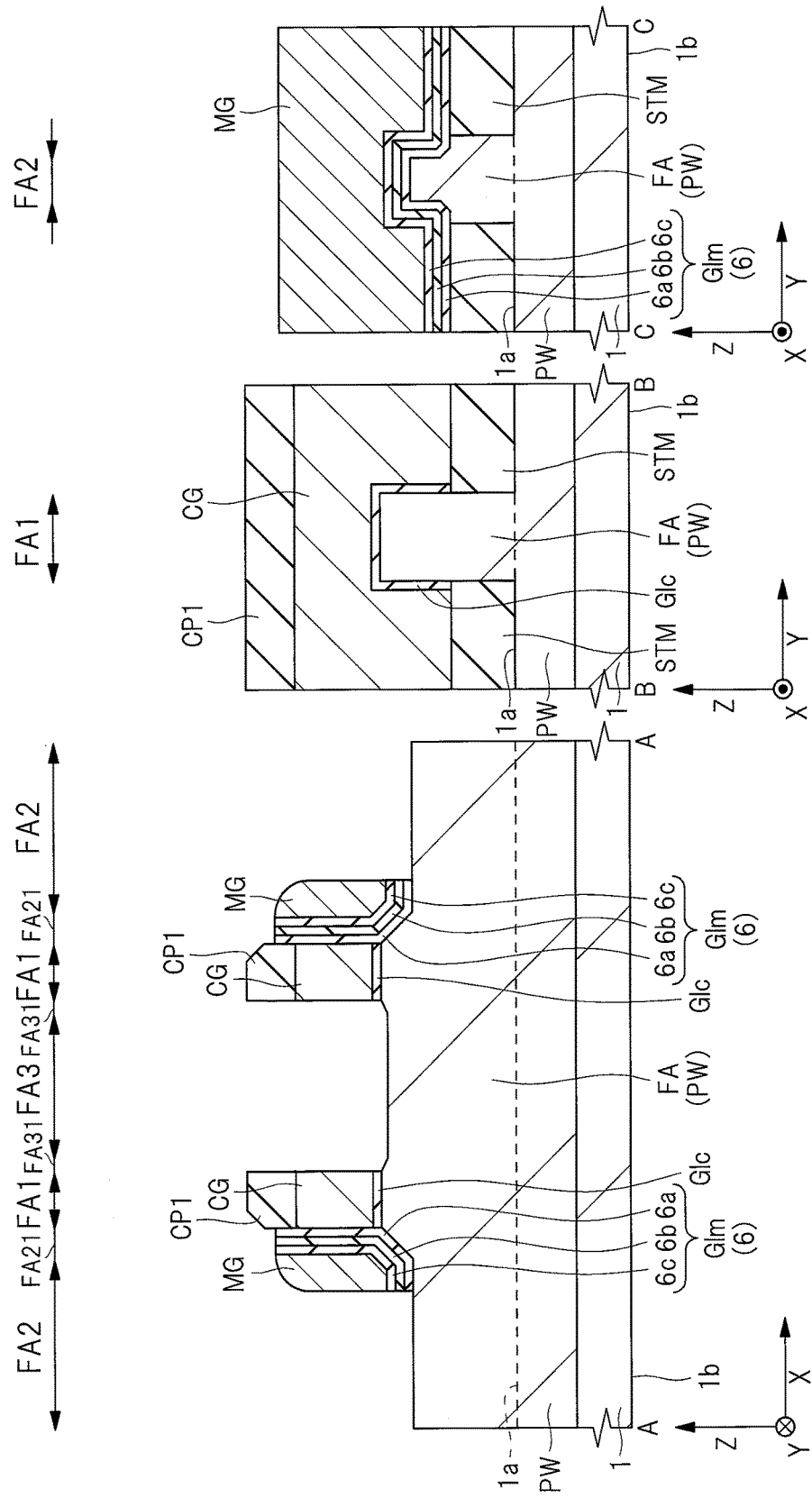
FIG. 39 is a cross-sectional view of a main part in the process for manufacturing the semiconductor device according to the embodiment.
Figure 40:
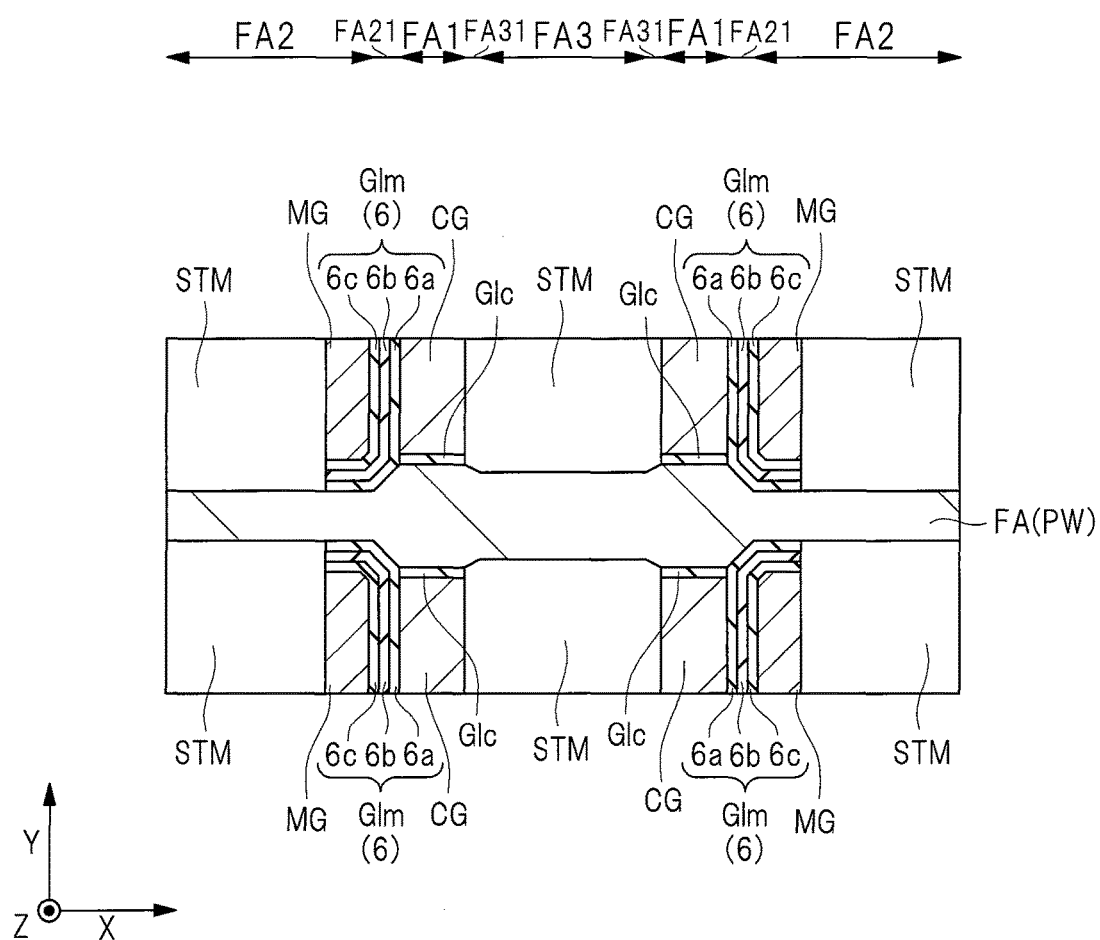
FIG. 40 is a cross-sectional view of a main part in the process for manufacturing the semiconductor device according to the embodiment.

Subsequently, parts of the insulating film 6 not covered with the memory gate electrode MG are removed by etching as illustrated in FIGS. 39 and 40 (step S14 in FIG. 10). In this step S14, the insulating films 6c and 6a made of, for example, a silicon oxide film are etched by wet etching with use of, for example, hydrofluoric acid (HF), and the insulating film 6b made of, for example, a silicon nitride film is etched by wet etching with use of, for example, thermal phosphoric acid ($H_3PO_4$).

In this case, the part of the insulating film 6 located between the memory gate electrode MG and the region FA2 of the fin FA and between the memory gate electrode MG and the control gate electrode CG remain without being removed, and parts of the insulating film 6 located in the other regions are removed. The gate insulating film GIm including the insulating film 6 between the memory gate electrode MG and the region FA2 of the fin FA and between the memory gate electrode MG and the control gate electrode CG is formed.

Note that, in step S14, etching can also be performed in such a way that, in the insulating film 6, the insulating film 6c and the insulating film 6b may be removed and the insulating film 6a may remain without being removed.

Figure 41:
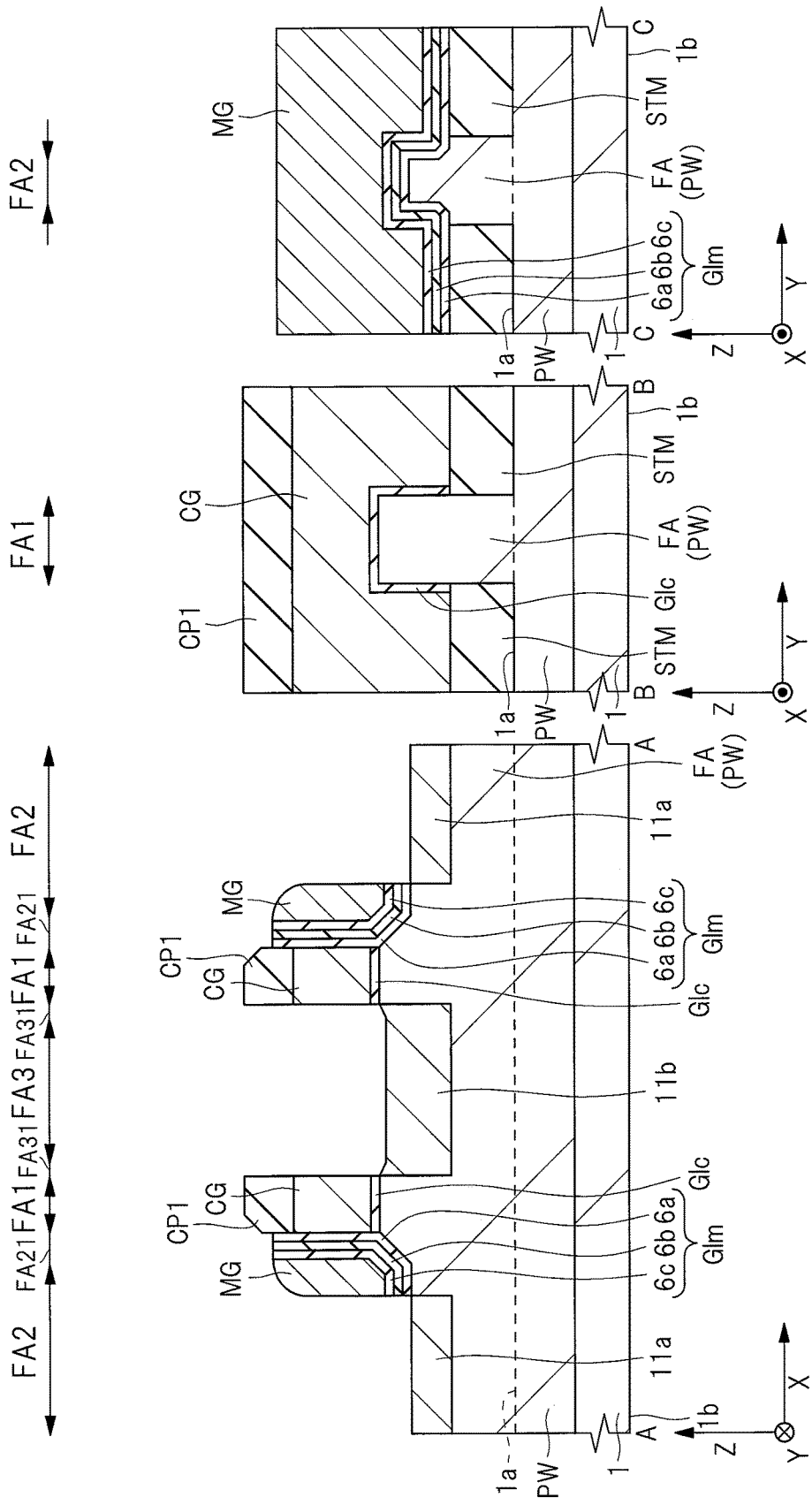
FIG. 41 is a cross-sectional view of a main part in the process for manufacturing the semiconductor device according to the embodiment.
Figure 42:
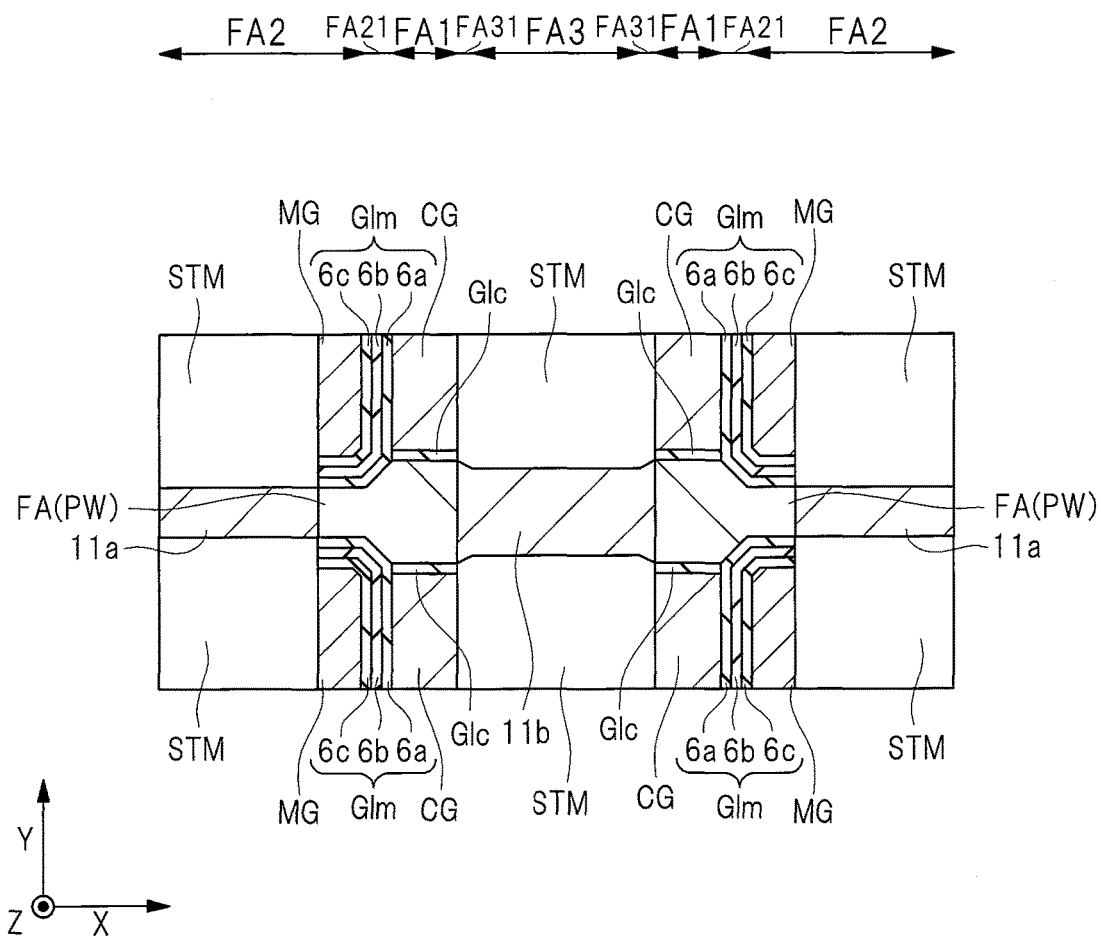
FIG. 42 is a cross-sectional view of a main part in the process for manufacturing the semiconductor device according to the embodiment.

Subsequently, the $n^-$-type semiconductor regions 11a and 11b are formed by ion implantation or the like as illustrated in FIGS. 41 and 42 (step S15 in FIG. 10).

In this step S15, n-type impurities such as phosphorus (P) and arsenic (As) are doped into the region FA2 and the region FA3 of the fin FA with use of the control gate electrode CG and the memory gate electrode MG as masks. Thus, the $n^-$-type semiconductor region 11a is formed in the region FA2 of the fin FA, and the $n^-$-type semiconductor region 11b is formed in the region FA3 of the fin FA.

At this time, the n-type semiconductor region 11a is formed against the side surface of the memory gate electrode MG in a self-aligned manner in the region FA2, and the $n^-$-type semiconductor region 11b is formed against the side surface of the control gate electrode CG in a self-aligned manner in the region FA3.

Figure 43:
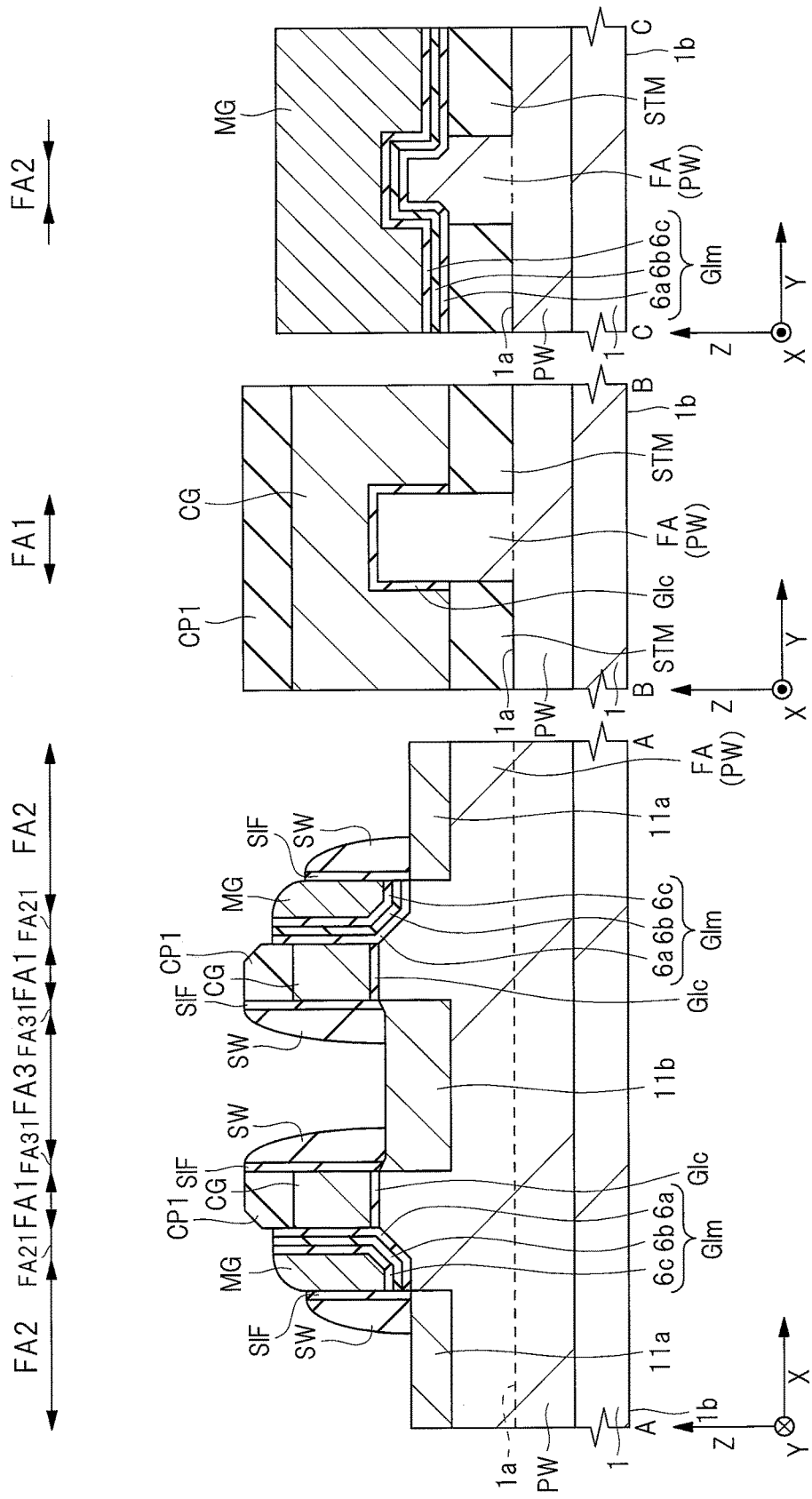
FIG. 43 is a cross-sectional view of a main part in the process for manufacturing the semiconductor device according to the embodiment.
Figure 44:
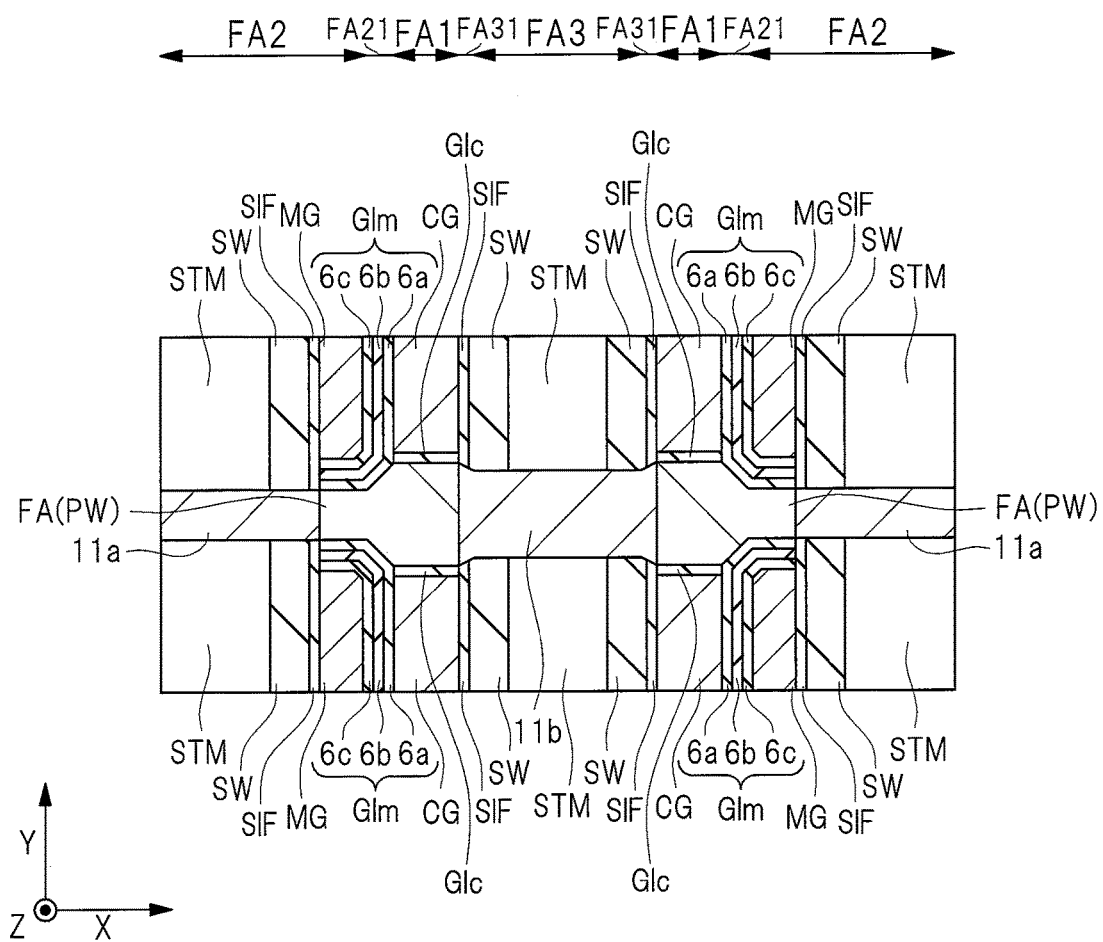
FIG. 44 is a cross-sectional view of a main part in the process for manufacturing the semiconductor device according to the embodiment.

Subsequently, the sidewall spacers SW are formed on the side surfaces of the control gate electrode CG and the memory gate electrode MG as illustrated in FIGS. 43 and 44 (step S16 in FIG. 10).

An insulating film for the sidewall spacers SW is first formed on the element isolation film STM and the fin FA to cover the control gate electrode CG, the cap insulating film CP1, and the memory gate electrode MG, and the formed insulating film is etched back by, for example, anisotropic etching.

In this manner, by leaving the insulating film in a part adjacent to the control gate electrode CG on the opposite side to the memory gate electrode MG with the control gate electrode CG interposed therebetween, the sidewall spacer SW is formed. Also, by leaving the insulating film in apart adjacent to the memory gate electrode MG on the opposite side to the control gate electrode CG with the memory gate electrode MG interposed therebetween, the sidewall spacer SW is formed.

Each of these sidewall spacers SW is made of an insulating film such as a silicon oxide film, a silicon nitride film, or a laminated film thereof.

Note that, in the example illustrated in FIGS. 43 and 44, the insulating film SIF made of, for example, silicon oxide, is interposed between the control gate electrode CG and the sidewall spacer SW and between the memory gate electrode MG and the sidewall spacer SW.

Figure 45:
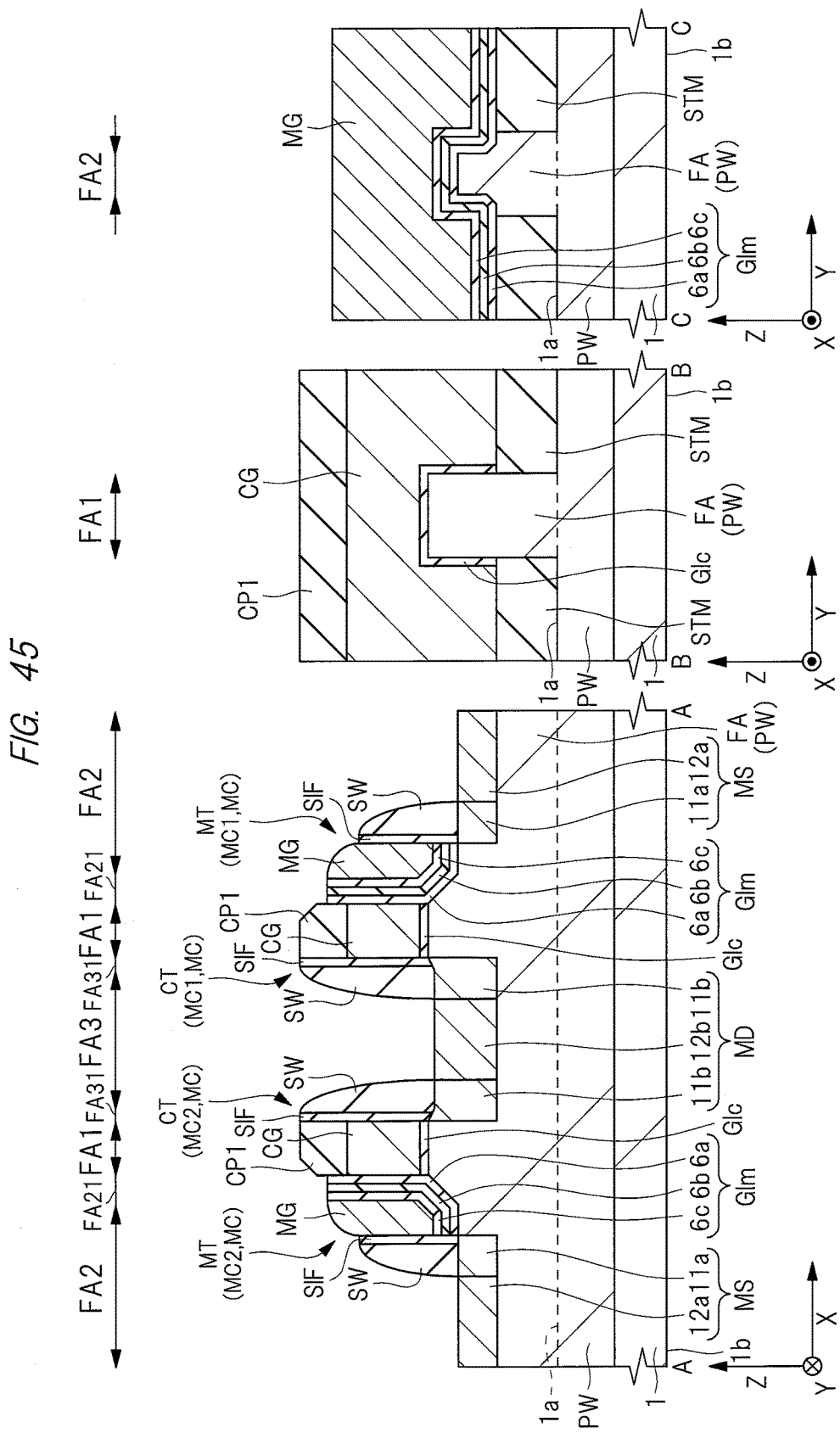
FIG. 45 is a cross-sectional view of a main part in the process for manufacturing the semiconductor device according to the embodiment.
Figure 46:
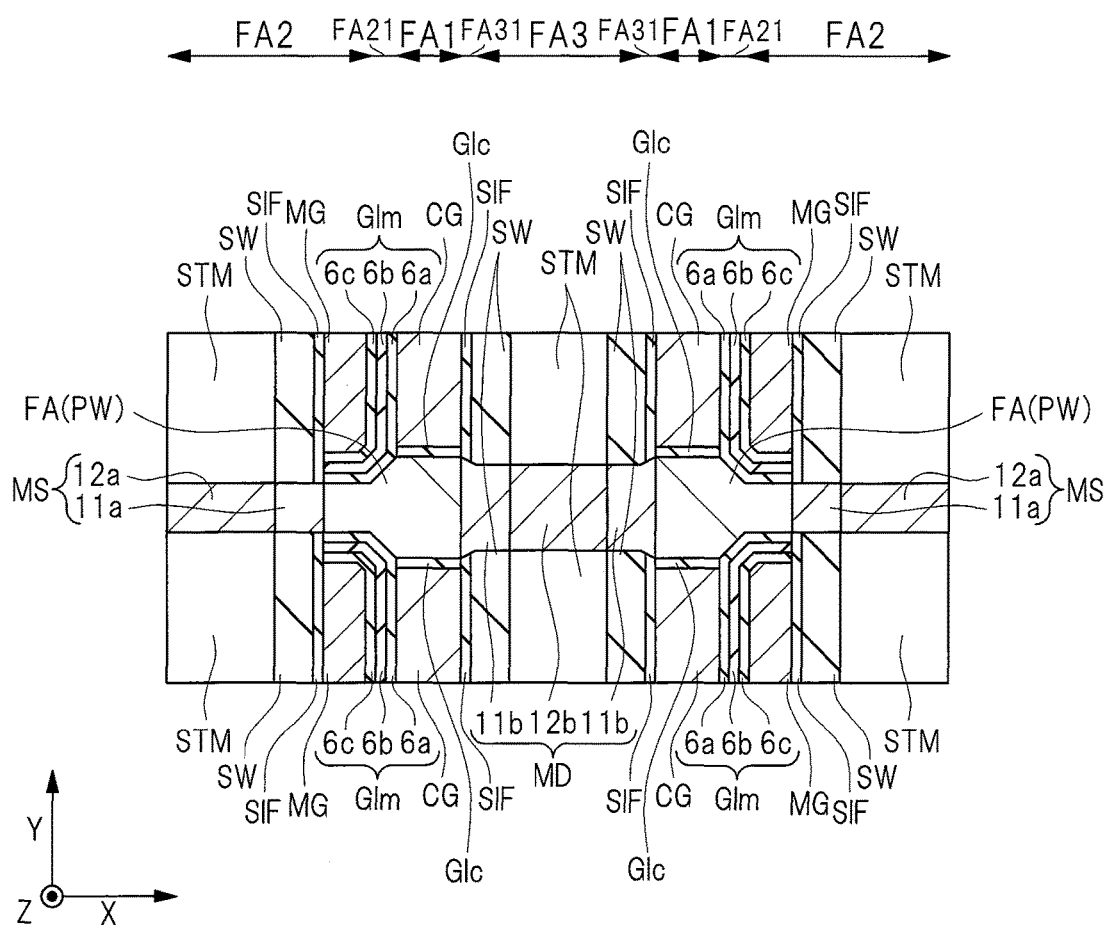
FIG. 46 is a cross-sectional view of a main part in the process for manufacturing the semiconductor device according to the embodiment.

Subsequently, the n$^+$-type semiconductor regions 12a and 12b are formed by ion implantation or the like as illustrated in FIGS. 45 and 46 (step S17 in FIG. 10). In this step S17, an n-type impurity such as phosphorus (P) and arsenic (As) is doped into the region FA2 and the region FA3 of the fin FA with use of the control gate electrode CG and the memory gate electrode MG, and the sidewall spacers SW adjacent to these electrodes, as masks. Thus, the n$^+$-type semiconductor region 12a is formed in the region FA2 of the fin FA, and the n$^+$-type semiconductor region 12b is formed in the region FA3 of the fin FA.

At this time, the n$^+$-type semiconductor region 12a is formed against the sidewall spacer SW on the side surface of the memory gate electrode MG in a self-aligned manner, and the n$^+$-type semiconductor region 12b is formed against the sidewall spacer SW on the side surface of the control gate electrode CG in a self-aligned manner.

In this manner, the n-type semiconductor region MS is formed by the n$^-$-type semiconductor region 11a and the n$^+$-type semiconductor region 12a having a higher impurity concentration than that of the n$^-$-type semiconductor region 11a, has the LDD structure, and functions as a source region of the memory transistor MT. Also, the n-type semiconductor region MD is formed by the n$^-$-type semiconductor region 11b and the n$^+$-type semiconductor region 12b having a higher impurity concentration than that of the n$^-$-type semiconductor region 11b, has the LDD structure, and functions as a drain region of the control transistor CT.

Thereafter, activation annealing is performed, which is a thermal treatment for activating the impurities doped into the n$^-$-type semiconductor regions 11a and 11b, the n$^+$-type semiconductor regions 12a and 12b, and the like.

Thus, as illustrated in FIGS. 45 and 46, the control transistor CT and the memory transistor MT are formed, and the memory cell MC serving as a non-volatile memory is formed by the control transistor CT and the memory transistor MT. That is, the memory cell MC serving as a non-volatile memory is formed by the control gate electrode CG, the gate insulating film GIc, the memory gate electrode MG, and the gate insulating film GIm. Note that the memory cells MC1 and MC2 as the two adjacent memory cells MC share the n$^+$-type semiconductor region 12b.

Figure 47:
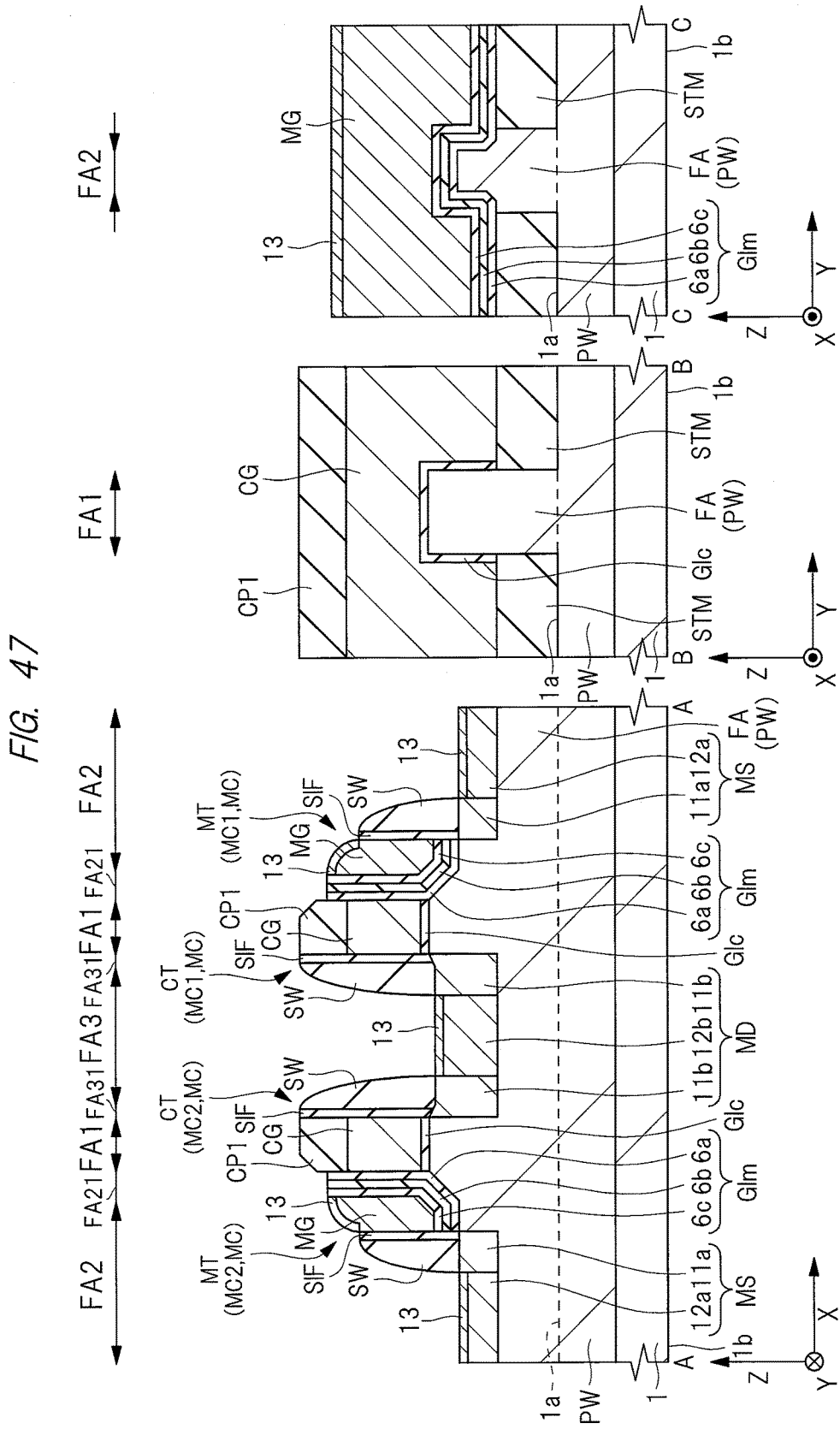
FIG. 47 is a cross-sectional view of a main part in the process for manufacturing the semiconductor device according to the embodiment.
Figure 48:
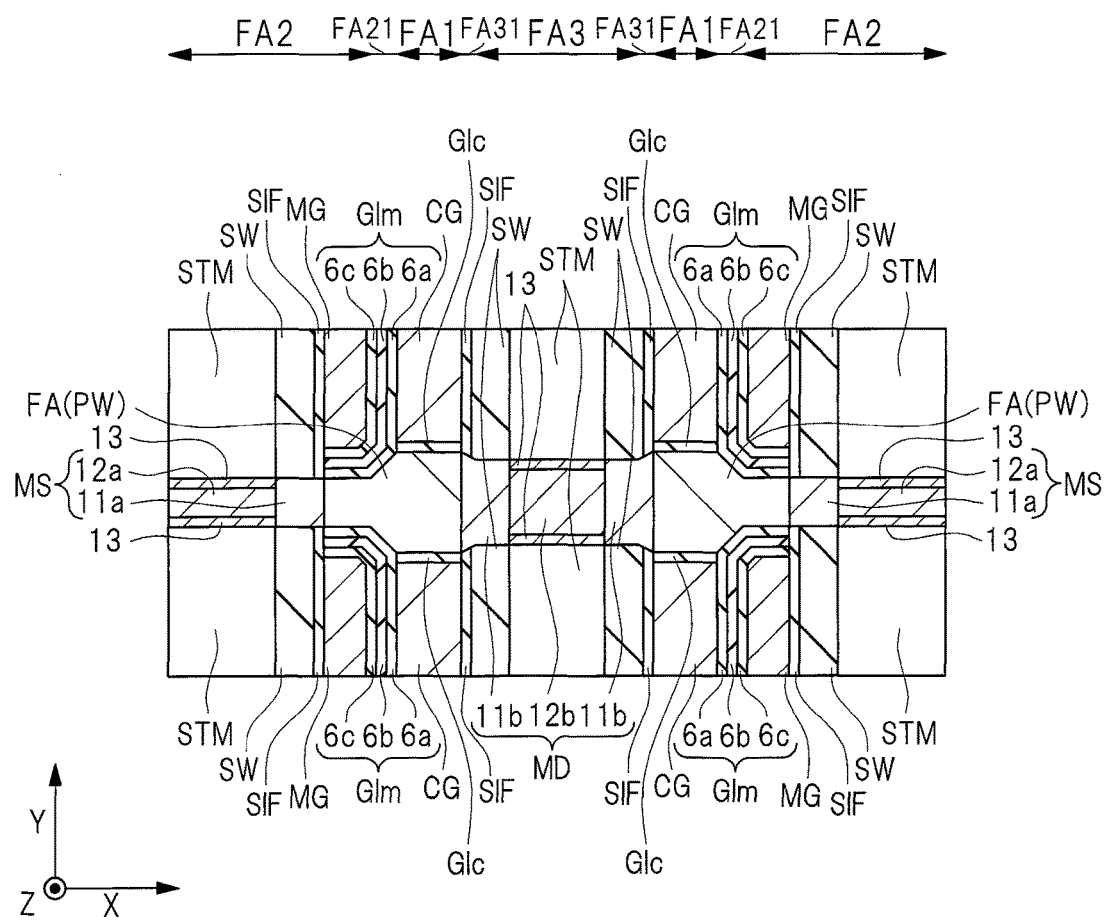
FIG. 48 is a cross-sectional view of a main part in the process for manufacturing the semiconductor device according to the embodiment.

Subsequently, the metal silicide layer 13 is formed as illustrated in FIGS. 47 and 48 (step S18 in FIG. 10).

In this step S18, a metal film is first formed on the element isolation film STM and the fin FA to cover the cap insulating film CP1, the memory gate electrode MG, and the sidewall spacers SW. The metal film is made of a cobalt (Co) film, a nickel (Ni) film, or a nickel-platinum alloy film, for example, and can be formed by sputtering. The semiconductor substrate 1 is then subjected to thermal treatment to cause the respective upper layer portions of the n$^+$-type semiconductor regions 12a and 12b and the memory gate electrode MG to react with the metal film. Thus, the metal silicide layer 13 is formed on each surface of the n$^+$-type semiconductor regions 12a and 12b and the memory gate electrode MG.

The metal silicide layer 13 can be a cobalt silicide layer, a nickel silicide layer, or a platinum added nickel silicide layer, for example. The unreacted metal film is thereafter removed. By performing the so-called salicide process, the metal silicide layer 13 can be formed on each surface of the n$^+$-type semiconductor regions 12a and 12b and the memory gate electrode MG.

Subsequently, the insulating film 14, the interlayer insulating film 15, and the plug PG are formed as illustrated in FIG. 5 (step S19 in FIG. 10).

In this step S19, the insulating film 14 is first formed to cover the cap insulating film CP1, the gate insulating film GIm, the memory gate electrode MG, and the sidewall spacers SW. The insulating film 14 is made of, for example, a silicon nitride film. The insulating film 14 can be formed by, for example, the CVD.

In this step S19, the interlayer insulating film 15 is then formed on the insulating film 14. The interlayer insulating film 15 is a single film of a silicon oxide film, a laminated film of a silicon nitride film and a silicon oxide film, or the like. After the interlayer insulating film 15 is formed by, for example, the CVD, the upper surface of the interlayer insulating film 15 is planarized.

In this step S19, the plug PG penetrating the interlayer insulating film 15 and the insulating film 14 is then formed. First, with use of a resist pattern (not illustrated) formed on the interlayer insulating film 15 by photolithography as an etching mask, the interlayer insulating film 15 and the insulating film 14 are subjected to dry etching to form the contact hole CNT in the interlayer insulating film 15 and the insulating film 14. Subsequently, in the contact hole CNT, the conductive plug PG made of tungsten (W) or the like is formed as a conductor portion.

To form the plug PG, a barrier conductor film made of a titanium (Ti) film, a titanium nitride (TiN) film, or a laminated film thereof is formed on the interlayer insulating film 15 including the interior of the contact hole CNT. A main conductor film made of, for example, a tungsten (W) film or the like is then formed on this barrier conductor film to fill the contact hole CNT. Unnecessary main conductor film and barrier conductor film on the interlayer insulating film 15 are removed by the CMP, etching back, or the like. In this manner, the plug PG can be formed. Note that, in FIG. 5, the barrier conductor film and the main conductor film constituting the plug PG are illustrated in an integrated manner for simplification of the drawing.

As illustrated in FIG. 5, the contact hole CNT and the plug PG buried in the contact hole CNT are formed on each of the n$^+$-type semiconductor regions 12a and 12b and the like. In the bottom portion of the contact hole CNT, the metal silicide layer 13 on each of the n$^+$-type semiconductor regions 12a and 12b is exposed, for example. Then, the plug PG buried in the contact hole CNT contacts the metal silicide layer 13 formed on each of the n$^+$-type semiconductor regions 12a and 12b, so that the plug PG is electrically connected to each of the n$^+$-type semiconductor regions 12a and 12b. Note that the plug PG may be electrically connected to the memory gate electrode MG, although illustration thereof is omitted in FIG. 5.

Subsequently, the metal wires MW1 and MW2 serving as wires of the first layer are formed on the interlayer insulating film 15 in which the plug PG has been buried as illustrated in FIG. 5 (step S20 in FIG. 10). Here, a case of forming the metal wires MW1 and MW2 with use of the single damascene technique as the damascene technique will be described.

The insulating film 16 is first formed on the interlayer insulating film 15 in which the plug PG is buried. The insulating film 16 can be formed by a laminated film including a plurality of insulating films. The wiring trenches are then formed in predetermined regions of the insulating film 16 by dry etching with use of a resist pattern (not illustrated) as an etching mask.

A barrier conductor film made of a titanium nitride (TiN) film, a tantalum (Ta) film, a tantalum nitride (TaN) film, or the like is then formed on the insulating film 16 including the bottom portion and the sidewall of each of the formed wiring trenches. A copper (Cu) seed layer is then formed on the barrier conductor film by the CVD or sputtering. Further, a copper (Cu) plating film is formed on the seed layer by electrolytic plating or the like and is buried in the wiring trenches. The main conductor film and the barrier conductor film in regions other than the wiring trenches are removed by the CMP to form the metal wires MW1 and MW2 which are wires of the first layer containing Cu buried in the wiring trenches as a main conductive material. Note that, in FIG. 5, regarding the metal wires MW1 and MW2, the barrier conductor film, the seed layer, and the Cu plating film are illustrated in an integrated manner for simplification of the drawing.

The metal wire MW1 is electrically connected to the semiconductor region MD of the memory cell MC via the plug PG, and the metal wire MW2 is electrically connected to the semiconductor region MS of the memory cell MC via the plug PG. Wires of a second layer and subsequent layers are thereafter formed by the dual damascene method or the like, and illustration and description thereof are omitted here. The wires of the first layer and the subsequent layers are not limited to the damascene wires but can be formed by patterning a conductive film for wires, and can be, for example, a tungsten (W) wire, an aluminum (Al) wire, or the like.

The semiconductor device according to the present embodiment is manufactured in the above manner.

<Distributions of Electrons and Holes Injected into Charge Storage Unit>

Next, distributions of electrons and holes injected into the insulating film 6b serving as a charge storage unit will be described in comparison with those in a comparative example.

Figure 49:
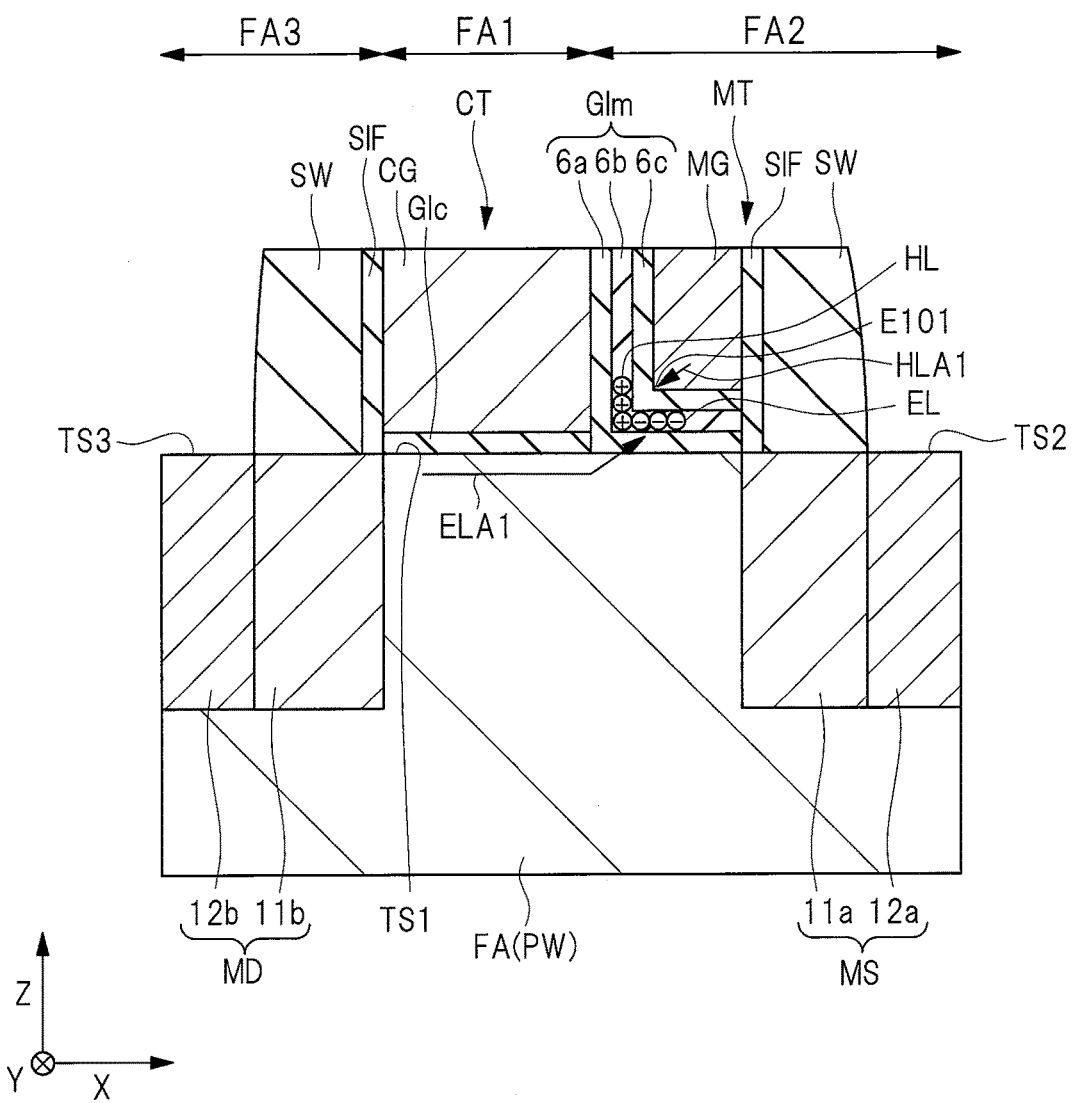
FIG. 49 is a cross-sectional view of a main part of a semiconductor device according to a comparative example.
Figure 50:
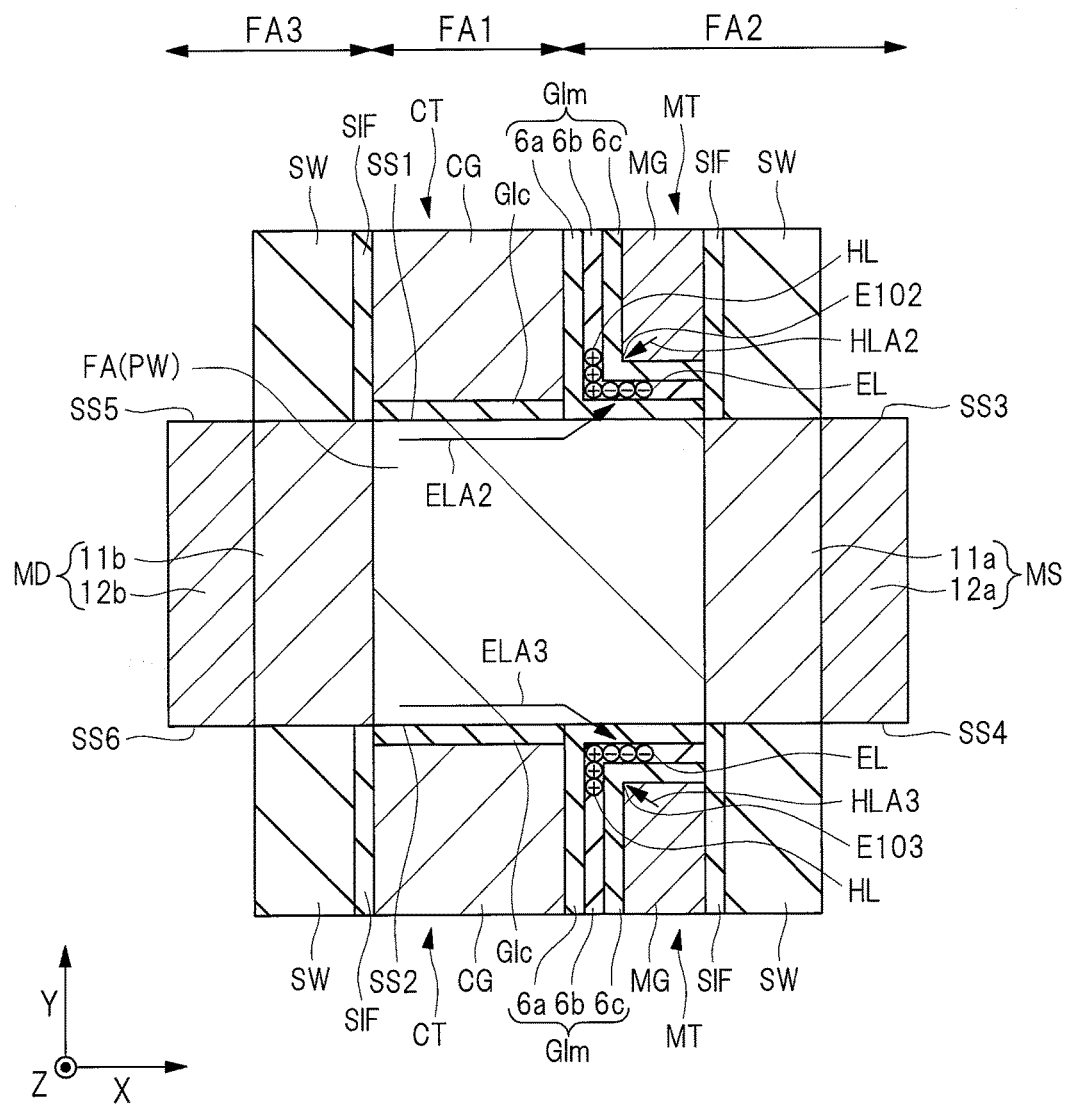
FIG. 50 is a cross-sectional view of a main part of the semiconductor device according to the comparative example.

FIGS. 49 and 50 are cross-sectional views of main parts of the semiconductor device according to the comparative example. FIG. 49 is an enlarged cross-sectional view of the semiconductor device according to the comparative example, which is similar to the enlarged view of the region RG2 in FIG. 7 surrounded by the two-dot chain line of the cross-sectional view illustrated in FIG. 5. FIG. 50 is an enlarged cross-sectional view of the semiconductor device according to the comparative example, which is similar to the enlarged view of the region RG3 in FIG. 8 surrounded by the two-dot chain line of the cross-sectional view illustrated in FIG. 6.

As illustrated in FIGS. 49 and 50, in the semiconductor device according to the comparative example, a part of the fin FA covered with the memory gate electrode MG, that is, the front surface of the region FA2, is not dug down. Thus, in the semiconductor device according to the comparative example, the upper surface TS2 of the region FA2 is arranged in the same height position as that of the upper surface TS1 of the region FA1 in the Z-axis direction, the side surface SS3 of the region FA2 is arranged in the same position as that of the side surface SS1 of the region FA1 in the Y-axis direction, and the side surface SS4 of the region FA2 is arranged in the same position as that of the side surface SS2 of the region FA1 in the Y-axis direction. Also, the upper surface TS3 of the region FA3 is arranged in the same height position as that of the upper surface TS1 of the region FA1 in the Z-axis direction, the side surface SS5 of the region FA3 is arranged in the same position as that of the side surface SS1 of the region FA1 in the Y-axis direction, and the side surface SS6 of the region FA3 is arranged in the same position as that of the side surface SS2 of the region FA1 in the Y-axis direction.

As illustrated in FIG. 49, in the semiconductor device according to the comparative example, a part of the insulating film 6b located between the memory gate electrode MG and the upper surface TS2 of the region FA2 is entirely parallel to the upper surface TS2 of the region FA2. Thus, in a case of writing data by injecting electrons as hot electrons into the insulating film 6b serving as a charge storage unit in the gate insulating film GIm by the aforementioned SSI method, the electrons are likely to be injected uniformly into the part of the insulating film 6b located between the memory gate electrode MG and the upper surface TS2 of the region FA2. That is, the electrons EL are likely to be injected not only into a part of the insulating film 6b between the memory gate electrode MG and the upper surface TS2 of the region FA2 and on a side of the semiconductor region MD serving as a drain region but also into a part thereof on a side of the semiconductor region MS serving as a source region as illustrated by the arrow ELA1 in FIG. 49.

Also, as illustrated in FIG. 50, in the semiconductor device according to the comparative example, a part of the insulating film 6b located between the memory gate electrode MG and the side surface SS3 of the region FA2 is entirely parallel to the side surface SS3 of the region FA2. Thus, in a case of writing data by injecting electrons as hot electrons into the insulating film 6b serving as a charge storage unit in the gate insulating film GIm by the aforementioned SSI method, the electrons are likely to be injected uniformly into the part of the insulating film 6b located between the memory gate electrode MG and the side surface SS3 of the region FA2. That is, the electrons EL are likely to be injected not only into the part of the insulating film 6b between the memory gate electrode MG and the side surface SS3 of the region FA2 and on a side of the semiconductor region MD serving as a drain region but also into a part thereof on a side of the semiconductor region MS serving as a source region as illustrated by the arrow ELA2 in FIG. 50.

Further, as illustrated in FIG. 50, in the semiconductor device according to the comparative example, apart of the insulating film 6b located between the memory gate electrode MG and the side surface SS4 of the region FA2 is entirely parallel to the side surface SS4 of the region FA2. Thus, in a case of writing data by injecting electrons as hot electrons into the insulating film 6b serving as a charge storage unit in the gate insulating film GIm by the aforementioned SSI method, the electrons are likely to be injected uniformly into the part of the insulating film 6b located between the memory gate electrode MG and the side surface SS4 of the region FA2. That is, the electrons EL are likely to be injected not only into the part of the insulating film 6b between the memory gate electrode MG and the side surface SS4 of the region FA2 and on the side of the semiconductor region MD serving as a drain region but also into a part thereof on the side of the semiconductor region MS serving as a source region as illustrated by the arrow ELA3 in FIG. 50.

In contrast, as illustrated in FIG. 49, in the semiconductor device according to the comparative example, in a case of erasing data by injecting holes into the insulating film 6b through use of the aforementioned FN tunneling phenomenon, an electric field between the memory gate electrode MG and the fin FA focuses on an end E101 which is a part of the lower surface of the memory gate electrode MG and on a side on the side of the control gate electrode CG. Thus, as illustrated by the arrow HLA1 in FIG. 49, the holes HL are likely to be injected into a part of the insulating film 6b between a part of the memory gate electrode MG opposed to the upper surface TS2 and the control gate electrode CG and on the side of the region FA2, that is, on a side of the end E101.

Also, as illustrated in FIG. 50, in the semiconductor device according to the comparative example, in a case of erasing data by injecting holes into the insulating film 6b through use of the aforementioned FN tunneling phenomenon, the electric field between the memory gate electrode MG and the fin FA focuses on an end E102 which is a part of the side surface of the memory gate electrode MG opposed to the side surface SS3 on the side of the control gate electrode CG. Thus, as illustrated by the arrow HLA2 in FIG. 50, the holes HL are likely to be injected into a part of the insulating film 6b between a part of the memory gate electrode MG opposed to the side surface SS3 and the control gate electrode CG and on the side of the region FA2, that is, on a side of the end E102.

Further, as illustrated in FIG. 50, in the semiconductor device according to the comparative example, in a case of erasing data by injecting holes into the insulating film 6b through use of the aforementioned FN tunneling phenomenon, the electric field between the memory gate electrode MG and the fin FA focuses on an end E103 which is a part of the side surface of the memory gate electrode MG opposed to the side surface SS4 and on the side of the control gate electrode CG. Thus, as illustrated by the arrow HLA3 in FIG. 50, the holes HL are likely to be injected into a part of the insulating film 6b between a part of the memory gate electrode MG opposed to the side surface SS4 and the control gate electrode CG and on the side of the region FA2, that is, on a side of the end E103.

Accordingly, in the semiconductor device according to the comparative example, a distribution of electrons injected into the insulating film 6b made of, for example, a silicon nitride film at the time of writing data and a distribution of holes injected into the insulating film 6b at the time of erasing data differ from each other or are away from each other. In particular, in a case in which the control gate electrode CG and the memory gate electrode MG straddle the fin FA serving as a projecting portion, on each of the upper surface and the side surfaces of the fin FA, the distribution of electrons injected into the charge storage unit at the time of writing data and the distribution of holes injected into the charge storage unit at the time of erasing data tend to differ from each other. In such a case, in a case in which the write operation and the erase operation are repeated a large number of times, the number of holes remaining in the gate insulating film GIm having the insulating film 6b increases, the retention characteristics of the memory cell deteriorate, and the characteristics of the semiconductor device cannot be improved.

Here, the retention characteristics of the memory cell can be evaluated by temporal changes of the threshold voltage of the memory transistor when the write operation and the erase operation are repeated a large number of times such as about 1000 times, and the memory cell is then left at a higher temperature than the room temperature such as about 150° C. for a long period of time such as about 100 hours.

As described above, when the gate length of the memory gate electrode MG is shortened along with miniaturization of the non-volatile memory, in the case of using the erasing method through use of the FN tunneling phenomenon, the effect of decreasing the consumption current becomes more apparent than in the case of using the erasing method through use of the BTBT phenomenon. However, as described above, in the case of using the erasing method through use of the FN tunneling phenomenon, the problem in which the distribution of holes injected into the insulating film 6b at the time of erasing data and the distribution of electrons injected into the insulating film 6b at the time of writing data differ from each other becomes apparent. Also, in the case in which the control gate electrode CG and the memory gate electrode MG straddle the fin FA, the problem in which the distribution of electrons injected into the charge storage unit at the time of writing data and the distribution of holes injected into the charge storage unit at the time of erasing data differ from each other becomes apparent. Thus, the non-volatile memory cannot be miniaturized easily.

Note that, also in the technique disclosed in Patent Document 1 described above, a semiconductor substrate includes a first surface and a second surface which is lower than the first surface toward a depth direction from the first surface, a control gate electrode is provided on the first surface, and a memory gate electrode is provided on the second surface.

However, in the technique disclosed in Patent Document 1 described above, making the side surface SS3 of the region FA2 recede with respect to the side surface SS1 of the region FA1 in the case in which the control gate electrode CG and the memory gate electrode MG straddle the fin FA is not described. Also, the technique disclosed in Patent Document 1 described above is a technique for solving a problem in which, when the width of the memory gate electrode is reduced, the channel length under the memory gate electrode is shortened, causing an increase in off-state leakage current.

<Major Features and Effects of Present Embodiment>

Meanwhile, in the semiconductor device according to the present embodiment, the upper surface TS2 of the region FA2 is lower than the upper surface TS1 of the region FA1, and the side surface SS3 of the region FA2 is arranged on the negative side in the Y-axis direction with respect to the side surface SS1 of the region FA1 in the Y-axis direction.

In the semiconductor device according to the present embodiment, a case of writing data by injecting electrons as hot electrons into the insulating film 6b through use of the aforementioned SSI method is considered. In this case, the electrons EL are likely to be injected into a part PT22 of the insulating film 6b between the memory gate electrode MG and the upper surface TS2 of the region FA2 on a side of the semiconductor region MD serving as a drain region as illustrated by the arrow ELA1 in FIG. 7. However, the electrons EL are hard to be injected into a part PT21 of the insulating film 6b between the memory gate electrode MG and the upper surface TS2 of the region FA2 on a side of the semiconductor region MS serving as a source region.

Also, in the case of writing data through use of the aforementioned SSI method, the electrons EL are likely to be injected into a part PS32 of the insulating film 6b between the memory gate electrode MG and the side surface SS3 of the region FA2 on the side of the semiconductor region MD serving as a drain region as illustrated by the arrow ELA2 in FIG. 8. However, the electrons EL are hard to be injected into a part PS31 thereof on the side of the semiconductor region MS serving as a source region.

Meanwhile, in the semiconductor device according to the present embodiment, a case of erasing data by injecting holes into the insulating film 6b through use of the aforementioned FN tunneling phenomenon is considered. In this case, the holes HL are injected not only into a part PT23 of the insulating film 6b between a part of the memory gate electrode MG opposed to the upper surface TS2 and the control gate electrode CG and on the side of the region FA2, that is, on the lower side, but also into the part PT22, as illustrated by the arrow HLA1 in FIG. 7.

Also, in the case of erasing data through use of the aforementioned FN tunneling phenomenon, the holes HL are injected not only into a part PS33 of the insulating film 6b between a part of the memory gate electrode MG opposed to the side surface SS3 and the control gate electrode CG on the side of the region FA2, that is, on the negative side in the Y-axis direction, but also into the part PS32, as illustrated by the arrow HLA2 in FIG. 8.

In this manner, in the semiconductor device according to the present embodiment, electrons are injected into the part PT22 and the part PS32 of the insulating film 6b at the time of writing data, and holes are injected into the part PT22 and the part PS32 of the insulating film 6b at the time of erasing data. Thus, in the semiconductor device according to the present embodiment, in respective parts of the region FA2 on the side of the upper surface TS2 and on the side of the side surface SS3, the distribution of electrons injected into the insulating film 6b at the time of data writing and the distribution of holes injected into the insulating film 6b at the time of erasing data get close to each other. Thus, even in a case in which the write operation and the erase operation are repeated a large number of times, the number of holes remaining in the gate insulating film GIm having the insulating film 6b does not increase, and thus, deterioration of the retention characteristics of the memory cell can be prevented or suppressed, so that the characteristics of the semiconductor device can be improved.

Further, preferably, the side surface SS4 of the region FA2 is arranged on the positive side in the Y-axis direction with respect to the side surface SS2 of the region FA1.

Thus, in a case of writing data through use of the aforementioned SSI method, the electrons EL are likely to be injected into a part PS42 of the insulating film 6b between the memory gate electrode MG and the side surface SS4 of the region FA2 on the side of the semiconductor region MD serving as a drain region, as illustrated by the arrow ELA3 in FIG. 8. However, the electrons EL are hard to be injected into a part PS41 thereof on the side of the semiconductor region MS serving as a source region.

Also, in a case of erasing data through use of the aforementioned FN tunneling phenomenon, the holes HL are injected not only into a part PS43 of the insulating film 6b between a part of the memory gate electrode MG opposed to the side surface SS4 and the control gate electrode CG on the side of the region FA2, that is, on the positive side in the Y-axis direction, but also into the part PS42, as illustrated by the arrow HLA3 in FIG. 8.

In this case, electrons are injected into the part PS42 of the insulating film 6b at the time of data writing, and holes are injected into the part PS42 of the insulating film 6b at the time of erasing data. Thus, also in a part of the region FA2 on the side of the side surface SS4, the distribution of electrons injected into the insulating film 6b at the time of writing data and the distribution of holes injected into the insulating film 6b at the time of erasing data get close to each other. Thus, even in a case in which the write operation and the erase operation are repeated a large number of times, the number of holes remaining in the gate insulating film GIm having the insulating film 6b does not increase, and thus, deterioration of the retention characteristics of the memory cell can be prevented or suppressed, so that the characteristics of the semiconductor device can be improved.

That is, in the case in which the control gate electrode CG and the memory gate electrode MG straddle the fin FA, only setting the upper surface TS2 of the region FA2 to be lower than the upper surface TS1 of the region FA1 causes the following problem. That is, there is a problem in which, in a part of the region FA2 on a side of at least one side surface in the Y-axis direction, the distribution of electrons injected into the insulating film 6b at the time of writing data and the distribution of holes injected into the insulating film 6b at the time of erasing data differ from each other.

However, in the semiconductor device according to the present embodiment, the upper surface TS2 of the region FA2 becomes lower than the upper surface TS1 of the region FA1, and the side surface of the region FA2 recedes with respect to the side surface of the region FA1 on at least one of both sides of the region FA2 in the Y-axis direction. Thus, on the side of at least one side surface of the region FA2 in the Y-axis direction, the distribution of electrons injected into the insulating film 6b at the time of writing data and the distribution of holes injected into the insulating film 6b at the time of erasing data can be brought close to each other.

Note that, preferably, the upper surface TS2 of the region FA2 becomes lower than the upper surface TS1 of the region FA1, and the side surface of the region FA2 recedes with respect to the side surface of the region FA1 on both sides of the region FA2 in the Y-axis direction. Thus, on the sides of both the side surfaces of the region FA2 in the Y-axis direction, the distribution of electrons injected into the insulating film 6b at the time of writing data and the distribution of holes injected into the insulating film 6b at the time of erasing data can be brought close to each other.

As illustrated in FIGS. 7 and 8, a case in which the region FA21 is formed between the region FA1 and the region FA2 and the upper surface TS1 of the region FA1 and the upper surface TS2 of the region FA2 are connected by the connection surface TS21 is considered. In this case, preferably, the part PT21 is a part of the insulating film 6b between the memory gate electrode MG and the upper surface TS2 of the region FA2 formed along the upper surface TS2, and the part PT22 is a part inclined against the upper surface TS2.

In this case, the memory gate electrode MG includes an electrode portion MG21 opposed to the upper surface TS2 and an electrode portion MG22 formed on the side of the control gate electrode CG with respect to the electrode portion MG21. The electrode portion MG22 includes a connection surface BT22 serving as a lower surface connecting a lower surface BT21 of the electrode portion MG21 to a side surface BT23 of the electrode portion MG22 on the side of the control gate electrode CG. An end ET23 of the connection surface BT22 of the electrode portion MG22 is connected to the lower surface BT21 of the electrode portion MG21, and an end ET24 which is on an opposite side of the end ET23 of the connection surface BT22 of the electrode portion MG22 is connected to the side surface BT23 of the electrode portion MG22. The end ET23 is arranged on the positive side in the X-axis direction with respect to the end ET24 and is arranged on the lower side in the Z-axis direction than the end ET24.

In this case, in a case of erasing data by injecting holes into the insulating film 6b through use of the aforementioned FN-type tunneling phenomenon, the electric field between the memory gate electrode MG and the fin FA focuses on the end ET23 as well as the end ET24. Thus, the holes HL are injected not only into the part PT23 but also into the part PT22 as illustrated by the arrow HLA1 in FIG. 7.

Also, in a case in which the side surface SS1 of the region FA1 and the side surface SS3 of the region FA2 are connected by the connection surface SS31, preferably, the part PS31 is a part of the insulating film 6b between the memory gate electrode MG and the side surface SS3 of the region FA2 formed along the side surface SS3, and the part PS32 is a part inclined against the side surface SS3.

In this case, the memory gate electrode MG includes an electrode portion MG31 opposed to the side surface SS3 and an electrode portion MG32 formed on the side of the control gate electrode CG with respect to the electrode portion MG31. The electrode portion MG32 includes a connection surface BS32 connecting a side surface BS31 of the electrode portion MG31 to a side surface BS33 of the electrode portion MG32 on the side of the control gate electrode CG. An end ES33 of the connection surface BS32 of the electrode portion MG32 is connected to the side surface BS31 of the electrode portion MG31, and an end ES34 which is on an opposite side of the end ES33 of the connection surface BS32 of the electrode portion MG32 is connected to the side surface BS33 of the electrode portion MG32. The end ES33 is arranged on the positive side in the X-axis direction with respect to the end ES34 and is arranged on the negative side in the Y-axis direction with respect to the end ES34 in the Y-axis direction.

In this case, in a case of erasing data by injecting holes into the insulating film 6b through use of the aforementioned FN-type tunneling phenomenon, the electric field between the memory gate electrode MG and the fin FA focuses on the end ES33 as well as the end ES34. Thus, the holes HL are injected not only into the part PS33 but also into the part PS32, as illustrated by the arrow HLA2 in FIG. 8.

Further, in a case in which the side surface SS2 of the region FA1 and the side surface SS4 of the region FA2 are connected by the connection surface SS41, preferably, the part PS41 is a part of the insulating film 6b between the memory gate electrode MG and the side surface SS4 of the region FA2 formed along the side surface SS4, and the part PS42 is a part inclined against the side surface SS4.

In this case, the memory gate electrode MG includes an electrode portion MG41 opposed to the side surface SS4 and an electrode portion MG42 formed on the side of the control gate electrode CG with respect to the electrode portion MG41. The electrode portion MG42 includes a connection surface BS42 connecting a side surface BS41 of the electrode portion MG41 to a side surface BS43 of the electrode portion MG42 on the side of the control gate electrode CG. An end ES43 of the connection surface BS42 of the electrode portion MG42 is connected to the side surface BS41 of the electrode portion MG41, and an end ES44 which is on an opposite side of the end ES43 of the connection surface BS42 of the electrode portion MG42 is connected to the side surface BS43 of the electrode portion MG42. The end ES43 is arranged on the positive side in the X-axis direction with respect to the end ES44 and is arranged on the positive side in the Y-axis direction with respect to the end ES44 in the Y-axis direction.

In this case, in a case of erasing data by injecting holes into the insulating film 6b through use of the aforementioned FN-type tunneling phenomenon, the electric field between the memory gate electrode MG and the fin FA focuses on the end ES43 as well as the end ES44. Thus, the holes HL are injected not only into the part PS43 but also into the part PS42, as illustrated by the arrow HLA3 in FIG. 8.

Note that there is a case in which no corner portion is formed between a part of the connection surface BT22 on a side of the lower surface BT21 and a part of the lower surface BT21 on a side of the connection surface BT22 and the part of the connection surface BT22 on the side of the lower surface BT21 and the part of the lower surface BT21 on the side of the connection surface BT22 form the same curved surface. Also, there is a case in which no corner portion is formed between a part of the connection surface BS32 on a side of the side surface BS31 and a part of the side surface BS31 on a side of the connection surface BS32 and the part of the connection surface BS32 on the side of the side surface BS31 and the part of the side surface BS31 on the side of the connection surface BS32 form the same curved surface. Also, there is a case in which no corner portion is formed between a part of the connection surface BS42 on a side of the side surface BS41 and a part of the side surface BS41 on a side of the connection surface BS42 and the part of the connection surface BS42 on the side of the side surface BS41 and the part of the side surface BS41 on the side of the connection surface BS42 form the same curved surface. Illustration thereof is omitted in FIGS. 7 and 8.

<About Definition of Receding Width in Case in which Side Surface of Fin is Inclined>

Figure 51:
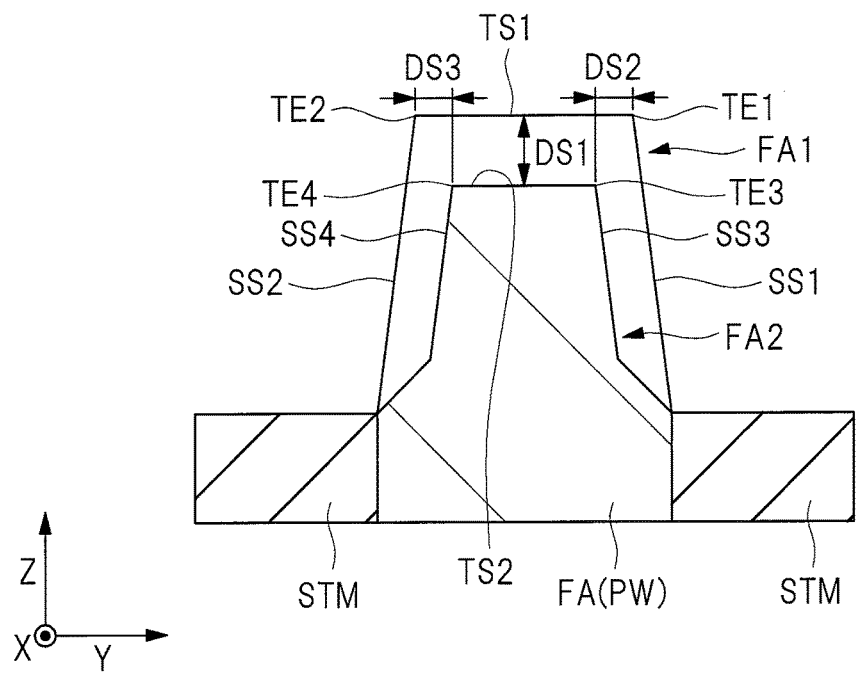
FIG. 51 is a cross-sectional view of a main part of the semiconductor device according to the embodiment.
Figure 52:
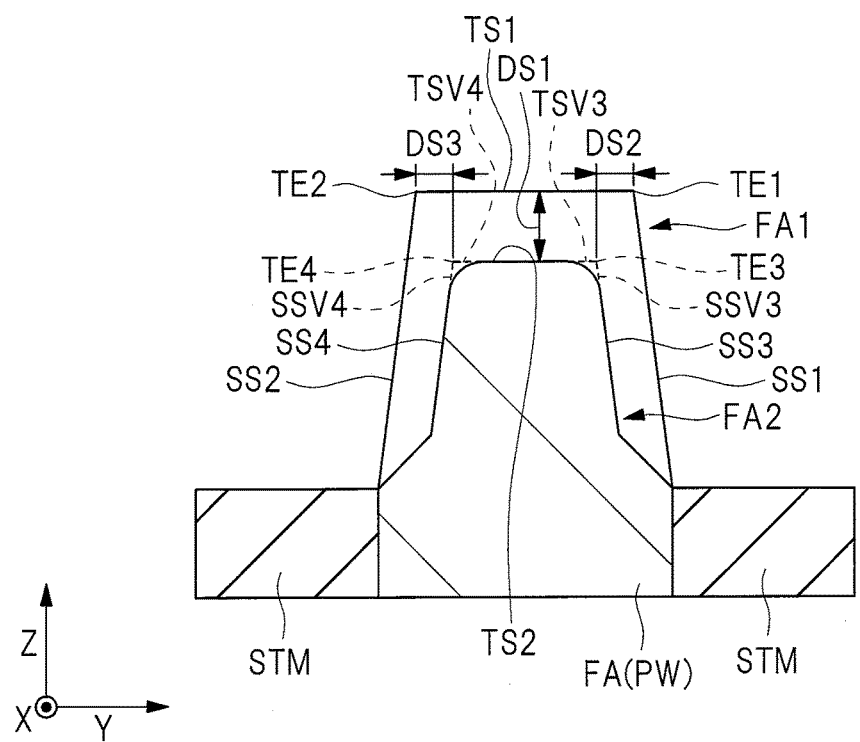
FIG. 52 is a cross-sectional view of a main part of the semiconductor device according to the embodiment.

Next, definition of the receding width in a case in which the side surface of the fin is inclined will be described with reference to FIG. 51. FIGS. 51 and 52 are cross-sectional views of main parts of the semiconductor device according to the embodiment. FIGS. 51 and 52 are enlarged views of a region RG4 surrounded by the two-dot chain line of the cross-sectional view illustrated in FIG. 5. Note that, in FIGS. 51 and 52, illustration of an upper part of the element isolation film STM and an upper part of the region FA2 is omitted for simplification of the drawing.

As illustrated in FIG. 51, in a case in which the side surface SS3 is inclined against a plane perpendicular to the Y-axis direction, or an XZ plane, in such a way that a higher part of the side surface SS3 may be arranged on the more negative side in the Y-axis direction, a position of an upper end TE3 of the side surface SS3 in the Y-axis direction can be defined as a position of the side surface SS3 in the Y-axis direction. Similarly, in a case in which the side surface SS1 is inclined against the XZ plane in such a way that a higher part of the side surface SS1 may be arranged on the more negative side in the Y-axis direction, a position of an upper end TE1 of the side surface SS1 in the Y-axis direction can be defined as a position of the side surface SS1 in the Y-axis direction. In this case, the distance DS2 which is a receding width of the side surface SS3 with respect to the side surface SS1 is a distance between the upper end TE1 and the upper end TE3 in the Y-axis direction. Meanwhile, a distance between the upper surface TS1 and the upper surface TS2 in the Z-axis direction is the distance DS1.

Also, as illustrated in FIG. 51, in a case in which the side surface SS4 is inclined against the XZ plane in such a way that a higher part of the side surface SS4 may be arranged on the more positive side in the Y-axis direction, a position of an upper end TE4 of the side surface SS4 in the Y-axis direction can be defined as a position of the side surface SS4 in the Y-axis direction. Similarly, in a case in which the side surface SS2 is inclined against the XZ plane in such a way that a higher part of the side surface SS2 may be arranged on the more positive side in the Y-axis direction, a position of an upper end TE2 of the side surface SS2 in the Y-axis direction can be defined as a position of the side surface SS2 in the Y-axis direction. In this case, the distance DS3 which is a receding width of the side surface SS4 with respect to the side surface SS2 is a distance between the upper end TE2 and the upper end TE4 in the Y-axis direction.

Meanwhile, as illustrated in FIG. 52, there is a case in which no corner portion is formed between an upper portion of the side surface SS3 and a part of the upper surface TS2 on a side of the side surface SS3 and the upper portion of the side surface SS3 and the part of the upper surface TS2 on the side of the side surface SS3 form the same curved surface. In this case, a virtual plane formed by extending a center portion of the side surface SS3 in the height direction (Z-axis direction) upward as the same plane can be defined as a plane SSV3, and a virtual plane formed by extending a center portion of the upper surface TS2 in the Y-axis direction on the side of the side surface SS3 as the same plane can be defined as a plane TSV3. Then, a corner portion formed by the plane SSV3 and the plane TSV3 can be defined as the upper end TE3 of the side surface SS3. Also in this case, the distance DS2 which is a receding width of the side surface SS3 with respect to the side surface SS1 is a distance between the upper end TE1 and the upper end TE3 in the Y-axis direction.

Also, as illustrated in FIG. 52, there is a case in which no corner portion is formed between an upper portion of the side surface SS4 and a part of the upper surface TS2 on a side of the side surface SS4 and the upper portion of the side surface SS4 and the part of the upper surface TS2 on the side of the side surface SS4 form the same curved surface. In this case, a virtual plane formed by extending a center portion of the side surface SS4 in the height direction (Z-axis direction) upward as the same plane can be defined as a plane SSV4, and a virtual plane formed by extending a center portion of the upper surface TS2 in the Y-axis direction on the side of the side surface SS4 as the same plane can be defined as a plane TSV4. Then, a corner portion formed by the plane SSV4 and the plane TSV4 can be defined as the upper end TE4 of the side surface SS4. Also in this case, the distance DS3 which is a receding width of the side surface SS4 with respect to the side surface SS2 is a distance between the upper end TE2 and the upper end TE4 in the Y-axis direction.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device comprising the steps of:
   (a) preparing a semiconductor substrate;
   (b) forming a projecting portion serving as a part of the semiconductor substrate, projected from a main surface of the semiconductor substrate, and extending in a first direction when seen in a plan view;
   (c) forming, over the projecting portion, a first gate electrode extending in a second direction intersecting with the first direction when seen in a plan view and forming a first gate insulating film between the first gate electrode and the projecting portion;
   (d) forming, on the projecting portion and on a front surface of the first gate electrode, an insulating film including a charge storage unit inside;
   (e) forming a conductive film on the insulating film;
   (f) etching back the conductive film to leave the conductive film on a first side of the first gate electrode in the first direction via the insulating film, thereby forming a second gate electrode, and forming a second gate insulating film including the insulating film between the second gate electrode and the projecting portion and between the second gate electrode and the first gate electrode when seen in a plan view,
   wherein, in the step (b), the projecting portion including a first region and a second region arranged on the first side with respect to the first region when seen in a plan view is formed,
   wherein, in the step (c), the first gate electrode covering a first upper surface of the first region, a first side surface of the first region on a second side in the second direction, and a second side surface of the first region on an opposite side of the second side in the second direction is formed,
   wherein the step (d) includes the steps of:
   (d1) etching the second region after the step (c), thereby making a second upper surface of the second region lower than the first upper surface, and making a third side surface of the second region on the second side recede to the opposite side of the second side with respect to the first side surface in the second direction; and
   (d2) forming the insulating film, after the step (d1), on the second upper surface, the third side surface, a fourth side surface on the opposite side of the second side of the second region in the second direction, and the front surface of the first gate electrode, and
   wherein, in the step (f), the second gate electrode covering the second upper surface, the third side surface, and the fourth side surface is formed.

2. The manufacturing method of the semiconductor device according to claim 1,
   wherein, in the step (d1), the second upper surface becomes lower than the first upper surface, and the third side surface recedes with respect to the first side surface in such a way that a distance between the second upper surface and the first upper surface in a third direction perpendicular to the main surface may be longer than a distance between the third side surface and the first side surface in the second direction.

3. The manufacturing method of the semiconductor device according to claim 1,
   wherein, in the step (d1), by etching the second region, the fourth side surface recedes to the second side with respect to the second side surface in the second direction.

4. The manufacturing method of the semiconductor device according to claim 3,
   wherein, in the step (d1), the second upper surface becomes lower than the first upper surface, the third side surface recedes with respect to the first side surface, and the fourth side surface recedes with respect to the second side surface in such a way that a distance between the second upper surface and the first upper surface in a fourth direction perpendicular to the main surface may be longer than any of a distance between the third side surface and the first side surface in the second direction and a distance between the fourth side surface and the second side surface in the second direction.

5. The manufacturing method of the semiconductor device according to claim 1,
   wherein, in the step (b), the projecting portion including a third region arranged on an opposite side of the first side with respect to the first region when seen in a plan view is formed,
   wherein the step (d) includes the step of:
   (d3) oxidizing a front surface of the third region after the step (d1) and before the step (d2), thereby making a third upper surface of the third region lower than the first upper surface of the first region and making a fifth side surface of the third region on the second side recede to the opposite side of the second side with respect to the first side surface in the second direction, and wherein, in the step (d3), the third upper surface becomes lower than the first upper surface in such a way that the third upper surface may be higher than the second upper surface, and the fifth side surface recedes in such a way that the fifth side surface may be arranged on the second side with respect to the third side surface in the second direction.

6. The manufacturing method of the semiconductor device according to claim 5, wherein, in the step (d1), by etching the second region, the fourth side surface recedes to the second side with respect to the second side surface in the second direction, wherein, in the step (d3), by oxidizing the front surface of the third region, a sixth side surface of the third region on the opposite side of the second side recedes to the second side with respect to the second side surface in the second direction, and wherein, in the step (d3), the sixth side surface recedes in such a way that the sixth side surface may be arranged on the opposite side of the second side with respect to the fourth side surface in the second direction.

7. The manufacturing method of the semiconductor device according to claim 1, wherein the first gate insulating film, the first gate electrode, the second gate insulating film, and the second gate electrode form a non-volatile memory.

\* \* \* \* \*